(12) United States Patent
Moon

(10) Patent No.: US 12,402,443 B2
(45) Date of Patent: Aug. 26, 2025

(54) LIGHT-EMITTING ELEMENT, METHOD FOR MANUFACTURING SAME, AND DISPLAY DEVICE

(71) Applicant: Samsung Display Co., LTD., Yongin-si (KR)

(72) Inventor: Su Mi Moon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 697 days.

(21) Appl. No.: 17/575,453

(22) PCT Filed: Feb. 27, 2020

(86) PCT No.: PCT/KR2020/002801
§ 371 (c)(1),
(2) Date: Jan. 13, 2022

(87) PCT Pub. No.: WO2021/010563
PCT Pub. Date: Jan. 21, 2021

(65) Prior Publication Data
US 2023/0282777 A1    Sep. 7, 2023

(30) Foreign Application Priority Data

Jul. 17, 2019 (KR) .......................... 10-2019-0086383

(51) Int. Cl.
*H10H 20/83* (2025.01)
*H10H 20/82* (2025.01)
(Continued)

(52) U.S. Cl.
CPC ........ *H10H 20/8312* (2025.01); *H10H 20/82* (2025.01); *H10H 20/857* (2025.01)

(58) Field of Classification Search
CPC ....... H01L 33/382; H01L 33/22; H01L 33/62; H01L 33/0095; H01L 25/0753;
(Continued)

(56) References Cited

U.S. PATENT DOCUMENTS 8,115,224 B2   2/2012 Kim
10,672,946 B2  6/2020 Cho et al.
(Continued)

FOREIGN PATENT DOCUMENTS

CN    101783382 A    7/2010
CN    204243076 U    4/2015
(Continued)

OTHER PUBLICATIONS

Chinese Office Action for CN Application No. 202080050853.X, dated Aug. 23, 2024, 13 pages.
(Continued)

*Primary Examiner* — S M Sohel Imtiaz
(74) *Attorney, Agent, or Firm* — Womble Bond Dickinson (US) LLP

(57) ABSTRACT

A light-emitting element, a method for manufacturing same, and a display device are provided. The light-emitting element comprises: a first semiconductor layer and a second semiconductor layer; an active layer between the first semiconductor layer and the second semiconductor layer; and an electrode layer on the second semiconductor layer and having a first surface and a second surface facing the first surface, the second surface contacting the second semiconductor layer. The electrode layer includes a first protruding pattern in which at least a partial area of the first surface protrudes.

18 Claims, 36 Drawing Sheets

(51) Int. Cl.
  *H10H 20/831* (2025.01)
  *H10H 20/857* (2025.01)

(58) Field of Classification Search
  CPC ......... H01L 33/20; H01L 33/38; H01L 21/28;
        H01L 25/167; H10H 20/8312; H10H
        20/82; H10H 20/857; H10H 20/831;
        H10H 20/819; H10H 20/01; H10H
        20/032; H10H 29/142; H10D 8/043
  See application file for complete search history.

(56) References Cited

U.S. PATENT DOCUMENTS

| | | | |
|---|---|---|---|
| 11,114,582 B2 | 9/2021 | Cho et al. | |
| 12,040,425 B2 | 7/2024 | Cho et al. | |
| 2010/0181586 A1* | 7/2010 | Kim | H10H 20/841 |
| | | | 257/E33.064 |
| 2011/0124139 A1* | 5/2011 | Chang | H10H 20/018 |
| | | | 438/40 |
| 2013/0119423 A1* | 5/2013 | Lee | H10H 20/855 |
| | | | 257/98 |
| 2015/0069444 A1* | 3/2015 | Chae | H10H 20/84 |
| | | | 257/98 |
| 2015/0076535 A1 | 3/2015 | Choung | |
| 2018/0023793 A1* | 1/2018 | Lowenthal | H10H 20/855 |
| | | | 362/296.09 |
| 2022/0149241 A1* | 5/2022 | Lee | H10H 20/8312 |

FOREIGN PATENT DOCUMENTS

| | | | |
|---|---|---|---|
| CN | 107611153 A | | 1/2018 |
| KR | 10-2010-0085578 A | | 7/2010 |
| KR | 10-2011-0115384 A | | 10/2011 |
| KR | 20110115384 A | * | 10/2011 |
| KR | 10-2013-0052825 A | | 5/2013 |
| KR | 10-2015-0035211 A | | 4/2015 |
| KR | 20150035211 A | * | 4/2015 |
| KR | 10-2016-0039172 A | | 4/2016 |
| KR | 10-2016-0059574 A | | 5/2016 |
| KR | 10-1742518 B1 | | 6/2017 |
| TW | 1323520 B | * | 4/2010 |
| WO | WO 2012/148231 A2 | | 11/2012 |
| WO | WO 2018/117073 A1 | | 6/2018 |

OTHER PUBLICATIONS

Extended European Search Report issued in corresponding Application No. EP 20841155.3, dated Jul. 14, 2023, 14 pages.
International Search Report for corresponding Application No. PCT/KR2020/002801 dated Jun. 17, 2020, 4pp.

* cited by examiner

1800_2 : 1810_2, 1820_2, 1830_2

LIGHT-EMITTING ELEMENT, METHOD FOR MANUFACTURING SAME, AND DISPLAY DEVICE

CROSS-REFERENCE TO RELATED APPLICATION

This application is a U.S. National Phase Patent Application of International Patent Application Number PCT/KR2020/002801, filed on Feb. 27, 2020, which claims priority to Korean Patent Application Number 10-2019-0086383, filed on Jul. 17, 2019, the entire content of all of which is incorporated herein by reference.

BACKGROUND

1. Field

Aspects of embodiments of the present disclosure relate to a light-emitting element, a method for manufacturing the same, and a display device.

2. Description of the Related Art

Display devices are increasingly important with the development of multimedia. Accordingly, various types of display devices such as organic light-emitting diode (OLED) display devices and liquid crystal display (LCD) devices are being used.

A display panel, such as an OLED panel or an LCD panel, is a device included in a display device to (e.g., that is configured to) display an image. From among such display panels, a light-emitting diode (LED) may be provided as a light-emitting display element, and examples of a light-emitting diode (LED) include an organic LED (OLED) using an organic material as a fluorescent material and an inorganic LED using an inorganic material as a fluorescent material.

An inorganic LED using an inorganic semiconductor as a fluorescent material has durability even in a high-temperature environment and more efficiently emits blue light compared to the organic LED. A transfer method using a dielectrophoresis (DEP) method has been developed as part of a manufacturing process for existing inorganic LED elements, but this process may be limiting. Accordingly, research is being continuously conducted on the inorganic light-emitting diode having higher durability and efficiency than those of the organic light-emitting diode.

SUMMARY

Aspects of embodiments of the present disclosure provide a light-emitting element in which both end surfaces (e.g., opposite end surfaces) have a different roughness and a pattern is formed on an end surface and a method for manufacturing the light-emitting element.

Aspects of embodiments of the present disclosure provide a display device which includes a plurality of light-emitting elements, each having a different pattern formed on an end surface.

It should be noted that aspects and features of the present disclosure are not limited thereto and other aspects and features not mentioned herein will be apparent to those of ordinary skill in the art from the following description.

According to an embodiment of the present disclosure, a light-emitting element includes: a first semiconductor layer and a second semiconductor layer; an active layer between the first semiconductor layer and the second semiconductor layer; and an electrode layer on the second semiconductor layer and having a first surface and a second surface facing the first surface, the second surface contacting the second semiconductor layer. At least any one of the first surface and the second surface of the electrode layer includes a protrusion pattern protruding from at least a portion thereof.

The protrusion pattern may include: a first protrusion, a second protrusion spaced apart from the first protrusion, and a depression between the first protrusion and the second protrusion.

The second protrusion may extend around a periphery of the first protrusion.

The protrusion pattern may further include a third protrusion spaced apart from the first protrusion and the second protrusion.

The third protrusion may extend around a periphery of an outer surface of the second protrusion, and the depression may be between the second protrusion and the third protrusion.

The first protrusion may have an area having the same width as that of the second protrusion.

The first protrusion may have an area having a width equal to a distance between the first protrusion and the second protrusion.

The protrusion pattern may include a first protrusion pattern formed on the first surface, and the light-emitting element may extend in a direction and has a first end surface on which the first protrusion pattern is formed and a second end surface which is a surface of the first semiconductor layer.

The first end surface and the second end surface may have different roughness.

The light-emitting element may further include an insulating film which at least partially surrounds side surfaces of the first semiconductor layer, the second semiconductor layer, and the active layer.

The electrode layer may include a second protrusion pattern which is formed on the second surface to contact the second semiconductor layer, and at least a portion of a surface of the second semiconductor layer that contacts the second surface of the electrode layer may be depressed to contact protrusions of the second protrusion pattern.

The protrusion pattern may also be formed on the first surface.

According to an embodiment of the present disclosure, a method for manufacturing light-emitting elements includes: providing a semiconductor structure on a substrate; and forming a plurality of element rods, each of the element rods including a protrusion pattern protruding from at least a portion of an upper surface, by etching the semiconductor structure. Different protrusion patterns are formed in different areas of the semiconductor structure.

The forming of the element rods may include: forming a first pattern layer including first mask patterns spaced apart from each other on the semiconductor structure; forming semiconductor crystals by etching the semiconductor structure along an area between the first mask patterns spaced apart from each other; forming a second pattern layer including second mask patterns spaced apart from each other on the semiconductor crystals; and forming element rods including protrusion patterns by partially etching upper surfaces of the semiconductor crystals along an area in which the second mask patterns are spaced apart from each other.

The forming of the second pattern layer may be performed after an insulating film surrounding an outer circumferential surface of each of the semiconductor crystals is formed.

The semiconductor structure may have a first area and a second area different from the first area, and the element rods may include a first element rod formed in the first area and a second element rod formed in the second area.

In the first pattern layer, the first mask pattern in the first area and the first mask pattern in the second area may have the same shape.

The first element rod and the second element rod may have the same diameter.

In the second pattern layer, the second mask pattern in the first area and the second mask pattern in the second area may have different shapes.

A first protrusion pattern formed on an upper surface of the first element rod may have a shape different from that of a second protrusion pattern formed on an upper surface of the second element rod.

The forming of the element rods may include: forming a third mask layer including third mask patterns spaced apart from each other on the semiconductor structure; forming protrusion patterns by partially etching an upper surface of the semiconductor structure along an area in which the third mask patterns are spaced apart from each other; forming a fourth mask layer including fourth mask patterns spaced apart from each other on the semiconductor structure; and forming element rods by etching the semiconductor structure along an area between the fourth mask patterns spaced apart from each other.

The first area and the second area may have different light emission amounts.

According to an embodiment of the present disclosure, a display device includes: a first electrode and a second electrode spaced apart from the first electrode; and a light-emitting element between the first electrode and the second electrode and comprising a pattern part formed on an end surface. The light-emitting element includes: a first semiconductor layer and a second semiconductor layer; an active layer between the first semiconductor layer and the second semiconductor layer; and an electrode layer on the second semiconductor layer and including a protrusion pattern protruding from at least a portion of a surface.

The protrusion pattern may include a first protrusion, a second protrusion spaced apart from the first protrusion, and a depression between the first protrusion and the second protrusion.

The second protrusion may extend around a periphery of the first protrusion.

The light-emitting element may include a first light-emitting element including a first protrusion pattern and a second light-emitting element including a second protrusion pattern different from the first protrusion pattern.

The first protrusion pattern may have a different number of protrusions than the second protrusion pattern.

A width of each protrusion in the first protrusion pattern may be different from a width of each protrusion in the second protrusion pattern.

A first end of the light-emitting element may be electrically connected to the first electrode, and a second end may be electrically connected to the second electrode.

The electrode layer of the light-emitting element may be electrically connected to the first electrode, and the first semiconductor layer may be electrically connected to the second electrode.

The display device may further include: a first contact electrode contacting the first end of the light-emitting element and the first electrode; and a second contact electrode contacting the second end of the light-emitting element and the second electrode.

The first contact electrode may contact the electrode layer of the light-emitting element, and the second contact electrode may contact the first semiconductor layer.

Details of other embodiments of the present disclosure are included in the detailed description and the accompanying drawings.

In a method for manufacturing light-emitting elements according to an embodiment, light-emitting elements having protrusion patterns may be manufactured through a plurality of (e.g., two) etching processes for etching a semiconductor structure. The light-emitting elements may include (or have) different protrusion patterns, and positions at where the light-emitting elements are formed in the semiconductor structure may be identified through (e.g., by using) the protrusion patterns. Accordingly, when there is a difference between light-emitting characteristics of the manufactured light-emitting elements, the positions at where the light-emitting elements are formed in the semiconductor structure can be identified through the protrusion patterns, and light-emitting characteristics at the positions can be modified and/or controlled.

A display device according to an embodiment may include light-emitting elements having different protrusion patterns to reduce a difference in light-emitting characteristics to have uniform (or substantially uniform) light-emitting characteristics in each pixel.

The above-described aspects and features do not limit those of the present disclosure, and other various aspects and feature are included in this disclosure or will be apparent to those of ordinary skill in the art from the following description.

DETAILED DESCRIPTION

Figure 1:
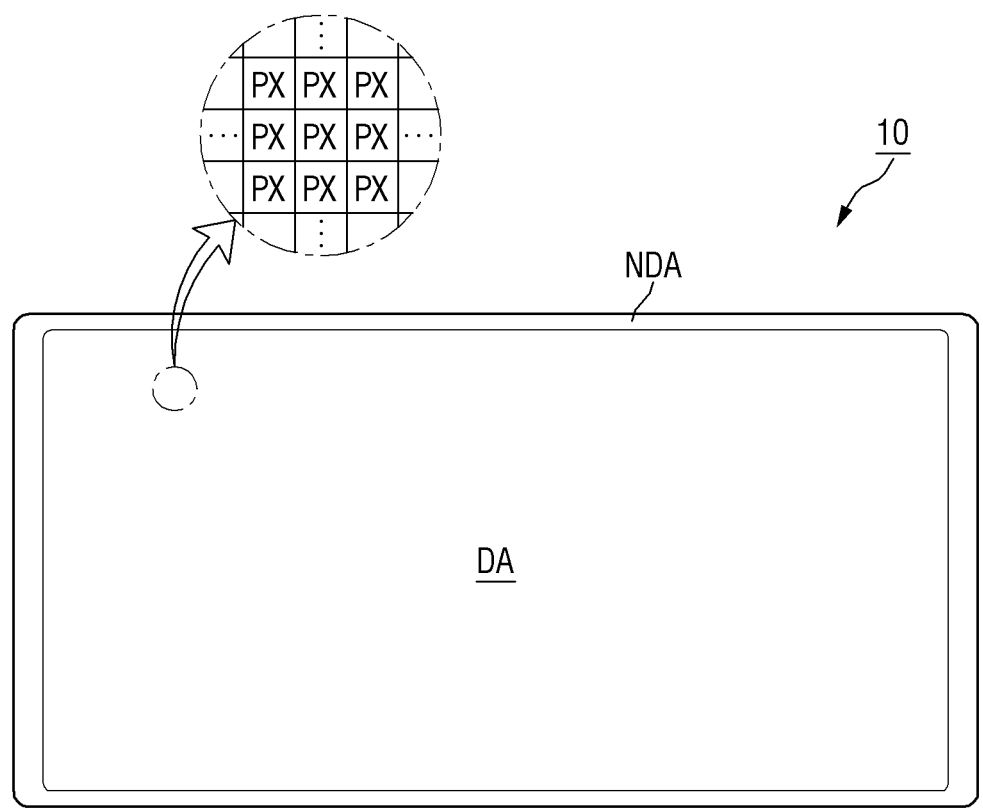
FIG. 1 is a schematic plan view of a display device according to an embodiment.

Aspects and features of the present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when a layer is referred to as being "on" another layer (or substrate), it may be directly on the other layer or substrate or one or more intervening layers may be present. Similarly, it will also be understood that when an element is referred to as being "on," "connected to," or "coupled to" another element, it may be directly on, connected, or coupled to the other element or one or more intervening elements may be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the accompanying drawings.

FIG. 1 is a schematic plan view of a display device according to an embodiment.

Referring to FIG. 1, a display device 10 displays (e.g., is configured to display) moving images or still images. The display device 10 may refer to any electronic device that provides a display screen. Examples of the display device 10 may include televisions, notebook computers, monitors, billboards, an Internet of things (IoT) device, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and other devices that provide (or include) a display screen.

The display device 10 includes a display panel that provides a display screen. Examples of the display panel may include a light emitting diode display panel, an organic light emitting diode display panel, a quantum dot light emitting display panel, a plasma display panel, and a field emission display panel. An embodiment in which a light emitting diode display panel is applied as the display panel will be described below, but the present disclosure is not limited to this embodiment. Other display panels may be applied as the display panel as long as the same technical spirit is applicable.

The shape of the display device 10 can be variously modified. For example, the display device 10 may have various shapes, such as a horizontally long rectangle (e.g., a horizontally extended rectangle), a vertically long rectangle (e.g., a vertically extended rectangle), a square, a quadrangle with rounded corners (or vertices), other polygons, and a circle. The shape of a display area DA of the display device 10 may also be similar to the overall shape of the display device 10. In FIG. 1, the display device 10 and the display area DA are illustrated as having a horizontally long rectangular shape.

The display device 10 may have the display area DA and a non-display area NDA. The display area DA may be an area where a screen is present (e.g., where an image can be displayed), and the non-display area NDA may be an area where no image is displayed. The display area DA may also be referred to as an active area, and the non-display area NDA may also be referred to as an inactive area.

The display area DA may generally occupy the center of the display device 10. The display area DA may include a plurality of pixels PX. The pixels PX may be arranged in a matrix pattern. Each of the pixels PX may have a rectangular or square shape in a plan view. However, the present disclosure is not limited thereto, and each of the pixels PX may also have a rhombus shape in which each side is inclined with respect to a direction. Each of the pixels PX may display (or emit) a specific color by including one or more light-emitting elements 300 which emit light of (or in) a specific wavelength band.

Figure 2:
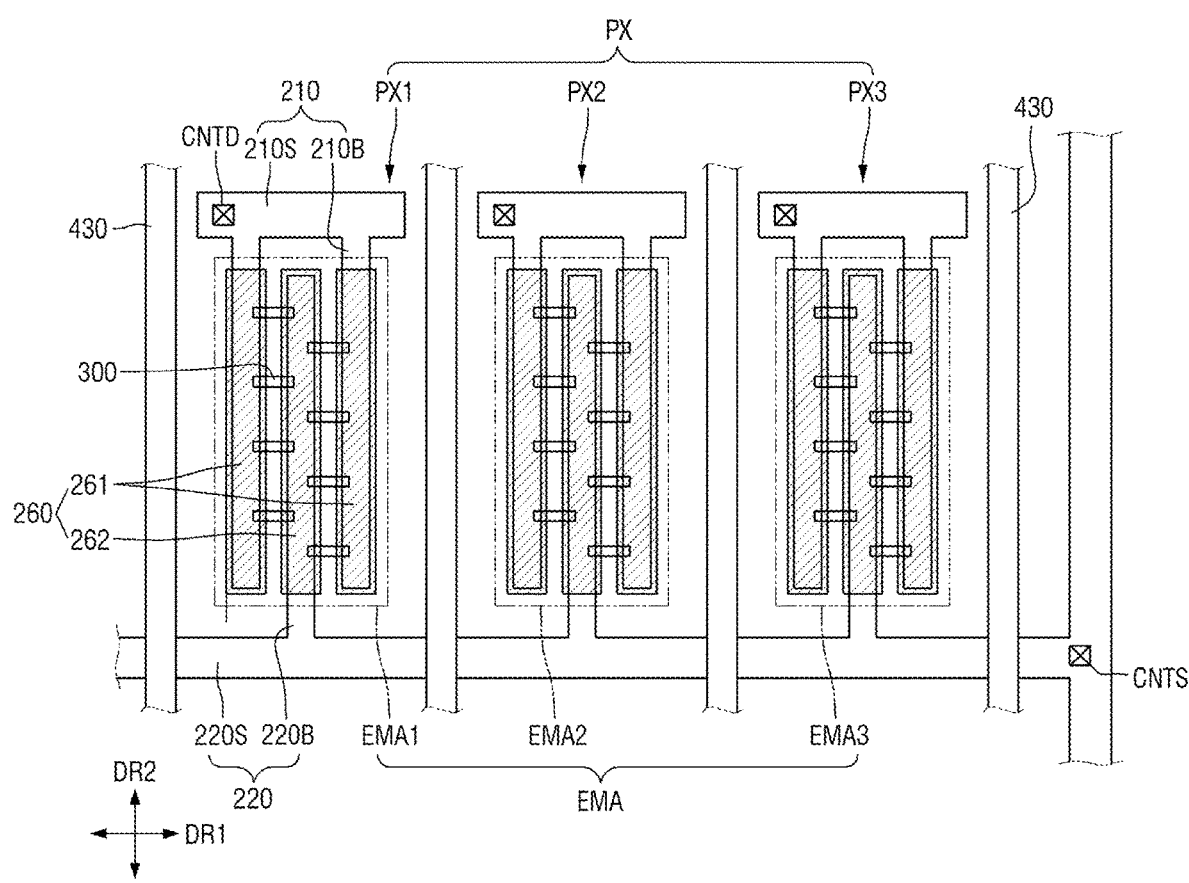
FIG. 2 is a schematic plan view of a pixel of the display device shown in FIG. 1.
Figure 3:
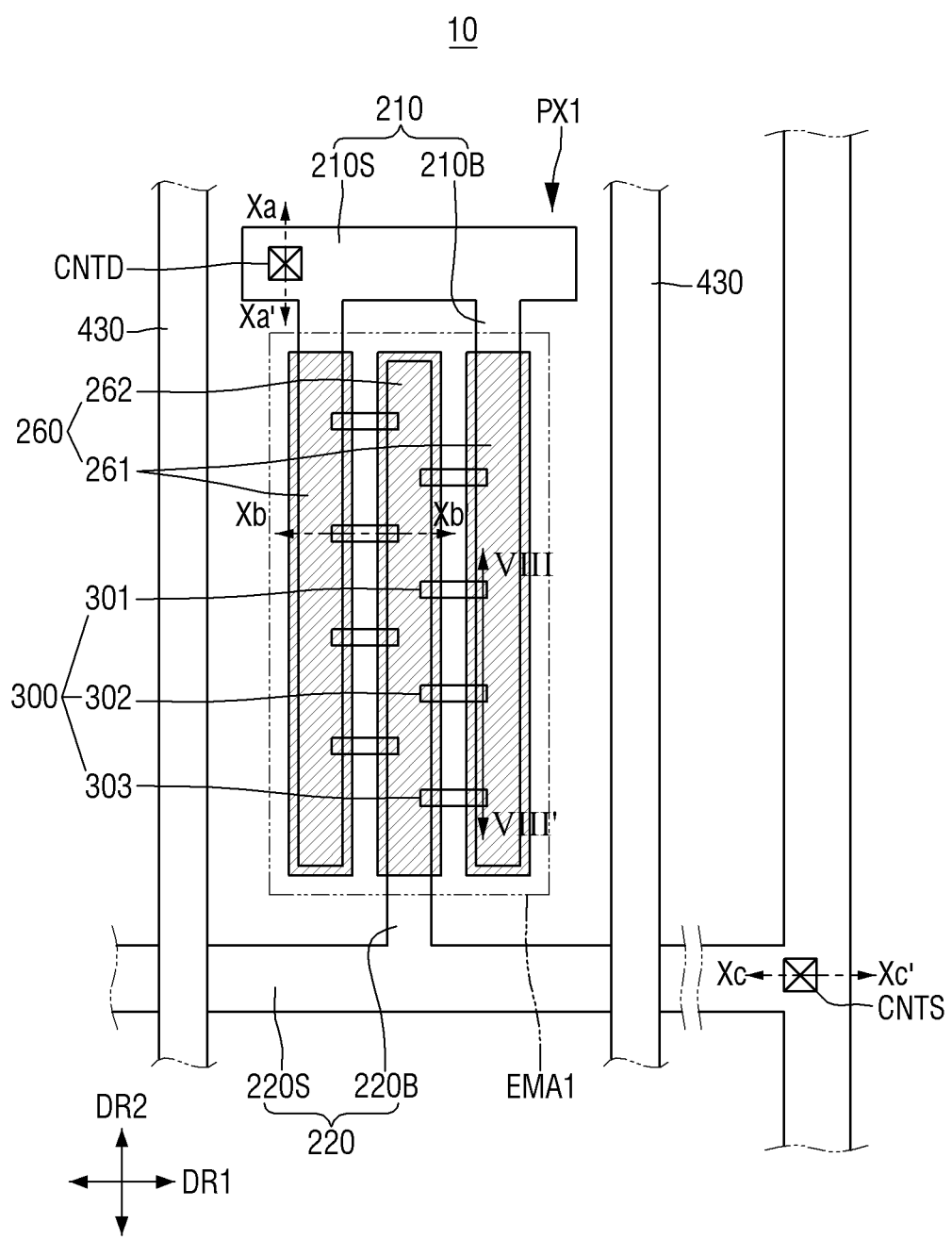
FIG. 3 is a plan view of a subpixel shown in FIG. 2.

FIG. 2 is a schematic plan view of a pixel of the display device according to the embodiment shown in FIG. 1, and FIG. 3 is a plan view of a subpixel shown in FIG. 2.

Referring to FIGS. 2 and 3, each of the pixels PX may include a first subpixel PX1, a second subpixel PX2, and a third subpixel PX3. The first subpixel PX1 may emit light of (or having) a first color, the second subpixel PX2 may emit light of a second color, and the third subpixel PX3 may emit light of a third color. The first color may be blue, the second color may be green, and the third color may be red. However, the present disclosure is not limited thereto, and in other embodiments the subpixels PXn (e.g., all of the subpixels PXn) may emit light of the same color. Although a pixel PX is illustrated in FIG. 2 as including three subpixels PXn (i.e., first through third subpixels PX1, PX2, PX3), the present disclosure is not limited thereto, and the pixel PX may include more subpixels PXn.

Each subpixel PXn of the display device 10 may have an area defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as an area where light-emitting elements 300 are disposed to emit light of a specific wavelength band. Each of the light-emitting elements 300 may include an active layer 330 (see, e.g., FIG. 4), and the active layer 330 may emit light of a specific wavelength band without directionality. For example, light emitted from the active layer 330 of each light-emitting element 300 may be radiated in a lateral direction of the light-emitting element 300 as well as toward both ends (e.g., opposite ends) of the light-emitting element 300. The emission area EMA of each subpixel PXn may include an area in which the light-emitting elements 300 are disposed and an area which is adjacent to the light-emitting elements 300 and from which light emitted from the light-emitting elements 300 is output. In addition, the present disclosure is not limited thereto, and the emission area EMA may also include an area from which light emitted from the light-emitting elements 300 is output after being reflected or refracted by other elements (e.g., other members). A plurality of light-emitting elements 300 may be disposed in each subpixel PXn, and an area where the light-emitting elements 300 are disposed and an area adjacent to this area may form the emission area EMA.

Each subpixel PXn of the display device 10 may have a non-emission area defined as an area other than the emission area EMA. The non-emission area may be an area in which the light-emitting elements 300 are not disposed and from which no light is output because light emitted from the light-emitting elements 300 does not reach this area.

Figure 4:
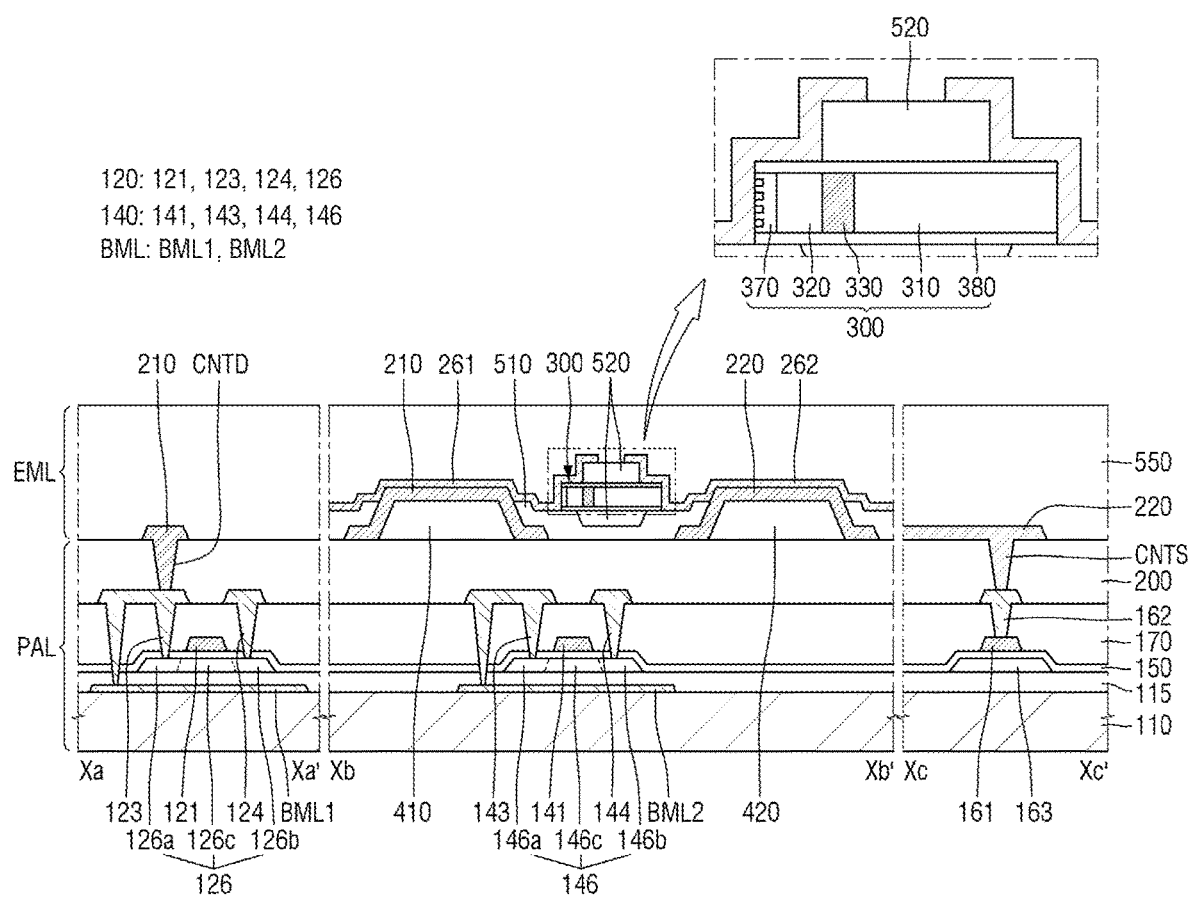
FIG. 4 is a cross-sectional view taken along the lines Xa-Xa', Xb-Xb' and Xc-Xc' of FIG. 3.

Each subpixel PXn of the display device 10 may include a plurality of electrodes 210 and 220, the light-emitting elements 300, a plurality of contact electrodes 260, a plurality of inner banks 410 and 420 (see, e.g., FIG. 4), an outer bank 430, and one or more insulating layers 510, 520, and 550 (see, e.g., FIG. 4).

The electrodes 210 and 220 may be electrically connected to the light-emitting elements 300 and may receive a voltage (e.g., a predetermined voltage) so that the light-emitting elements 300 emit light (e.g., emit light of a specific wavelength band). In addition, at least a part (or portion) of each of the electrodes 210 and 220 may be utilized to form an electric field in a subpixel PXn to align the light-emitting elements 300.

The electrodes 210 and 220 may include a first electrode 210 and a second electrode 220. In an embodiment, the first electrode 210 may be a separate pixel electrode for each subpixel PXn, and the second electrode 220 may be a common electrode commonly connected along each subpixel PXn. Any one of the first electrode 210 and the second electrode 220 may be an anode of the light-emitting elements 300, and the other may be a cathode of the light-emitting elements 300. However, the present disclosure is not limited thereto, and the opposite may also be true.

Each of the first electrode 210 and the second electrode 220 may have an electrode stem part 210S or 220S extending in a first direction DR1 and at least one electrode branch part 210B or 220B extending and branching from the electrode stem part 210S or 220S in a second direction DR2 crossing (e.g., intersecting) the first direction DR1.

The first electrode 210 may include a first electrode stem part 210S extending in the first direction DR1 and at least one first electrode branch part 210B branching from the first electrode stem part 210S and extending in the second direction DR2.

The first electrode stem part 210S of any one pixel may have both ends ending between subpixels PXn and spaced apart from ends of neighboring first electrode stem parts 210S but may lie on substantially the same straight line as the first electrode stem parts 210S of neighboring subpixels (e.g., adjacent in the first direction DR1) in the same row. Because both ends of the first electrode stem parts 210S respectively disposed in the subpixels PXn are spaced apart from each other, a different electrical signal may be transmitted to each first electrode branch part 210B, and each first electrode branch part 210B may be driven separately.

The first electrode branch part 210B may branch from at least a part of the first electrode stem part 210S and extend in the second direction DR2 to end at a position spaced apart from a second electrode stem part 220S facing the first electrode stem part 210S.

The second electrode 220 may have the second electrode stem part 220S extending in the first direction DR1 and spaced apart from the first electrode stem part 210S in the second direction DR2 to face the first electrode stem part 210S and a second electrode branch part 220B branching from the second electrode stem part 220S and extending in the second direction DR2. The other end of the second electrode stem part 220S may be connected to the second electrode stem part 220S of another subpixel PXn adjacent in the first direction DR1. For example, different from the first electrode stem part 210S, the second electrode stem part 220S may extend in the first direction DR1 to cross the subpixels PXn. The second electrode stem part 220S crossing the subpixels PXn may be connected to a peripheral part of the display area DA in which each pixel PX or subpixel PXn is disposed or a part extending in a direction in the non-display area NDA.

The second electrode branch part 220B may be spaced apart from the first electrode branch part 2106 to face the first electrode branch part 210B and may end at a position spaced apart from the first electrode stem part 210S. The second electrode branch part 220B may be connected to the second electrode stem part 220S, and an end in the extending direction may be spaced apart from the first electrode stem part 210S in each subpixel PXn.

The first electrode 210 and the second electrode 220 may be electrically connected to a circuit element layer PAL (see, e.g., FIG. 4) of the display device 10 through contact openings (e.g., contact holes), for example, a first electrode contact opening (e.g., a first electrode contact hole) CNTD and a second electrode contact opening (e.g., a second electrode contact hole) CNTS, respectively. In the drawings, the first electrode contact opening CNTD is formed in the first electrode stem part 210S of each subpixel PXn, and only one second electrode contact opening CNTS is formed in one second electrode stem part 220S crossing the subpixels PXn. However, the present disclosure is not limited thereto. In some embodiments, the second electrode contact opening CNTS may also be formed in each subpixel PXn.

Although two first electrode branch parts 210B are disposed in each subpixel PXn and one second electrode branch part 220B is disposed between them in the drawings, the present disclosure is not limited thereto. For example, the first electrode 210 and the second electrode 220 may not necessarily extend in one direction and may be disposed in (or to have) various structures. For example, the first electrode 210 and the second electrode 220 may be partially curved or bent, or any one of the first electrode 210 and the second electrode 220 may surround (e.g., may extend around a periphery of) the other electrode. The structure or shape of the first electrode 210 and the second electrode 220 is not particularly limited as long as the first electrode 210 and the second electrode 220 are at least partially spaced apart to face each other so that a space in which the light-emitting elements 300 are to be disposed can be formed between the first electrode 210 and the second electrode 220.

In some embodiments, the electrode stem parts 210S and 220S may be omitted from the first electrode 210 and the second electrode 220, respectively. The first electrode 210 and the second electrode 220 may only extend in one direction and may be spaced apart from each other in each subpixel PXn. This will be described later with reference to another embodiment.

The banks 410, 420, and 430 may include the outer bank 430 disposed at a boundary between the subpixels PXn and the inner banks 410 and 420 disposed adjacent to the center of each subpixel PXn and under the electrodes 210 and 220, respectively. A first inner bank 410 and a second inner bank 420 may be disposed under the first electrode branch part 210B and the second electrode branch part 220B, respectively. These will be described in more detail later with reference to other drawings.

The outer bank 430 may be disposed at the boundary between the subpixels PXn. Respective ends of a plurality of first electrode stem parts 210S may be spaced apart from each other by the outer bank 430. The outer bank 430 may extend in the second direction DR2 to lie at the boundary between the subpixels PXn arranged in (e.g., adjacent to each other in) the first direction DR1. However, the present disclosure is not limited thereto, and the outer bank 430 may also extend in the first direction DR1 to lie at the boundary between the subpixels PXn arranged in the second direction DR2. The outer bank 430 may include the same material as the inner banks 410 and 420 and may be formed at the same time as the inner banks 410 and 420 in one process.

The light-emitting elements 300 may be disposed between the first electrode 210 and the second electrode 220. An end of each of the light-emitting elements 300 may be electrically connected to the first electrode 210, and the other end may be electrically connected to the second electrode 220. The light-emitting elements 300 may be electrically connected to the first electrode 210 and the second electrode 220 respectively through the contact electrodes 260, to be described in more detail later.

The light-emitting elements 300 may be spaced apart from each other and may be aligned substantially parallel to each other. A gap between the light-emitting elements 300 is not particularly limited. In some embodiments, a plurality of light-emitting elements 300 may be disposed adjacent to each other to form a group, and a plurality of other light-emitting elements 300 may form a group at a certain distance from the above group or may be oriented and aligned in a direction with non-uniform density. In an embodiment, the light-emitting elements 300 may extend in a direction, and the direction in which each electrode, for example, the first electrode branch part 210B and the second electrode branch part 220B, extend and the direction in which the light-emitting elements 300 extend may be substantially perpendicular to each other. However, the present disclosure is not limited thereto, and the light-emitting elements 300 may extend in a direction not perpendicular to but oblique to the direction in which the first electrode branch part 210B and the second electrode branch part 220B extend.

The light-emitting elements 300 according to an embodiment may include the active layers 330 including different materials to emit light of different wavelength bands to the outside. The display device 10 according to an embodiment may include the light-emitting elements 300 emitting light of different wavelength bands. In the display device 10, the light-emitting elements 300 disposed in the subpixels PXn may include the active layers 330 having the same structure but emitting (e.g., but configured to emit) different light (e.g., different color light). The light emitting elements 300 of the first subpixel PX1 may include the active layers 330 emitting first light L1 whose central wavelength band is a first wavelength. The light-emitting elements 300 of the second subpixel PX2 may include the active layers 330 emitting second light L2 whose central wavelength band is a second wavelength. The light emitting elements 300 of the third subpixel PXn may include the active layers 330 emitting third light L3 whose central wavelength band is a third wavelength.

Accordingly, the first light L1 may be emitted from the first subpixel PX1, the second light L2 may be emitted from the second subpixel PX2, and the third light L3 may be emitted from the third subpixel PX3. In some embodiments, the first light L1 may be blue light having a central wavelength band in a range of about 450 to about 495 nm, the second light L2 may be green light have a central wavelength band in a range of about 495 to about 570 nm, and the third light L3 may be red light having a central wavelength band in the range of about 620 to about 752 nm.

However, the present disclosure is not limited thereto. The first light L1, the second light L2, and the third light L3 may be light of different colors or light of the same color, and their central wavelength bands may also be different from the above ranges. In addition, in some embodiments, the first subpixel PX1, the second subpixel PX2, and the third subpixel PX3 may include the light-emitting elements 300 of the same type (e.g., the same light-emitting elements 300) to emit light of substantially the same color.

As illustrated in the drawings, the light-emitting elements 300 disposed in each subpixel PXn may include first light-emitting elements 301, second light-emitting elements 302, and third light-emitting elements 303 disposed between the first electrode branch part 210B and the second electrode branch part 220B. A process of manufacturing the light-emitting elements 300 may include etching a semiconductor structure 3000 (see, e.g., FIG. 11) formed on a lower substrate 1000 (see, e.g., FIG. 10) in a direction. The semiconductor structure 3000 may include an active layer 3300 having a different composition according to position, and there may be a difference in the wavelength band of light emitted from the active layer 3300. To reduce or minimize a difference between light emitted from the light-emitting elements 300, a composition ratio of the active layer 3300 may be controlled according to position in the semiconductor structure 3000.

A method for manufacturing the light-emitting elements 300 according to an embodiment may include forming a different pattern according to position in the active layer 3300. Accordingly, the manufactured light-emitting elements 300 may include different patterns on their end surfaces, and positions at where the light-emitting elements 300 are formed in the semiconductor structure 3000 may be identified by the patterns. To adjust emission characteristics of light emitted from some of the light-emitting elements 300, composition ratios at specific positions in the semiconductor structure 3000 may be adjusted through the patterns of the light-emitting elements 300. The display device 10 according to an embodiment may include the light-emitting elements 300 having different patterns, for example, the first light-emitting elements 301, the second light-emitting elements 302, and the third light-emitting elements 303 may have different patterns. The patterns of the light-emitting elements 300 will be described in more detail later.

The display device 10 may include a second insulating layer 510 (see, e.g., FIG. 4), which at least partially covers the first electrode 210 and the second electrode 220.

The second insulating layer 510 may be disposed in each subpixel PXn of the display device 10. The second insulating layer 510 may substantially cover (e.g., substantially entirely cover or entirely cover) each subpixel PXn and may also extend to other neighboring subpixels PXn. The second insulating layer 510 may at least partially cover the first electrode 210 and the second electrode 220. The second insulating layer 510 may partially expose (e.g., may expose a portion of) the first electrode 210 and the second electrode 220. In some embodiments, the second insulating layer 510 may partially expose the first electrode branch part 210B and the second electrode branch part 220B.

At least a part (or portion) of each of the contact electrodes 260 may extend in a direction. The contact electrodes 260 may contact the light-emitting elements 300 and the electrodes 210 and 220, and the light-emitting elements 300 may receive an electrical signal from the first electrode 210 and the second electrode 220 through the contact electrodes 260.

The contact electrodes 260 may include a first contact electrode 261 and a second contact electrode 262. The first contact electrode 261 and the second contact electrode 262 may be disposed on the first electrode branch part 210B and the second electrode branch part 220B, respectively.

The first contact electrode 261 may be disposed on the first electrode 210 or the first electrode branch part 210B and may extend in the second direction DR2, and the first contact electrode 261 may contact an end of each of the light-emitting elements 300. For example, the first contact electrode 261 may contact the first electrode 210 exposed without the second insulating layer 510 disposed thereon. Accordingly, the light-emitting elements 300 may be electrically connected to the first electrode 210 through the first contact electrode 261.

The second contact electrode 262 may be disposed on the second electrode 220 or the second electrode branch part 220B and may extend in the second direction DR2. The second contact electrode 262 may be spaced apart from the first contact electrode 261 in the first direction DR1. The second contact electrode 262 may contact the other end of each of the light-emitting elements 300. For example, the second contact electrode 262 may contact the second electrode 220 exposed without the second insulating layer 510 disposed thereon. Accordingly, the light-emitting elements 300 may be electrically connected to the second electrode 220 through the second contact electrode 262. Although an embodiment in which two first contact electrodes 261 and one second contact electrode 262 are disposed in one subpixel PXn is illustrated in the drawings, the present disclosure is not limited thereto. The number of first contact electrodes 261 and second contact electrodes 262 may vary according to the number of first electrodes 210 and second electrodes 220 or the number of first electrode branch parts 210B and second electrode branch parts 220B disposed in each subpixel PXn.

In some embodiments, widths of the first contact electrode 261 and the second contact electrode 262 measured in a direction may respectively be greater than widths of the first electrode 210 and the second electrode 220 or widths of the first electrode branch part 210B and the second electrode branch part 220B measured in the direction. Each of the first contact electrode 261 and the second contact electrode 262 may cover sides of the first electrode 210 or the second electrode 220 or sides of the first electrode branch part 210B or the second electrode branch part 220B. However, the present disclosure is not limited thereto. In some embodiments, each of the first contact electrode 261 and the second contact electrode 262 may cover only one side of the first electrode branch part 210B or the second electrode branch part 220B.

The display device 10 may include the circuit element layer PAL, which is located under each of the electrodes 210 and 220 and a third insulating layer 520 (see, e.g., FIG. 4), and a passivation layer 550 (see, e.g., FIG. 4), which at least partially cover each electrode 210 or 220 and the light-emitting elements 300. The structure of the display device 10 according to an embodiment will now be described in more detail with reference to FIG. 4.

FIG. 4 is a cross-sectional view taken along the lines Xa-Xa', Xb-Xb', and Xc-Xc' in FIG. 3.

FIG. 4 illustrates a cross section of only the first subpixel PX1, but the same illustration may be applied to other pixels PX or subpixels PXn (e.g., other pixels PX or subpixel PXn may have the same or substantially similar structure as the first subpixel PX1). FIG. 4 illustrates a cross section across an end and the other end of a light-emitting element 300 disposed in the first subpixel PX1.

Referring to FIG. 4, in conjunction with FIGS. 2 and 3, the display device 10 may include the circuit element layer PAL and a light emitting layer EML. The circuit element layer PAL may include a substrate 110, a buffer layer 115, light blocking layers BML, first and second transistors 120 and 140, etc. The light emitting layer EML may include the plurality of electrodes 210 and 220, the light-emitting elements 300, a plurality of insulating layers 510, 520 and 550, etc., disposed on the first and second transistors 120 and 140.

The substrate 110 may be an insulating substrate. The substrate 110 may include (or may be made of) an insulating material, such as glass, quartz, or polymer resin. In addition, the substrate 110 may be a rigid substrate or may be a flexible substrate that can be bent, folded, rolled, etc.

The light blocking layers BML may be disposed on the substrate 110. The light blocking layers BML may include a first light blocking layer BML1 and a second light blocking layer BML2. The first light blocking layer BML1 may be electrically connected to a first drain electrode 123 of the first transistor 120, which will be described in more detail later. The second light blocking layer BML2 may be electrically connected to a second drain electrode 143 of the second transistor 140.

The first light blocking layer BML1 and the second light blocking layer BML2 are overlapped by a first active material layer 126 of the first transistor 120 and a second active material layer 146 of the second transistor 140, respectively. The first and second light blocking layers BML1 and BML2 may include a light blocking material to prevent or substantially prevent light from entering the first and second active material layers 126 and 146. For example, the first and second light blocking layers BML1 and BML2 may include (or may be made of) an opaque metal material that blocks or substantially blocks the transmission of light. However, the present disclosure is not limited thereto. In some embodiments, the light blocking layers BML may be omitted.

The buffer layer 115 is disposed on the light blocking layers BML and the substrate 110. The buffer layer 115 may entirely cover the substrate 110 as well as the light blocking layers BML. The buffer layer 115 may prevent or substantially prevent diffusion of impurity ions, prevent or substantially prevent penetration of moisture or outside air, and perform a surface planarization function. In addition, the buffer layer 115 may insulate the light blocking layers BML and the first and second active material layers 126 and 146 from each other.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, an oxide semiconductor, or the like.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first active material layer 126 and the second active material layer 146 may include polycrystalline silicon. The polycrystalline silicon may be formed by crystalizing amorphous silicon. Examples of the crystallization method include, but are not limited to, a rapid thermal annealing (RTA) method, a solid phase crystallization (SPC) method, an excimer laser annealing (ELA) method, a metal induced crystallization (MILC) method, and a sequential lateral solidification (SLS) method. In other embodiments, the first active material layer 126 and the second active material layer 146 may include monocrystalline silicon, low-temperature polycrystalline silicon, amorphous silicon, or the like. The first doped region 126a, the second doped region 126b, the third doped region 146a, and the fourth doped region 146b may be, but are not limited to, regions of the first active material layer 126 and the second active material layer 146 that are doped with impurities.

The first active material layer 126 and the second active material layer 146 are not necessarily limited to the above description. In an embodiment, the first active material layer 126 and the second active material layer 146 may include an oxide semiconductor. In such an embodiment, the first doped region 126a and the third doped region 146a may be first conducting regions, and the second doped region 126b and the fourth doped region 146b may be second conducting regions. When the first active material layer 126 and the second active material layer 146 include an oxide semiconductor, the oxide semiconductor may be an oxide semiconductor including (or containing) indium (In). In some embodiments, the oxide semiconductor may be, but is not limited to, indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO).

A first gate insulating layer 150 is disposed on the semiconductor layer. The first gate insulating layer 150 may entirely cover the buffer layer 115 as well as the semiconductor layer. The first gate insulating layer 150 may act as a gate insulating layer for each of the first and second transistors 120 and 140.

A first conductive layer is disposed on the first gate insulating layer 150. The first conductive layer disposed on the first gate insulating layer 150 may include a first gate electrode 121 disposed on the first active material layer 126 of the first transistor 120, a second gate electrode 141 disposed on the second active material layer 146 of the second transistor 140, and a power wiring 161 disposed on the auxiliary layer 163. The first gate electrode 121 may overlap the first channel region 126c of the first active material layer 126, and the second gate electrode 141 may overlap the second channel region 146c of the second active material layer 146.

An interlayer insulating film 170 is disposed on the first conductive layer. The interlayer insulating film 170 may act as an insulating film between the first conductive layer and other layers disposed on the first conductive layer. The interlayer insulating film 170 may include an organic insulating material and may perform a surface planarization function.

A second conductive layer is disposed on the interlayer insulating film 170. The second conductive layer includes the first drain electrode 123 and a first source electrode 124 of the first transistor 120, the second drain electrode 143 and a second source electrode 144 of the second transistor 140, and a power electrode 162 disposed on the power wiring 161.

The first drain electrode 123 and the first source electrode 124 may respectively contact the first doped region 126a and the second doped region 126b of the first active material layer 126 through contact openings (e.g., contact holes) penetrating (or extending through) the interlayer insulating film 170 and the first gate insulating layer 150. The second drain electrode 143 and the second source electrode 144 may respectively contact the third doped region 146a and the fourth doped region 146b of the second active material layer 146 through contact openings (e.g., contact holes) penetrating the interlayer insulating film 170 and the first gate insulating layer 150. In addition, the first drain electrode 123 and the second drain electrode 143 may be electrically connected to the first light blocking layer BML1 and the second light blocking layer BML2 through other contact openings (e.g., contact holes), respectively.

A first insulating layer 200 is disposed on the second conductive layer. The first insulating layer 200 may include an organic insulating material and may perform a surface planarization function.

The inner banks 410 and 420, the outer bank 430, the electrodes 210 and 220, and the light-emitting elements 300 may be disposed on the first insulating layer 200.

The banks 410, 420, and 430 may include the inner banks 410 and 420 spaced apart from each other in each subpixel PXn and the outer bank 430 disposed at the boundary between neighboring (or adjacent) subpixels PXn.

The outer bank 430 may extend in the second direction DR2 and be at (e.g., to lie at) the boundary between the subpixels PXn arranged in (e.g., adjacent to each other in) the first direction DR1. However, the present disclosure is not limited thereto, and the outer bank 430 may also extend in the first direction DR1 to be at the boundary between the subpixels PXn arranged in the second direction DR2. For example, the outer bank 430 may define the boundary of each subpixel PXn.

When the display device 10 is manufacturing by a method in which ink with the light-emitting elements 300 dispersed (or suspended) therein is sprayed using an inkjet printing device, the outer bank 430 may prevent or substantially prevent the ink from flowing over (or out of) the boundary of each subpixel PXn. The outer bank 430 may separate inks in which different light-emitting elements 300 are dispersed for different subpixels PXn so that the inks do not mix with each other. However, the present disclosure is not limited thereto.

The inner banks 410 and 420 may include the first inner bank 410 and the second inner bank 420 disposed adjacent to the center of each subpixel PXn.

The first inner bank 410 and the second inner bank 420 are spaced apart to face each other. The first electrode 210 may be disposed on the first inner bank 410, and the second electrode 220 may be disposed on the second inner bank 420. As shown in FIGS. 3 and 4, the first electrode branch part 210B is disposed on the first inner bank 410 and the second electrode branch part 220B is disposed on the second inner bank 420.

The first inner bank 410 and the second inner bank 420 may extend in the second direction DR2 in each subpixel PXn. The first inner bank 410 and the second inner bank 420 may extend in the second direction DR2 toward a neighboring subpixel PXn in the second direction DR2. However, the present disclosure is not limited thereto, and the first inner bank 410 and the second inner bank 420 may be disposed in each subpixel PXn to form patterns in the entire display device 10. The banks 410, 420, and 430 may include, but are not limited to, polyimide (PI).

At least a part of each of the first inner bank 410 and the second inner bank 420 may protrude from the first insulating layer 200. Each of the first inner bank 410 and the second inner bank 420 may protrude upwardly from a plane in which the light-emitting elements 300 are disposed, and the protruding part (or portion) may be at least partially inclined (e.g., may have one or more inclined surfaces). The protruding shape of each of the first inner bank 410 and the second inner bank 420 is not limited.

When the inner banks 410 and 420 protruding from the first insulating layer 200 have inclined side surfaces, light emitted from the light-emitting elements 300 may be reflected by the inclined side surfaces of the inner banks 410 and 420. As will be described in more detail later, when the electrodes 210 and 220 disposed on the inner banks 410 and 420 include a material having high reflectivity, light emitted from the light-emitting elements 300 may be reflected by the electrodes 210 and 220 located on the inclined side surfaces of the inner banks 410 and 420 to travel upwardly above (e.g., away from) the first insulating layer 200.

As described above, the banks 410, 420, and 430 may include the same material and may be formed in the same process. However, when the outer bank 430 is disposed at the boundary of each subpixel PXn to form a grid pattern, the inner banks 410 and 420 are disposed in each subpixel PXn to extend in a direction. In addition, when the outer bank 430 separates neighboring subpixels PXn and prevents ink from overflowing to adjacent subpixels PXn in an inkjet process, the inner banks 410 and 420 have a protruding structure in each subpixel PXn to act as reflective barriers that reflect light emitted from the light-emitting elements 300 upwardly above the first insulating layer 200. However, the present disclosure is not limited thereto.

The electrodes 210 and 220 may be disposed on the first insulating layer 200 and the inner banks 410 and 420. As described above, each of the electrodes 210 and 220 includes the electrode stem part 210S or 220S and the electrode branch part 210B or 220B. The line Xa-Xa' in FIG. 3 is a line crossing the first electrode stem part 210S, the line Xb-Xb' in FIG. 3 is a line crossing the first electrode branch part 210B and the second electrode branch part 220B, and the line Xc-Xc' in FIG. 3 is a line crossing the second electrode stem part 220S. For example, it may be understood that the first electrode 210 disposed along the area Xa-Xa' in FIG. 4 is the first electrode stem part 210S, the first electrode 210 and the second electrode 220 disposed along the area Xb-Xb' in FIG. 4 are the first electrode branch part 210B and the second electrode branch part 220B, respectively, and the second electrode 220 disposed along the area Xc-Xc' in FIG. 4 is the second electrode stem part 220S. The electrode stem parts 210S and 220S and the electrode branch parts 210B and 220B may form the first electrode 210 and the second electrode 220, respectively.

Each of the first electrode 210 and the second electrode 220 may have a part (or portion) disposed on the first insulating layer 200 and a part (or portion) disposed on the first inner bank 410 or the second inner bank 420. As described above, the first electrode stem part 210S of the first electrode 210 and the second electrode stem part 220S of the second electrode 220 may extend in the first direction DR1, and the first inner bank 410 and the second inner bank 420 may extend in the second direction DR2 to also lie in a neighboring subpixel PXn in the second direction DR2. The first electrode stem part 210S and the second electrode stem part 220S of the first electrode 210 and the second electrode 220, which extend in the first direction DR1, may partially overlap the first inner bank 410 and the second inner bank 420. However, the present disclosure is not limited thereto, and the first electrode stem part 210S and the second electrode stem part 220S may not overlap the first inner bank 410 and the second inner bank 420.

The first electrode contact opening CNTD penetrating the first insulating layer 200 to expose a part of the first drain electrode 123 of the first transistor 120 may be formed in (or under) the first electrode stem part 210S of the first electrode 210. The first electrode 210 may contact the first drain electrode 123 through the first electrode contact opening CNTD. The first electrode 210 may be electrically connected to the first drain electrode 123 of the first transistor 120 to receive an electrical signal (e.g., a predetermined electrical signal).

The second electrode stem part 220S of the second electrode 220 may extend in a direction to also lie in the non-emission area in which the light-emitting elements 300 are not disposed. The second electrode contact opening CNTS penetrating the first insulating layer 200 to expose a part of the power electrode 162 may be formed in the second electrode stem part 220S. The second electrode 220 may contact the power electrode 162 through the second electrode contact opening CNTS. The second electrode 220 may be electrically connected to the power electrode 162 to receive an electrical signal (e.g., a predetermined electrical signal) from the power electrode 162.

Parts of the first electrode 210 and the second electrode 220, for example, the first electrode branch part 210B and the second electrode branch part 220B, may be disposed on the first inner bank 410 and the second inner bank 420, respectively. The first electrode branch part 210B of the first electrode 210 may cover the first inner bank 410, and the second electrode branch part 220B of the second electrode 220 may cover the second inner bank 420. Because the first inner bank 410 and the second inner bank 420 are spaced apart from each other in the center of each subpixel PXn, the first electrode branch part 210B and the second electrode branch part 220B may also be spaced apart from each other. A plurality of light-emitting elements 300 may be disposed in an area between the first electrode 210 and the second electrode 220, for example, in a space in which the first electrode branch part 210B and the second electrode branch part 220B are spaced apart to face each other.

Each of the electrodes 210 and 220 may include a transparent conductive material. For example, each of the electrodes 210 and 220 may include a material, such as indium tin oxide (ITO), indium zinc oxide (IZO), or indium tin zinc oxide (ITZO). However, the present disclosure is not limited thereto. In some embodiments, each of the electrodes 210 and 220 may include a conductive material having high reflectivity. For example, each of the electrodes 210 and 220 may include a metal, such as silver (Ag), copper (Cu), or aluminum (Al) as a material having high reflectivity. In such an embodiment, each of the electrodes 210 and 220 may reflect incident light in an upward direction of each subpixel PXn.

In addition, each of the electrodes 210 and 220 may have a structure in which a transparent conductive material and a metal layer having high reflectivity are each stacked in one or more layers or may be formed as a single layer including them. In an embodiment, each of the electrodes 210 and 220 may have a stacked structure of ITO/Ag/ITO/IZO or may be an alloy including (or containing) aluminum (Al), nickel (Ni), lanthanum (La), etc. However, the present disclosure is not limited thereto.

The second insulating layer 510 is disposed on the first insulating layer 200, the first electrode 210, and the second electrode 220. The second insulating layer 510 partially covers the first electrode 210 and the second electrode 220. The second insulating layer 510 may cover most of upper surfaces of the first electrode 210 and the second electrode 220 but may partially expose the first electrode 210 and the second electrode 220. The second insulating layer 510 may partially expose the upper surfaces of the first electrode 210 and the second electrode 220, for example, the second insulating layer 510 may partially expose an upper surface of the first electrode branch part 210B disposed on the first inner bank 410 and an upper surface of the second electrode branch part 220B disposed on the second inner bank 420. For example, the second insulating layer 510 may be substantially entirely formed on the first insulating layer 200 but may include openings partially exposing the first electrode 210 and the second electrode 220. The openings of the second insulating layer 510 may be positioned to expose the relatively flat upper surfaces of the first electrode 210 and the second electrode 220.

In an embodiment, the second insulating layer 510 may be stepped such that a part of an upper surface of the second insulating layer 510 is depressed between the first electrode 210 and the second electrode 220. In some embodiments, the second insulating layer 510 may include an inorganic insulating material, and a part of the upper surface of the second insulating layer 510 disposed to cover the first electrode 210 and the second electrode 220 may be depressed due to a step formed by the members disposed under the second insulating layer 510. The light-emitting elements 300 disposed on the second insulating layer 510 between the first electrode 210 and the second electrode 220 may form an empty space with the depressed upper surface of the second insulating layer 510. The light-emitting elements 300 may be partially spaced apart from the upper surface of the second insulating layer 510, and the empty space may be filled with a material that forms the third insulating layer 520 to be described later.

However, the present disclosure is not limited thereto. The second insulating layer 510 may also form a flat upper surface so that the light-emitting elements 300 can be disposed on the flat upper surface. The upper surface may extend in a direction toward the first electrode 210 and the second electrode 220 and may end on inclined side surfaces of the first electrode 210 and the second electrode 220. For example, the second insulating layer 510 may be disposed in areas where the electrodes 210 and 220 overlap the inclined side surfaces of the first inner bank 410 and the second inner bank 420, respectively. The contact electrodes 260, to be described in more detail later, may contact the exposed areas of the first electrode 210 and the second electrode 220 and may smoothly contact ends of the light-emitting elements 300 on the flat upper surface of the second insulating layer 510.

The second insulating layer 510 may protect the first electrode 210 and the second electrode 220 while insulating them from each other. In addition, the second insulating layer 510 may prevent the light-emitting elements 300 disposed on the second insulating layer 510 from directly contacting other members and, thus, from being damaged. However, the shape and structure of the second insulating layer 510 are not limited thereto.

The light-emitting elements 300 may be disposed on the second insulating layer 510 between the electrodes 210 and 220. For example, at least one light-emitting element 300 may be disposed on the second insulating layer 510 disposed between the electrode branch parts 210B and 220B. However, the present disclosure is not limited thereto. At least some of the light-emitting elements 300 disposed in each subpixel PXn may also be disposed in an area other than the area between the electrode branch parts 210B and 220B. The light-emitting elements 300 may be disposed at a position where a part of each light-emitting element 300 overlaps the electrodes 210 and 220. The light-emitting elements 300 may be disposed on respective ends of the first electrode branch part 210B and the second electrode branch part 220B which face each other and may be electrically connected to the electrodes 210 and 220 through the contact electrodes 260, respectively.

Each of the light-emitting elements 300 may include a plurality of layers disposed in a direction horizontal to the first insulating layer 200. Each of the light-emitting elements 300 of the display device 10 according to an embodiment may extend in one direction and may have a structure in which a plurality of semiconductor layers are sequentially disposed in the one direction. As will be described in more detail later, each of the light-emitting elements 300 may include a first semiconductor layer 310, the active layer 330, a second semiconductor layer 320, and an electrode layer 370 sequentially disposed along the one direction, and an insulating film 380 may surround (e.g., may extend around) outer surfaces of the above layers. The direction in which the light-emitting elements 300 disposed in the display device 10 extend may be parallel to the first insulating layer 200, and the semiconductor layers included in each of the light-emitting elements 300 may be sequentially disposed along a direction parallel to an upper surface of the first insulating layer 200. However, the present disclosure is not limited thereto. In some embodiments, when the light-emitting elements 300 have a different structure, the layers therein may be disposed in a direction perpendicular to the first insulating layer 200.

In addition, an end of each of the light-emitting elements 300 may contact the first contact electrode 261, and the other end may contact the second contact electrode 262. According to an embodiment, the insulating film 380 may not be formed on end surfaces of each light-emitting element 300 in the extending direction of the light-emitting element 300, thereby exposing the end surfaces. Thus, the exposed areas of each of the light-emitting elements 300 may contact the first contact electrode 261 and the second contact electrode 262, to be described in more detail later.

However, the present disclosure is not limited thereto. In some embodiments, at least a part of the insulating film 380 of each light-emitting element 300 may be removed, and the insulating film 380 may be removed (e.g., partially or selectively removed) to partially expose side surfaces of both ends of the light-emitting element 300. In an operation of forming the third insulating layer 520 covering an outer surface of each light-emitting element 300 during a process of manufacturing the display device 10, the insulating film 380 may be partially removed. The exposed side surfaces of each light-emitting element 300 may contact the first contact electrode 261 and the second contact electrode 262. However, the present disclosure is not limited thereto.

The third insulating layer 520 may be disposed on a part of each light-emitting element 300 disposed between the first electrode 210 and the second electrode 220. The third insulating layer 520 may partially cover the outer surface of each light-emitting element 300. The third insulating layer 520 may protect the light-emitting elements 300 while fixing (e.g., fixing the location of) the light-emitting elements 300 in the process of manufacturing the display device 10. In addition, in an embodiment, some of the third insulating layer 520 may be disposed between lower surfaces of the light-emitting elements 300 and the second insulating layer 510. As described above, the third insulating layer 520 may be formed to fill the space between the second insulating layer 510 and each light-emitting element 300 formed during the process of manufacturing the display device 10. Accordingly, the third insulating layer 520 may be formed to cover the outer surface of each light-emitting element 300. However, the present disclosure is not limited thereto.

The third insulating layer 520 may extend in the second direction DR2 between the first electrode branch part 210B and the second electrode branch part 220B in a plan view. For example, the third insulating layer 520 disposed on the first insulating layer 200 may have an island or linear shape in a plan view. According to an embodiment, the third insulating layer 520 may be disposed on the light-emitting elements 300.

Each of the first contact electrode 261 and the second contact electrode 262 is disposed on the electrode 210 or 220 and the third insulating layer 520. The first contact electrode 261 and the second contact electrode 262 may be spaced apart from each other on the third insulating layer 520. The third insulating layer 520 may insulate the first contact electrode 261 and the second contact electrode 262 from each other to prevent them from directly contacting each other.

As described above, the first contact electrode 261 and the second contact electrode 262 may extend in the second direction DR2 in a plan view and may be spaced apart from each other in the first direction DR1. Each of the first contact electrode 261 and the second contact electrode 262 may contact at least one end of each light-emitting element 300 and may be electrically connected to the first electrode 210 or the second electrode 220 to receive an electrical signal.

The first contact electrode 261 may contact an exposed area of the first electrode 210 on the first inner bank 410, and the second contact electrode 262 may contact an exposed area of the second electrode 220 on the second inner bank 420.

The first contact electrode 261 and the second contact electrode 262 may send an electrical signal received from each electrode 210 or 220 to the light-emitting elements 300.

The contact electrodes 260 may include a conductive material, such as ITO, IZO, ITZO, or aluminum (Al). However, the present disclosure is not limited thereto.

The passivation layer 550 may be disposed on the contact electrodes 260 and the third insulating layer 520. The passivation layer 550 may protect the members disposed on the first insulating layer 200 from the external environment.

Each of the second insulating layer 510, the third insulating layer 520, and the passivation layer 550 described above may include an inorganic insulating material or an organic insulating material. In an embodiment, the second insulating layer 510, the third insulating layer 520, and the passivation layer 550 may include an inorganic insulating material, such as silicon oxide ($SiO_x$), silicon nitride ($SiN_x$), silicon oxynitride ($SiO_xN_y$), aluminum oxide ($Al_2O_3$), or aluminum nitride (AlN). In other embodiments, the second insulating layer 510, the third insulating layer 520, and the passivation layer 550 may include an organic insulating material, such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the present disclosure is not limited thereto.

The display device 10 may include a greater number of insulating layers. According to an embodiment, the display device 10 may further include a fourth insulating layer 530 disposed to protect the first contact electrode 261.

Figure 5:
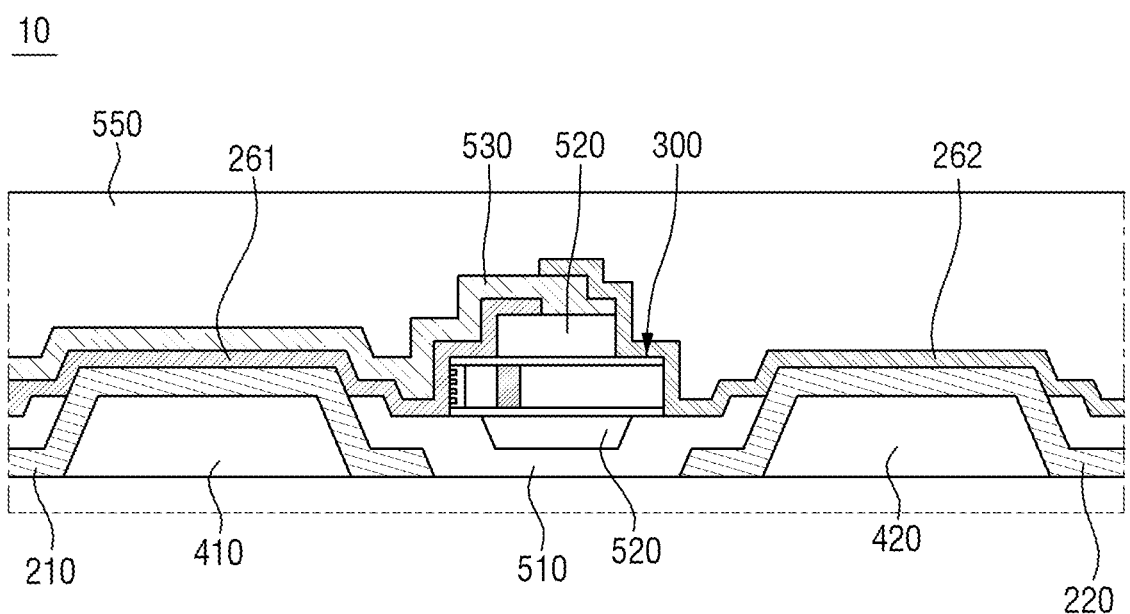
FIG. 5 is a cross-sectional view of a part of a display device according to an embodiment.

FIG. 5 is a cross-sectional view of a part of a display device according to an embodiment.

Referring to FIG. 5, a display device 10 according to an embodiment may further include a fourth insulating layer 530 disposed on a first contact electrode 261. The display device 10 illustrated in FIG. 5 is different from the display device 10 illustrated in FIG. 4 in that it further includes the fourth insulating layer 530, and thus, at least a part of a second contact electrode 262 is disposed on the fourth insulating layer 530. Therefore, any redundant description therebetween may be omitted and differences will be mainly described below.

The display device 10 shown in FIG. 5 may include the fourth insulating layer 530, which is disposed on the first contact electrode 261 and electrically insulates the first contact electrode 261 and the second contact electrode 262 from each other. The fourth insulating layer 530 may cover the first contact electrode 261 but may not overlap a part (or portion) of each light-emitting element 300 so that the light-emitting element 300 can be connected to the second contact electrode 262. The fourth insulating layer 530 may be disposed on an upper surface of a third insulating layer 520 to partially contact the first contact electrode 261 and the third insulating layer 520. The fourth insulating layer 530 may cover an end of the first contact electrode 261 on the third insulating layer 520. Accordingly, the fourth insulating layer 530 may protect the first contact electrode 261 while electrically insulating the first contact electrode 261 from the second contact electrode 262.

A side surface of the fourth insulating layer 530 in a direction in which the second contact electrode 262 is disposed may be aligned with a side surface of the third insulating layer 520. However, the present disclosure is not limited thereto. In some embodiments, the fourth insulating layer 530 may include an inorganic insulating material, similar to or the same as the second insulating layer 510.

The first contact electrode 261 may be disposed between a first electrode 210 and the fourth insulating layer 530, and the second contact electrode 262 may be disposed on the fourth insulating layer 530. The second contact electrode 262 may partially contact the second insulating layer 510, the third insulating layer 520, the fourth insulating layer 530, a second electrode 220, and the light-emitting elements 300. An end of the second contact electrode 262 in a direction in which the first electrode 210 is disposed may be disposed on the fourth insulating layer 530.

A passivation layer 550 may be disposed on the fourth insulating layer 530 and the second contact electrode 262 to protect them. A redundant description thereof may be omitted.

As described above, the display device 10 according to an embodiment may include the light-emitting elements 300, each having a pattern formed on an end surface thereof. The display device 10 may include a plurality of light-emitting elements 300 having different patterns, for example, the first light-emitting elements 301, the second light-emitting elements 302, and the third light-emitting elements 303. Each of the first light-emitting elements 301, the second light-emitting elements 302, and the third light-emitting elements 303 includes a pattern part 370P (see, e.g., FIG. 7) formed on an end surface thereof. At which position in the semiconductor structure 3000 each light-emitting element 300 is manufactured can be identified by the pattern part 370P formed on the light-emitting element 300. A light-emitting element 300 according to an embodiment will now be described in more detail with reference to other drawings.

Figure 6:
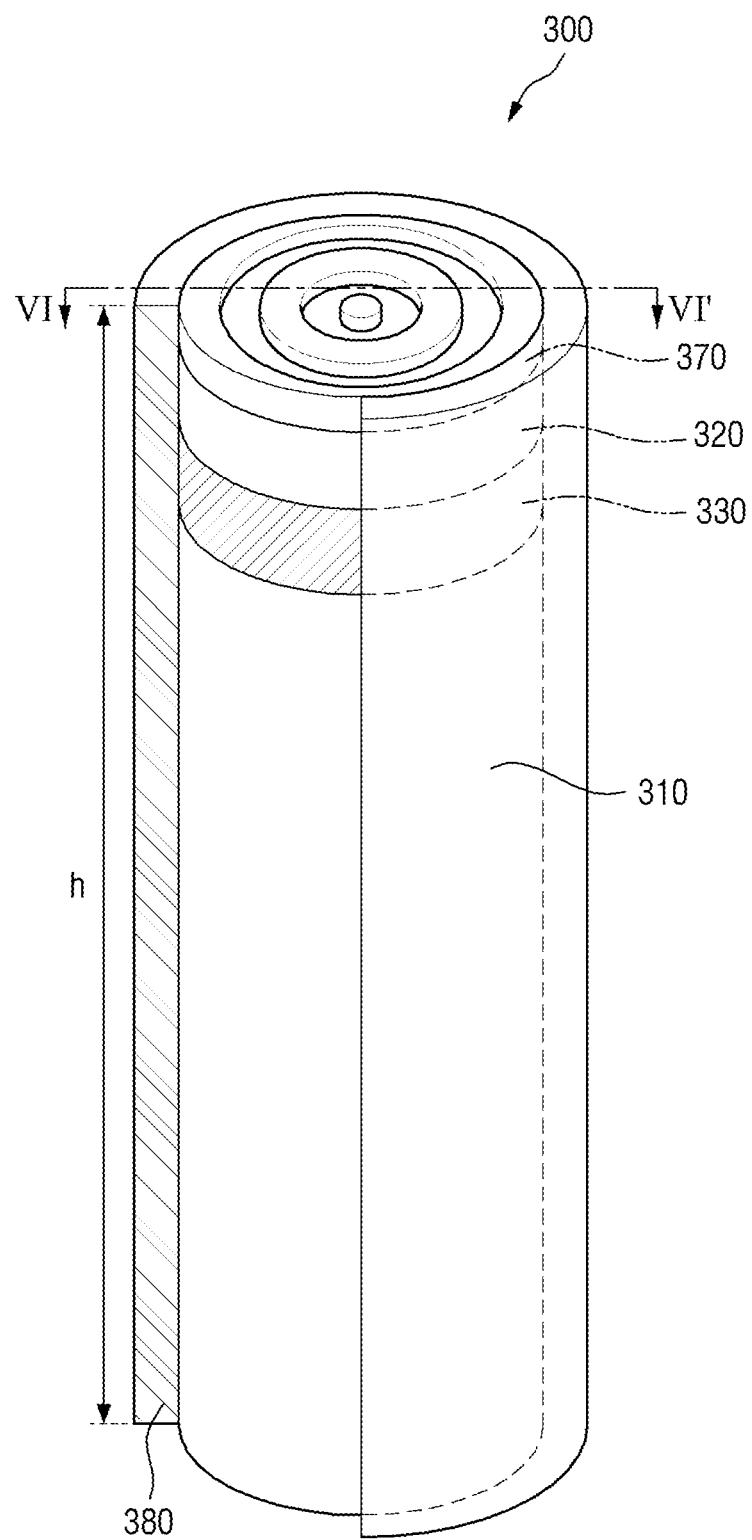
FIG. 6 is a schematic view of a light-emitting element according to an embodiment.
Figure 7:
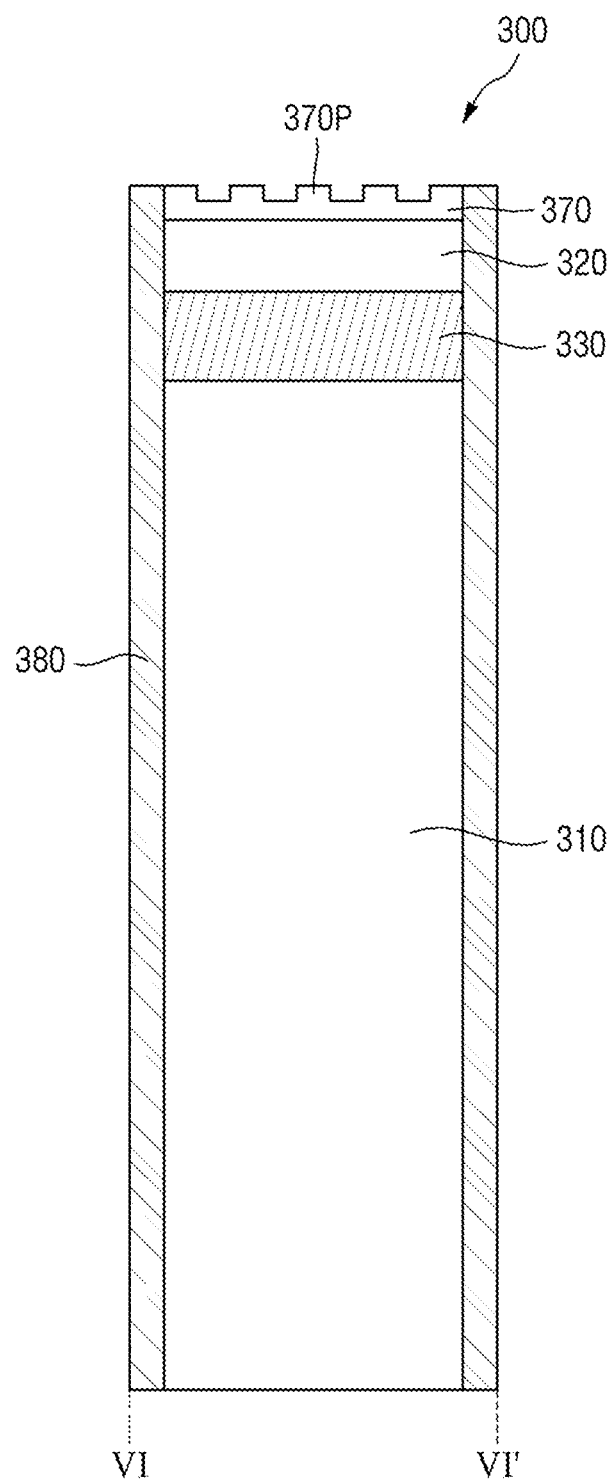
FIG. 7 is a cross-sectional view taken along the line VI-VI' of FIG. 6.

FIG. 6 is a schematic view of a light-emitting element according to an embodiment, and FIG. 7 is a cross-sectional view taken along the line VI-VI' in FIG. 6.

A light-emitting element 300 may be a light emitting diode. For example, the light-emitting element 300 may be an inorganic light emitting diode having a size of micrometers or nanometers and including (or made of) an inorganic material. When an electric field is formed in a specific direction between two electrodes facing each other, the inorganic light emitting diode may be aligned between the two electrodes in which polarities are formed. The light-emitting element 300 may be aligned between two electrodes by an electric field formed between the two electrodes.

The light-emitting element 300 according to an embodiment may extend in one direction. The light-emitting element 300 may have a rod shape, a wire shape, a tube shape, or the like. In an embodiment, the light-emitting element 300 may have a cylindrical or a rod shape. However, the shape of the light-emitting element 300 is not limited thereto, and the light-emitting element 300 may have various suitable shapes including polygonal prisms, such as a cube, a rectangular parallelepiped, and a hexagonal prism, and a shape extending in a direction and having a partially inclined outer surface. A plurality of semiconductors included in the light-emitting element 300, which will be described in more detail later, may be sequentially disposed or stacked along the one direction.

The light-emitting element 300 may include a semiconductor layer doped with impurities of any conductivity type (e.g., a p-type or an n-type). The semiconductor layer may receive an electrical signal from an external power source and emit light in a specific wavelength band.

The light-emitting element 300 according to an embodiment may emit light in a specific wavelength band. In an embodiment, the active layer 330 may emit blue light having a central wavelength band is in a range of about 450 to about 495 nm. However, the central wavelength band of the blue light is not limited to the above range, and it should be understood to include all wavelength ranges that can be recognized as blue in the art to which the present disclosure pertains. In addition, light emitted from the active layer 330 of the light-emitting element 300 is not limited to the blue light and may also be green light having a central wavelength band in a range of about 495 to about 570 nm or red light having a central wavelength band in a range of about 620 to about 750 nm. The light-emitting element 300 emitting the blue light will be described in more detail below as an example.

Referring to FIGS. 6 and 7, the light-emitting element 300 may include a first semiconductor layer 310, a second semiconductor layer 320, the active layer 330, an electrode layer 370, and the insulating film 380.

The first semiconductor layer 310 may be an n-type semiconductor. In an example, when the light-emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$), for example, any one or more of n-type doped AlGaInN, GaN, AlGaN, InGaN, AlN, and InN. The first semiconductor layer 310 may be doped with an n-type dopant, and the n-type dopant may be, for example, Si, Ge, or Sn. In an embodiment, the first semiconductor layer 310 may be n-GaN doped with n-type Si. A length of the first semiconductor layer 310 may be in a range of, but is not limited to, about 1.5 to about 5 μm.

The second semiconductor layer 320 is disposed on the active layer 330 to be described in more detail later. The second semiconductor layer 320 may be a p-type semiconductor. In an example, when the light-emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$), for example, any one or more of p-type doped AlGaInN, GaN, AlGaN, InGaN, AlN, and InN. The second semiconductor layer 320 may be doped with a p-type dopant, and the p-type dopant may be, for example, Mg, Zn, Ca, Se, or Ba. In an embodiment, the second semiconductor layer 320 may be p-GaN doped with p-type Mg. A length of the second semiconductor layer 320 may be in a range of, but is not limited to, about 0.05 to about 0.10 μm.

Although each of the first semiconductor layer 310 and the second semiconductor layer 320 is illustrated as being composed of one layer in the drawings, the present disclosure is not limited thereto. According to some embodiments, each of the first semiconductor layer 310 and the second semiconductor layer 320 may include more layers, for example, a clad layer or a tensile strain barrier reducing layer depending on the material of the active layer 330. This will be described in more detail later with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, it may have a structure in which a plurality of quantum layers and a plurality of well layers are alternately stacked. The active layer 330 may emit light through combination of electron-hole pairs according to an electrical signal received through the first semiconductor layer 310 and the second semiconductor layer 320. For example, when the active layer 330 emits light in the blue wavelength band, it may include a material such as AlGaN or AlGaInN. When the active layer 330 has a multiple quantum well structure in which a quantum layer and a well layer are alternately stacked, the quantum layer may include a material such as AlGaN or AlGaInN, and the well layer may include a material such as GaN or AlInN. In an embodiment, the active layer 330 may include AlGaInN as a quantum layer and AlInN as a well layer to emit blue light having a central wavelength band in a range of about 450 to about 495 nm as described above.

However, the present disclosure is not limited thereto, and the active layer 330 may also have a structure in which a semiconductor material having a large band gap energy and a semiconductor material having a small band gap energy are alternately stacked or may include different group 3 to 5 semiconductor materials depending on the wavelength band of light that it emits. Light emitted from the active layer 330 is not limited to light in the blue wavelength band. In some embodiments, the active layer 330 may emit light in a red or green wavelength band. A length of the active layer 330 may be in a range of, but is not limited to, about 0.05 to about 0.10 μm.

Light emitted from the active layer 330 may be radiated not only to an outer surface of the light-emitting element 300 in a longitudinal direction but also to both side surfaces. The direction of light emitted from the active layer 330 is not limited to one direction.

The electrode layer 370 may be an ohmic contact electrode. However, the present disclosure is not limited thereto, and the electrode layer 370 may also be a Schottky contact electrode. The light-emitting element 300 may include at least one electrode layer 370. Although the light-emitting element 300 illustrated in FIG. 6 includes one electrode layer 370, the present disclosure is not limited thereto. In some embodiments, the light-emitting element 300 may include more electrode layers 370 or the electrode layer 370 may be omitted. The following description of the light-emitting element 300 may apply equally even if the number of electrode layers 370 is changed or another structure is further included.

When the light-emitting element 300 is electrically connected to an electrode or a contact electrode in a display device 10 according to an embodiment, the electrode layer 370 may reduce the resistance between the light-emitting element 300 and the electrode or the contact electrode. The electrode layer 370 may include a conductive metal. For example, the electrode layer 370 may include at least any one of aluminum (Al), titanium (Ti), indium (In), gold (Au), silver (Ag), indium tin oxide (ITO), indium zinc oxide (IZO), and indium tin zinc oxide (ITZO). In addition, the electrode layer 370 may include an n-type or p-type doped semiconductor material. The electrode layer 370 may include the same material or different materials, but the present disclosure is not limited thereto.

The insulating film 380 surrounds (e.g., extends around a periphery of) outer surfaces of the semiconductor layers and electrode layers described above. In an embodiment, the insulating film 380 may surround an outer surface of at least the active layer 330 and extend in the direction in which the light-emitting element 300 extends. The insulating film 380 may protect the above members. For example, the insulating film 380 may surround side surfaces of the above members but may expose both ends (e.g., opposite ends) of the light-emitting element 300 in the longitudinal direction.

The insulating film 380 is illustrated as extending in the longitudinal direction of the light-emitting element 300 to cover from side surfaces of the first semiconductor layer 310 to side surfaces of the electrode layer 370. However, the present disclosure is not limited thereto, and the insulating film 380 may also cover outer surfaces of only some semiconductor layers as well as the active layer 330 or may cover only a part of an outer surface of the electrode layer 370 to partially expose the outer surface of the electrode layer 370. In addition, an upper surface of the insulating film 380 may be rounded in a cross-sectional view in an area adjacent to at least one end of the light-emitting element 300.

A thickness of the insulating film 380 may be in a range of, but is not limited to, about 10 nm to about 1.0 μm. In one embodiment, the thickness of the insulating film 380 may be about 40 nm.

The insulating film 380 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$). Therefore, the insulating film 380 may prevent or substantially prevent an electrical short circuit that may otherwise occur if the active layer 330 directly contacted an electrode through which an electrical signal is transmitted to the light-emitting element 300. In addition, the insulating film 380 may prevent or substantially prevent a reduction in luminous efficiency by protecting the outer surface of the light-emitting element 300 including the active layer 330.

In some embodiments, an outer surface of the insulating film 380 may be treated. When the display device 10 is manufactured, the light-emitting element 300 may be sprayed on electrodes in a state in which the light-emitting element 300 is dispersed in an ink, and may then be aligned. Here, the surface of the insulating film 380 may be hydrophobic or hydrophilic-treated so that the light-emitting element 300 remains separate from other adjacent light-emitting elements 300 in the ink and does not agglomerate with the other light-emitting elements 300.

A length h of the light-emitting element 300 may be in a range of about 1 to about 10 μm or about 2 to about 6 μm and, in some embodiments, may be in a range of about 3 to about 5 μm. In addition, a diameter of the light-emitting element 300 may be in a range of about 300 to about 700 nm, and an aspect ratio of the light-emitting element 300 may be in a range of about 1.2 to about 100. However, the present disclosure is not limited thereto, and a plurality of light-emitting elements 300 included in the display device 10 may have different diameters according to a difference in composition of the active layer 330. The diameter of the light-emitting element 300 may be about 500 nm.

The light-emitting element 300 according to an embodiment may include a protrusion pattern 370P formed on a surface of the electrode layer 370. The protrusion pattern 370P may be formed by partially etching an upper surface of the electrode layer 370 during a process of manufacturing the light-emitting element 300. Although the protrusion pattern 370P is shown in FIGS. 6 and 7 as being formed on the exposed upper surface of the electrode layer 370, the present disclosure is not limited thereto. In some embodiments, the protrusion pattern 370P may be formed by partially etching an upper surface of the second semiconductor layer 320, and the exposed upper surface of the electrode layer 370 may form a flat surface. An embodiment where the protrusion pattern 370P is formed on the upper surface of the electrode layer 370 will be described below as an example.

The protrusion pattern 370P may include a plurality of protrusions protruding from a part (or portion) of the upper surface of the electrode layer 370 and a depression other than (e.g., between) the protrusions. The depression is an area between the protrusions and may be an area depressed from the protrusions.

According to an embodiment, the protrusion pattern 370P may include an first protrusion, a second protrusion spaced apart from the first protrusion, and a depression formed between them. The protrusion pattern 370P may include one or more protrusions, and the protrusions may be spaced apart from each other. As illustrated in the drawings, the protrusion pattern 370P may include any one protrusion and other protrusions surrounding (e.g., extending around a periphery of) the protrusion, and a depression may be formed between them. However, the present disclosure is not limited thereto, and the protrusions of the protrusion pattern 370P may also be formed as a plurality of patterns spaced apart from each other. For example, any one protrusion may not surround another protrusion but may be spaced apart from the protrusion to face the protrusion.

In some embodiments, the protrusions of the protrusion pattern 370P may have curved outer surfaces and may have a protruding shape. As illustrated in FIG. 6, the protrusion pattern 370P may include a circular first protrusion which is located in the center of the upper surface of the electrode layer 370 and circular second and third protrusions which are spaced apart from the first protrusion to surround (e.g., to be concentric with) the first protrusion. However, the present disclosure is not limited thereto, and the protrusions of the protrusion pattern 370P may also extend in a direction or may have a mesh structure. In addition, the number of protrusions included in the protrusion pattern 370P of the light-emitting element 300 may vary.

According to an embodiment, the protrusions may have the same width and may be spaced apart at regular intervals. A width of the first protrusion may be equal to widths of the second protrusion and the third protrusion, and a distance between the first protrusion and the second protrusion and a distance between the second protrusion and the third protrusion may be equal to each other. The widths of the protrusions of the protrusion pattern 370P and the distance between the protrusions may vary according to the shape of a second pattern layer 1800 (see, e.g., FIG. 21) formed to etch the upper surface of the electrode layer 370 during the processing of the light-emitting element 300, as will be described in more detail later. For example, the number, width, and spacing of the protrusions included in the protrusion pattern 370P may vary according to the shape of the second pattern layer 1800. However, the protrusions do not necessarily have the same width and spacing. Only some of the protrusions may have the same width as another protrusions or may be spaced apart from another protrusion by the same distance between other protrusion.

In addition, according to an embodiment, the protrusion pattern 370P of the light-emitting element 300 may be formed on the upper surface of the electrode layer 370, and both end surfaces of the light-emitting element 300 may have different roughness. As will be described in more detail later, the protrusion pattern 370P may be formed by partially etching a surface of the semiconductor structure 3000. Accordingly, in the semiconductor structure 3000, a surface on which the protrusion pattern 370P is formed may form an uneven surface, but the other surface may have a flat surface. The protrusion pattern 370P may be formed on an end surface of the light-emitting element 300 formed by etching the semiconductor structure 3000, and the other end surface of the light-emitting element 300 may have a flat surface. In other words, both end surfaces of the light-emitting element 300 may have different roughness. In the specification, "roughness" indicates that the flatness of one surface is relatively different from that of the other surface. For example, the light-emitting element 300 according to an embodiment may include an end surface on which the protrusion pattern 370P is formed and the other end surface on which the protrusion pattern 370P is not formed. Because the flatness of the end surface is lower than that of the other end surface, the end surfaces may be understood to have different roughness. However, the present disclosure is not limited thereto, and it may be understood the same way in an embodiment different from the above as long as it is within a range that can be interpreted as having meaning of the term "roughness."

The light-emitting element 300 may include both end surfaces having different roughness and may be electrically connected to different electrodes 210 and 220, respectively. As illustrated in FIG. 4, according to an embodiment, an end surface of the light-emitting element 300 on which the protrusion pattern 370P is formed may be electrically connected to the first electrode 210, and the other end surface may be electrically connected to the second electrode 220. The first contact electrode 261 may contact the first electrode 210 and the protrusion pattern 370P of the light-emitting element 300, and the second contact electrode 262 may contact the second electrode 220 and the first semiconductor layer 310 of the light-emitting element 300. However, the present disclosure is not limited thereto. This described above, and thus, a repeated description thereof will be omitted.

The protrusion pattern 370P of the light-emitting element 300 may be formed by an etching process performed during the process of manufacturing the light-emitting element 300. The process of manufacturing the light-emitting element 300 includes a process of etching the semiconductor structure 3000 (see, e.g., FIG. 11) in a direction, and light-emitting characteristics of the manufactured light-emitting element 300 may vary according to position in the semiconductor structure 3000. The semiconductor structure 3000 manufactured by growing a semiconductor material may have a different composition according to position. Accordingly, light emitted from light-emitting elements 300 manufactured may have different emission values (or amounts) or different central wavelength bands. To manufacture light-emitting elements 300 having uniform light-emitting characteristics, a mark (e.g., a predetermined mark or indicator) may be used to identify the position at which each light-emitting element 300 having certain light-emitting characteristics is manufactured in the semiconductor structure 3000.

Because the light-emitting element 300 according to an embodiment includes the protrusion pattern 370P formed on a surface of the electrode layer 370, the position at which the light-emitting element 300 having certain light-emitting characteristics is formed in the semiconductor structure 3000 can be identified during the process of manufacturing the light-emitting element 300. Accordingly, the composition ratio of the semiconductor material can be controlled according to position in the semiconductor structure 3000, and light-emitting elements 300 having uniform light-emitting characteristics can be manufactured. The display device 10 according to an embodiment may include a plurality of light-emitting elements 300 having uniform light-emitting characteristics but different protrusion patterns 370P.

Figure 8:
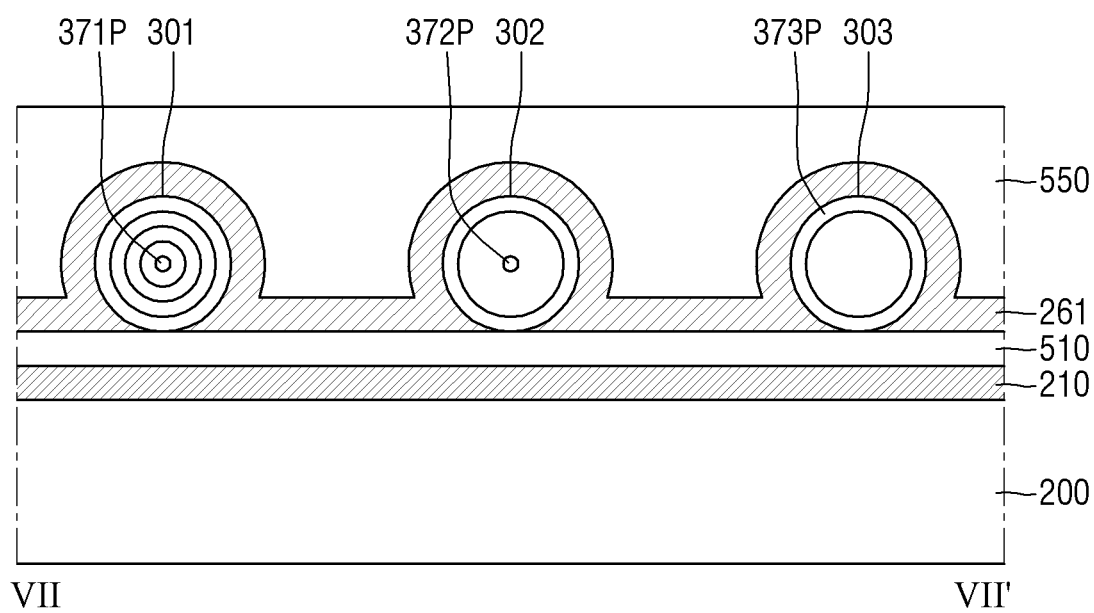
FIG. 8 is a cross-sectional view taken along the line VII-VII' of FIG. 3.

FIG. 8 is a cross-sectional view taken along the line VII-VII' in FIG. 3.

Referring to FIG. 8, the display device 10 according to an embodiment may include a first light-emitting element 301, a second light-emitting element 302, and a third light-emitting element 303 having different protrusion patterns 370P. The first light-emitting element 301, the second light-emitting element 302, and the third light-emitting element 303 may each have a protrusion pattern 370P including protrusions and depressions and may each include a different number of protrusions. The first light-emitting element 301 may include a first protrusion pattern 371P having three protrusions and two depressions formed between them. The second light-emitting element 302 may include a second protrusion pattern 372P having two protrusions and one depression. The third light-emitting element 303 may include a third protrusion pattern 373P having one protrusion and one depression. In FIG. 8, each of the first light-emitting element 301, the second light-emitting element 302, and the third light-emitting element 303 includes circular protrusions, and any one protrusion surrounds another protrusion. However, the present disclosure is not limited thereto, and the protrusions of the protrusion patterns 370P may have various shapes as will be described in more detail later.

The light-emitting elements 300 having different protrusion patterns 370P may be formed at different positions in the semiconductor structure 3000 during a manufacturing process. The position at which each light-emitting element 300 is formed in the semiconductor structure 3000 may be identified according to the shape of the protrusion pattern 370P formed in the light-emitting element 300, the number of protrusions, and the like. For example, based on light-emitting characteristics of the first light-emitting element 301 including the first protrusion pattern 371P, the second light-emitting element 302 and the third light-emitting element 303 may have different light-emitting characteristics from the first light-emitting element 301. To control their light-emitting characteristics, semiconductor compositions at positions where the second protrusion pattern 372P and the third protrusion pattern 373P of the second light-emitting element 302 and the third light-emitting element 303 are formed in the semiconductor structure 300 may be adjusted. By adjusting composition ratios in areas in which the second protrusion pattern 372P and the third protrusion pattern 373P are located based on an area in which the first protrusion pattern 371P of the semiconductor structure 3000 is located, the first light-emitting element 301, the second light-emitting element 302, and the third light-emitting element 303 may be made to have uniform or substantially uniform light-emitting characteristics. Accordingly, the display device 10 according to an embodiment may include the light-emitting elements 300 including different protrusion patterns 370P but having uniform or substantially uniform light-emitting characteristics, and each subpixel PXn may have uniform or substantially uniform light-emitting characteristics by including various light-emitting elements 300.

A process of manufacturing light-emitting elements 300 according to an embodiment will now be described.

Figure 9:
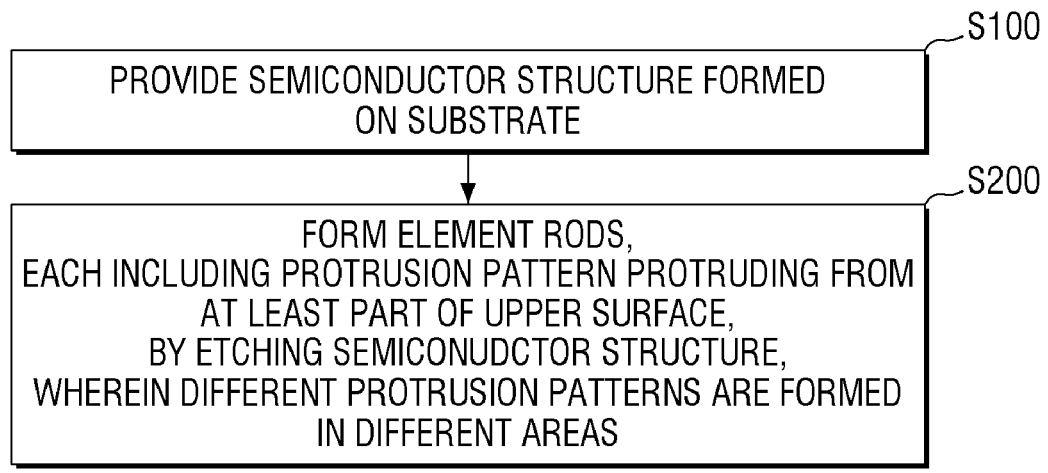
FIG. 9 is a flowchart illustrating a method for manufacturing light-emitting elements according to an embodiment.

FIG. 9 is a flowchart illustrating a method for manufacturing light-emitting elements according to an embodiment.

Referring to FIG. 9, the method for manufacturing the light-emitting elements 300 according to an embodiment may include providing a semiconductor structure 3000 formed on a substrate (operation S100) and forming a plurality of element rods ROD, each including a protrusion pattern 370P protruding from at least a part of an upper surface, by etching the semiconductor structure 3000, with different protrusion patterns 370P being formed in different areas WA defined in the semiconductor structure 3000 (operation S200).

As described above, the light-emitting elements 300 may be manufactured through a process of etching the semiconductor structure 3000. The method for manufacturing the light-emitting elements 300 according to an embodiment may include a process of forming the protrusion patterns 370P to indicate positions at which the light-emitting elements 300 are formed in the semiconductor structure 3000. The manufactured light-emitting elements 300 may include the protrusion patterns 370P described above, and positions having different light-emitting characteristics in the semiconductor structure 3000 can be identified by using the protrusions 370P. The method for manufacturing the light-emitting elements 300 will now be described in more detail with further reference to other drawings.

FIGS. 10 through 25 are schematic views illustrating a process of manufacturing light-emitting elements according to an embodiment.

Figure 10:
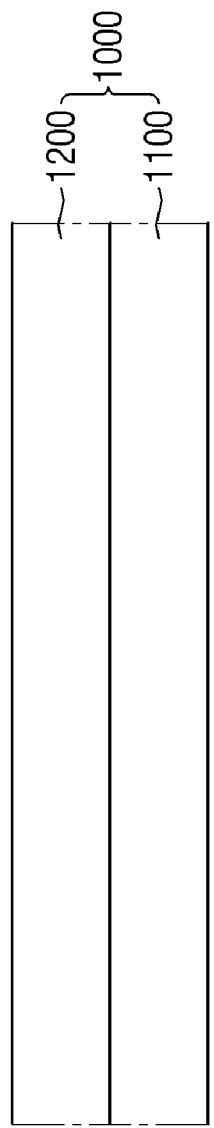
FIGS. 10 through 25 are schematic views illustrating a process of manufacturing light-emitting elements according to an embodiment.

First, referring to FIG. 10, a lower substrate 1000 which includes a base substrate 1100 and a buffer material layer 1200 formed on the base substrate 1100 is prepared. The base substrate 1100 may be (or may include) a sapphire substrate ($Al_2O_3$) or a transparent substrate, such as glass. However, the present disclosure is not limited thereto, and the base substrate 1100 may also be a conductive substrate, such as GaN, SiC, ZnO, Si, GaP, or GaAs. An embodiment in which the base substrate 1100 is a sapphire substrate ($Al_2O_3$) will be described below as an example. A thickness of the base substrate 1100 is not particularly limited but may be, for example, in a range of about 400 to about 1500 μm.

A plurality of semiconductor layers are formed on the base substrate 1100. The semiconductor layers grown by an epitaxial method may be formed by growing seed crystals. The method for forming the semiconductor layers may be electron beam deposition, physical vapor deposition (PVD), chemical vapor deposition (CVD), plasma laser deposition (PLD), dual-type thermal evaporation, sputtering, or metal organic chemical vapor deposition (MOCVD). In one embodiment, the method for forming the semiconductor layers may be MOCVD, but the present disclosure is not limited thereto.

A precursor material for forming the semiconductor layers is not particularly limited within a range of suitable materials that can be generally selected to form a target material. For example, the precursor material may include a metal precursor including an alkyl group, such as a methyl group or an ethyl group. For example, the metal precursor may be, but is not limited to, a compound such as trimethyl gallium (Ga(CH$_3$)$_3$), trimethyl aluminum (Al(CH$_3$)$_3$), or triethyl phosphate (C$_2$H$_5$)$_3$PO$_4$. The method or process conditions for forming the semiconductor layers will not be described below, but the order of the method for manufacturing the light-emitting elements 300 and the stacked structure of each light-emitting element 300 will be described in detail.

The buffer material layer 1200 is formed on the base substrate 1100. Although the buffer material layer 1200 is illustrated as a single layer in the drawings, the present disclosure is not limited thereto, and a plurality of layers may also be formed. The buffer material layer 1200 may be disposed to reduce a difference in lattice constant between a first semiconductor 3100 and the base substrate 1100.

For example, the buffer material layer 1200 may include an undoped semiconductor and may include substantially the same material as the first semiconductor 3100 but may be a material not doped with an n type or a p type. In an embodiment, the buffer material layer 1200 may be, but is not limited to, at least any one of undoped InAlGaN, GaN, AlGaN, InGaN, AlN, and InN. In addition, the buffer material layer 1200 may be omitted depending on the base substrate 1100. An embodiment in which the buffer material layer 1200 including an undoped semiconductor is formed on the base substrate 1100 will be described as an example.

Figure 11:
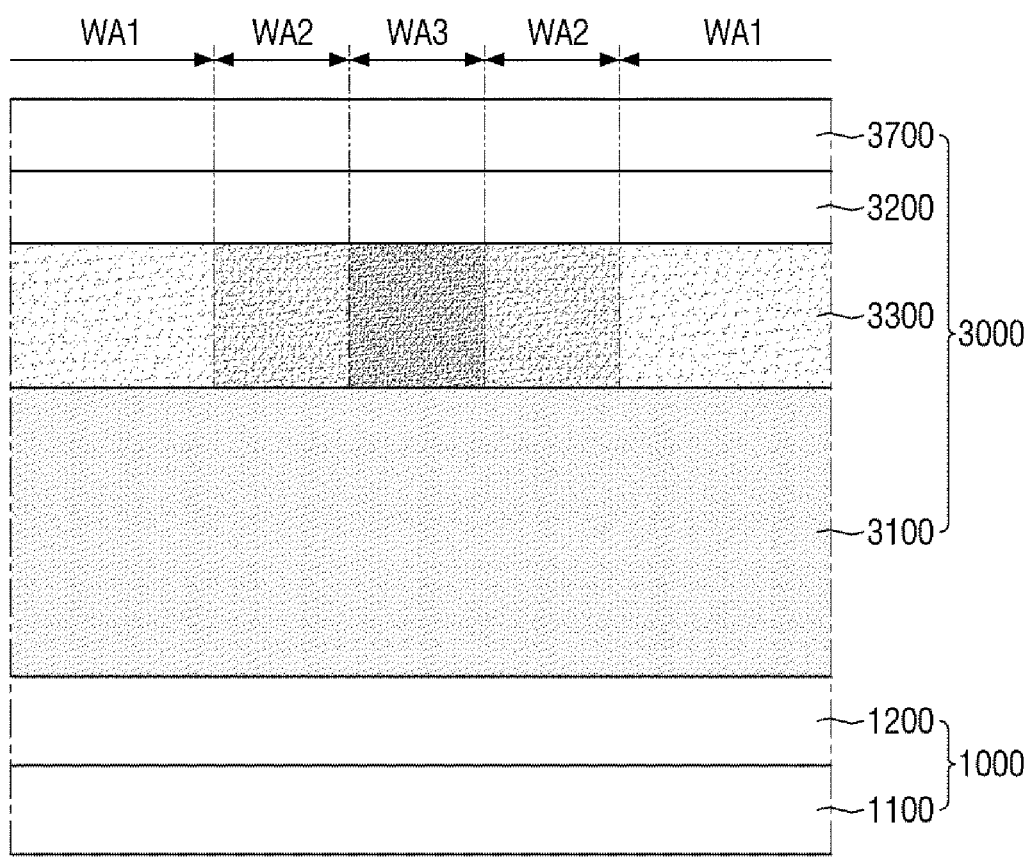
Figure 12:
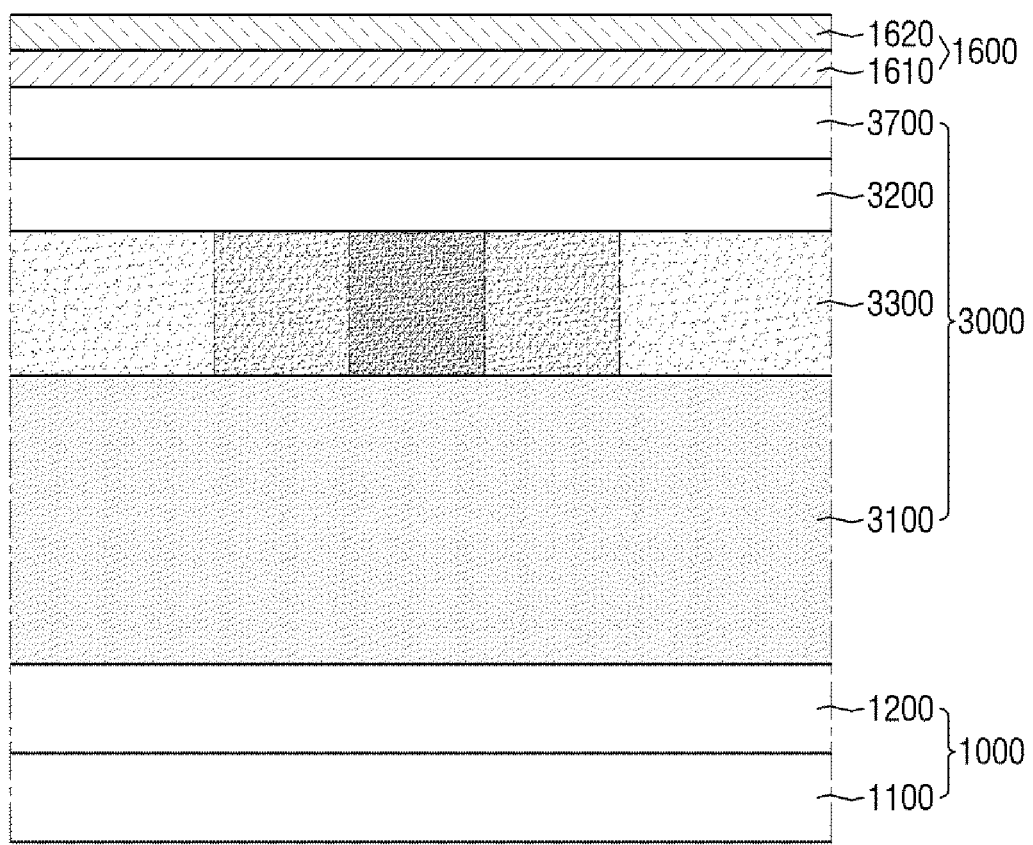
Figure 13:
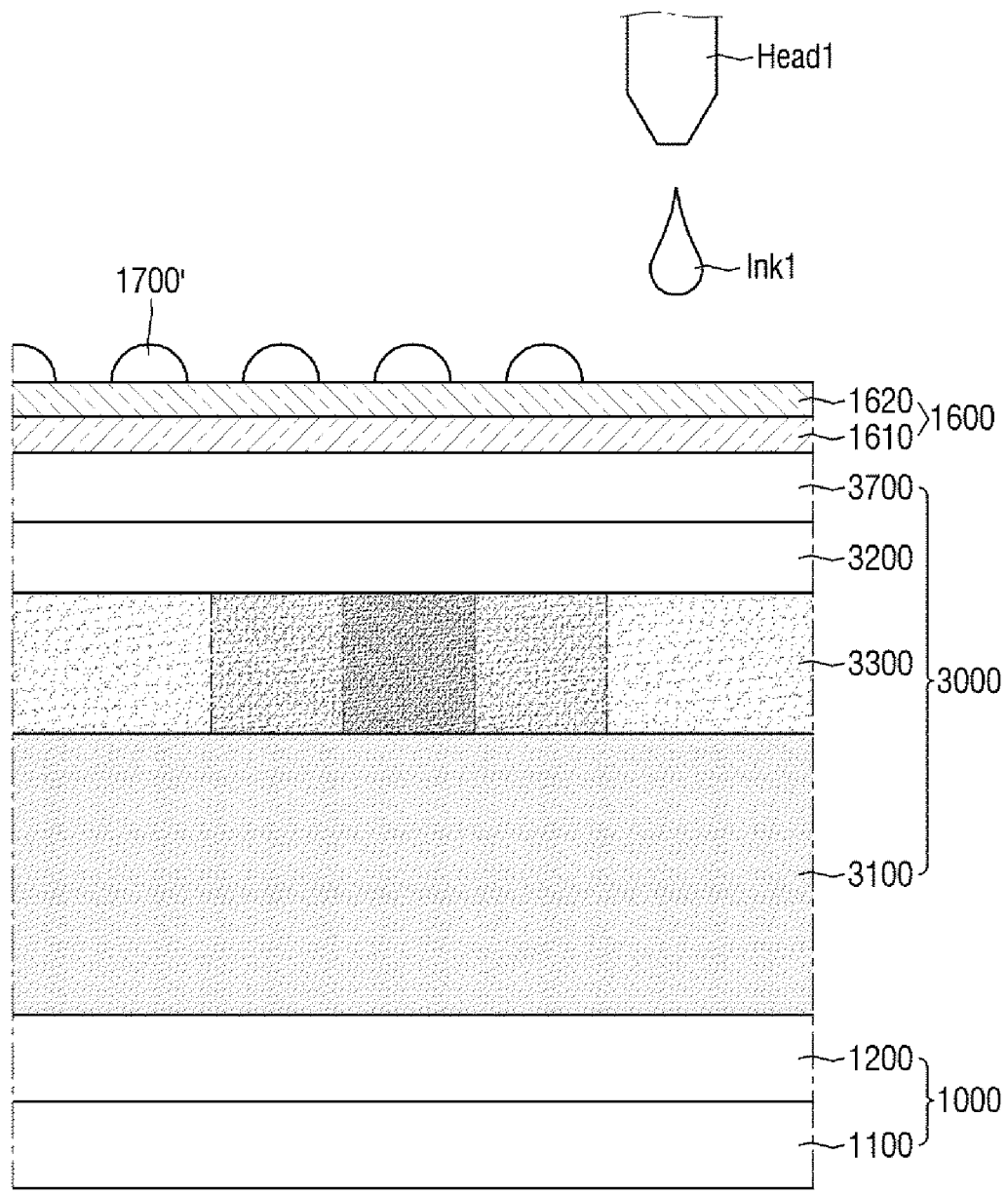
Figure 14:
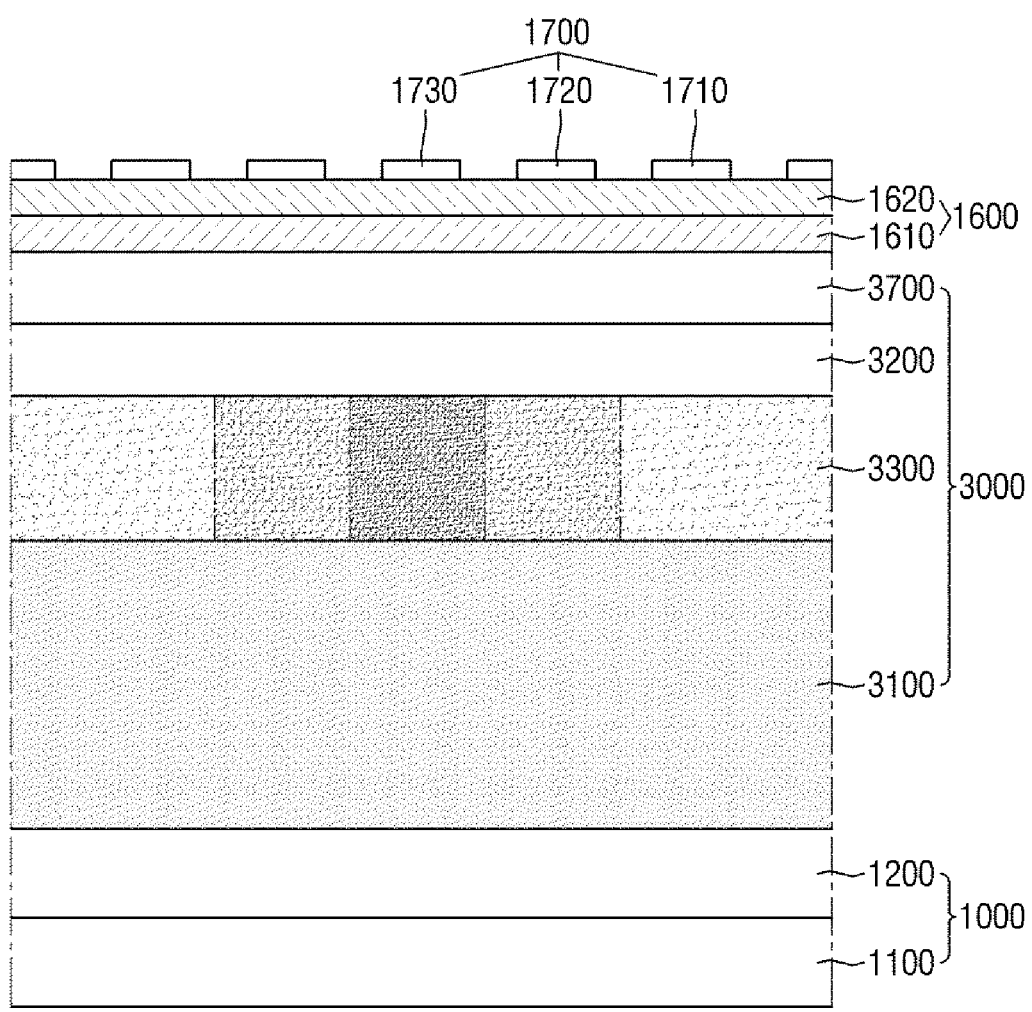

Next, referring to FIG. 11, a semiconductor structure 3000 is formed on the lower substrate 1000. The semiconductor structure 3000 may include the first semiconductor 3100, an active layer 3300, a second semiconductor 3200, and an electrode material layer 3700. A plurality of material layers included in the semiconductor structure 3000 may be formed by performing a conventional process as described above. A plurality of layers included in the semiconductor structure 3000 may correspond to a plurality of layers of each light-emitting element 300 according to an embodiment, respectively. For example, the layers may include the same materials as a first semiconductor layer 310, an active layer 330, a second semiconductor layer 320, and an electrode layer 370 of each light-emitting element 300, respectively.

As illustrated in FIG. 11, the active layer 3300 of the semiconductor structure 3000 may include areas WA having different light-emitting characteristics at different positions. The areas WA may be defined at different positions in the semiconductor structure 3000.

Depending on the performance or quality of a manufacturing device, the semiconductor structure 3000 formed on the lower substrate 1000 may have an area having a partially non-uniform composition according to a spatial position. For example, when the semiconductor structure 3000 is formed through MOCVD, a precursor material provided on the lower substrate 1000 may be in a gas phase. The precursor material in the gas phase may be provided on the lower substrate 1000 in a non-uniform distribution. Accordingly, the semiconductor structure 3000 formed by depositing precursor materials may have a non-uniform composition according to a spatial position.

Here, when the active layer 3300 of the semiconductor structure 3000 has a different composition according to a spatial position, the respective active layers 330 of a plurality of light-emitting elements 300 manufactured may have different compositions. The light-emitting elements 300 manufactured at different positions in the semiconductor structure 3000 may have different light-emitting characteristics, for example, different light emission amounts and central wavelength bands of emitted light. The semiconductor structure 3000 may include a first area WA1, a second area WA2, and a third area WA3. In some embodiments, the first area WA1, the second area WA2, and the third area WA3 may be distinguished according to light-emitting characteristics of the active layer 3300 of the semiconductor structure 3000. The second area WA2 and the third WA3 may have light emission values (or amounts) or central wavelength bands of light different from those of the first area WA1. However, the present disclosure is not limited thereto, and the first area WA1, the second area WA2, and the third area WA3 of the semiconductor structure 3000 may also be arbitrarily defined areas.

The method for manufacturing the light-emitting elements 300 according to an embodiment may include forming a different protrusion pattern 370P on an upper surface of each area WA. Therefore, the position at which each light-emitting element 300 is formed in the semiconductor structure 3000 can be easily identified. When light-emitting characteristics of a light-emitting element 300 having a specific protrusion pattern 370P are different from those of other light-emitting elements 300, the composition of the active layer 3300 in an area WA in which the protrusion pattern 370P is formed in the semiconductor structure 3000 may be adjusted.

The method for manufacturing the light-emitting elements 300 according to an embodiment may include forming a first pattern layer 1700 for forming element rods ROD and forming a second pattern layer 1800 for forming the protrusion patterns 370P. The semiconductor structure 3000 etched along mask patterns of the first pattern layer 1700 may form semiconductor crystals 3000', each including the first semiconductor layer 310, the active layer 330, the second semiconductor layer 320, etc. The semiconductor structure 3000 etched along mask patterns of the second pattern layer 1800 may form the protrusion patterns 370P.

A method for forming the semiconductor crystals 3000' includes forming an etch mask layer 1600 and the first pattern layer 1700 on the semiconductor structure 3000 and forming the semiconductor crystals 3000' by etching the semiconductor structure 3000 in a direction perpendicular to the lower substrate 1000.

First, as illustrated in FIGS. 12 through 15, the etch mask layer 1600 and the first pattern layer 1700 are formed on the semiconductor structure 3000. The etch mask layer 1600 is formed on the electrode material layer 3700, and the first pattern layer 1700 is formed on the etch mask layer 1600. The etch mask layer 1600 may act as a mask for successively etching the layers of the semiconductor structure 3000. The etch mask layer 1600 may include a first etch mask layer 1610 including an insulating material and a second etch mask layer 1620 including a metal.

The first etch mask layer 1610 may include oxide or nitride as an insulating material. The insulating material may be, for example, silicon oxide (SiO$_x$), silicon nitride (SiN$_x$), or silicon oxynitride (SiO$_x$N$_y$). A thickness of the first etch mask layer 1610 may be in a range of, but is not limited to, about 0.5 to about 1.5 μm.

The second etch mask layer 1620 is disposed on the first etch mask layer 1620. For example, the second etch mask layer 1620 may be a hard mask layer. The second etch mask layer 1620 may include a material that acts as a mask for successive etching of the semiconductor structure 3000 and may include, for example, a metal, such as chromium (Cr).

A thickness of the second etch mask layer 1620 may be in a range of, but is not limited to, about 30 to about 150 nm.

The first pattern layer 1700 may be disposed on the etch mask layer 1600. The first pattern layer 1700 may include first through third mask patterns 1710, 1720, and 1730 spaced apart from each other to act as a mask for successive etching of the semiconductor structure 3000. The first pattern layer 1700 may include a polymer, polystyrene spheres, silica spheres, or the like but is not limited to a particular material as long as it is a suitable material that can form patterns.

For example, when the first pattern layer 1700 includes a polymer, a conventional method for forming patterns using the polymer may be used. For example, the first pattern layer 1700 including the polymer may be formed by using a method such as photolithography, e-beam lithography, or nano-imprint lithography.

In an embodiment, the first pattern layer 1700 may be formed by nano-imprint lithography. As illustrated in the drawings, the forming of the first pattern layer 1700 may include spraying (e.g., depositing) a first resin ink Ink1 on the etch mask layer 1600 by using a first head Head1 and forming the first through third mask patterns 1710, 1720, and 1730 by curing a first resin 1700'. The mask patterns of the first pattern layer 1700 may include a nano-imprint resin. The resin may include, but is not limited to, a fluorinated monomer, an acrylate monomer, dipentaerythritol hexaacrylate, dipropylene glycol diacrylate, poly(ethylene glycol) phenyl ether acrylate, butylated hydroxy toluene (BHT), or 1-hydroxy-cyclohexylphenylketone (also known as Irgacure 184).

The first pattern layer 1700 may include the first mask patterns 1710 formed in the first area WA1, the second mask patterns 1720 formed in the second area WA2, and the third mask pattern 1730 formed in the third area WA3. The first mask patterns 1710, the second mask patterns 1720, and the third mask pattern 1730 may be spaced apart from each other.

Figure 15:
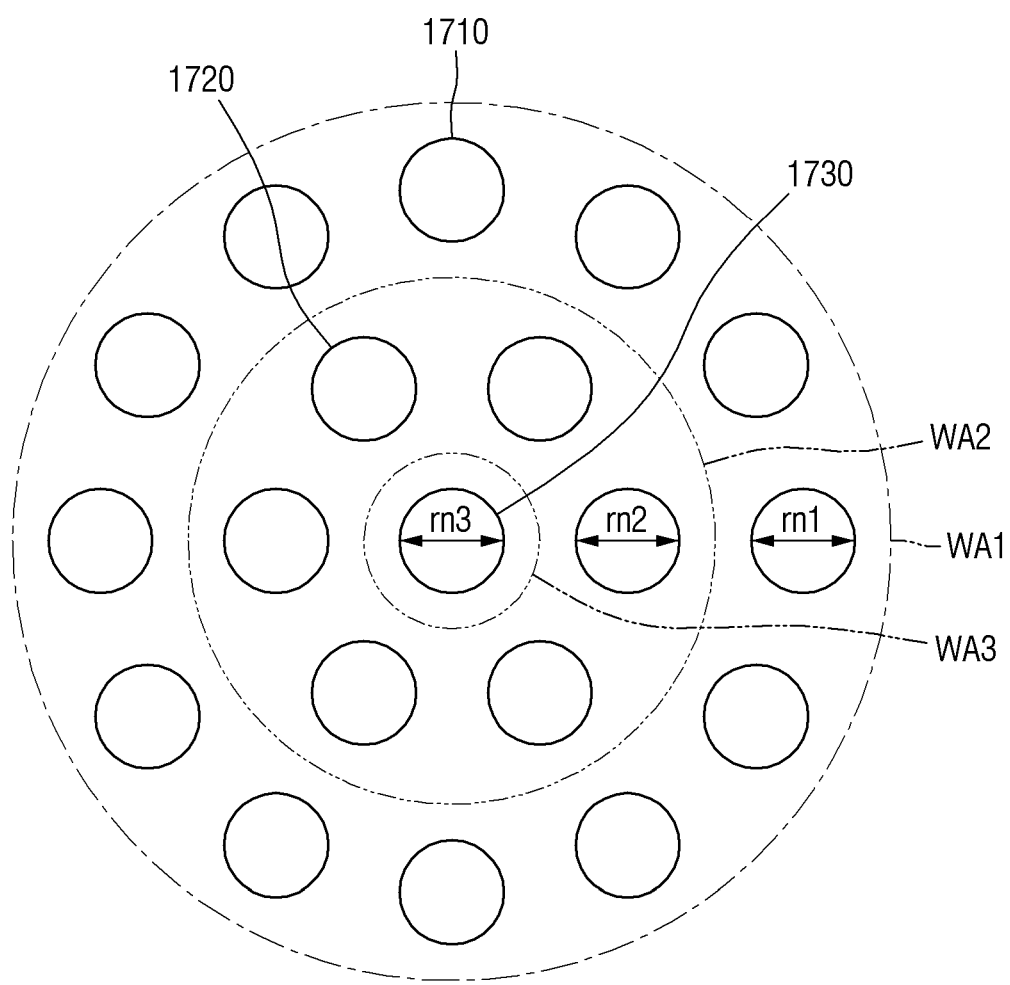

FIG. 15 is a plan view of the semiconductor structure 3000 on which the first pattern layer 1700 is formed viewed from above. As illustrated in FIG. 15, the semiconductor structure 3000 may include the first area WA1, the second area WA2, and the third area WA3 in which the active layer 3300 having different light-emitting characteristics is located. In the drawing, the first area WA1 surrounds (e.g., extends around a periphery of) the second area WA2, and the second area WA2 surrounds (e.g., extends around a periphery of) the third area WA3. However, the present disclosure is not limited thereto.

The first mask patterns 1710, the second mask patterns 1720, and the third mask pattern 1730 of the first pattern layer 1700 may be spaced apart from each other and may be formed in the first area WA1, the second area WA2, and the third area WA3, respectively. A gap between them and their shapes may vary according to the shapes of the light-emitting elements 300 to be manufactured. In some embodiments, the first mask patterns 1710, the second mask patterns 1720, and the third mask pattern 1730 may have the same diameter or width. For example, a first width m1 of the first mask patterns 1710 may be equal to a second width m2 of the second mask patterns 1720 and a third width m3 of the third mask pattern 1730. In a subsequent process, the semiconductor structure 3000 is etched along the gaps between the first through third mask patterns 1710, 1720, and 1730 of the first pattern layer 1700. Therefore, the shapes of the first through third mask patterns 1710, 1720, and 1730 may be substantially similar to the cross-sectional shapes of the light-emitting elements 300. Because the first through third mask patterns 1710, 1720, and 1730 have the same diameter or width, the light-emitting elements 300 may have the same width.

Figure 16:
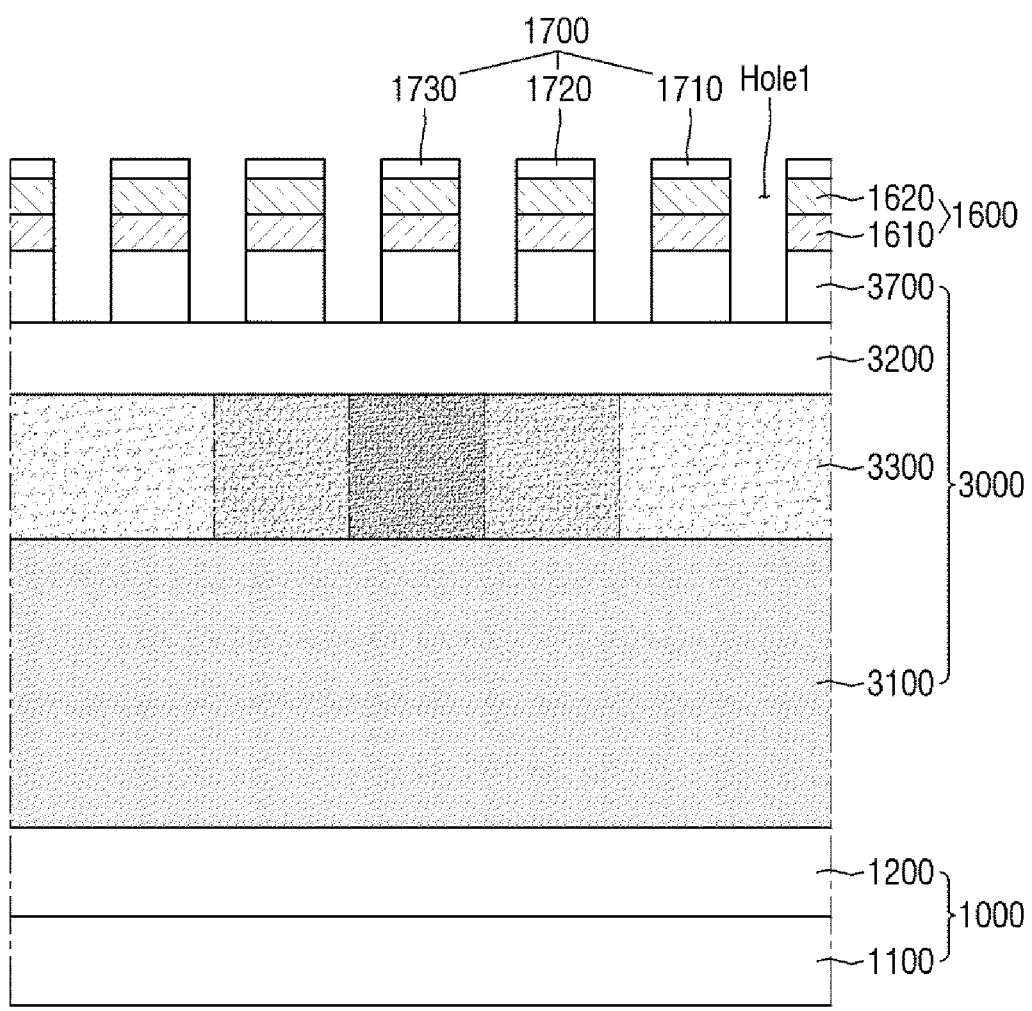
Figure 17:
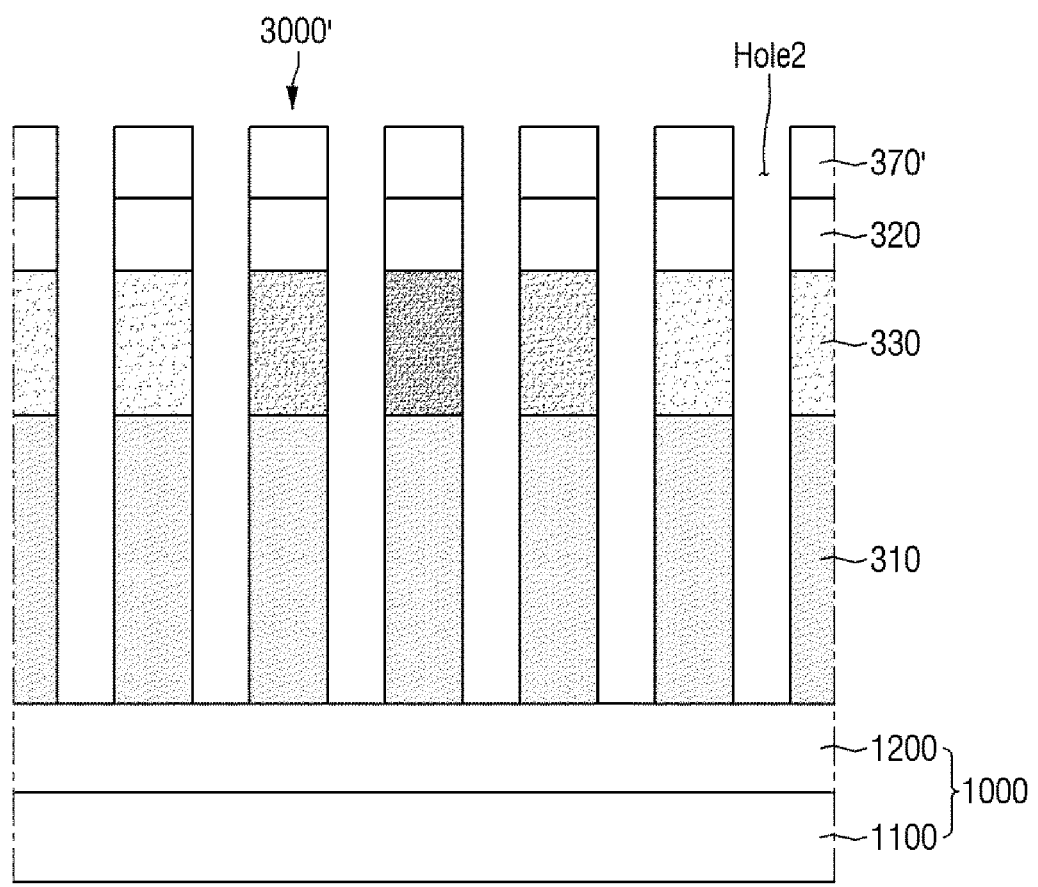

Next, referring to FIGS. 16 and 17, the semiconductor structure 3000 is etched along the first pattern layer 1700 to form the semiconductor crystals 3000'. The forming of the semiconductor crystals 3000' may include a first etching operation for forming first etch holes (e.g., first etch grooves) Hole1 by etching the etch mask layer 1600 and the electrode material layer 3700 in the direction perpendicular to the lower substrate 1000 in areas between the first through third mask patterns 1710, 1720, and 1730 of the first pattern layer 1700, a second etching operation for forming second etch holes (e.g., second etch grooves) Hole2 by etching from the second semiconductor 3200 to the first semiconductor 3100 along the first etch holes Hole1, and an operation of removing the first pattern layer 1700 and the etch mask layer 1600.

The process of etching the semiconductor structure 3000 may be performed by using a conventional method. For example, the etching process may be dry etching, wet etching, reactive ion etching (RIE), inductively coupled plasma reactive ion etching (ICP-RIE), or the like. Dry etching may be suitable for vertical etching because anisotropic etching is possible. When the above etching methods are used, an etchant may be, but is not limited to, $Cl_2$ or $O_2$.

In some embodiments, the semiconductor structure 3000 may be etched by using a combination of dry etching and wet etching. For example, etching in a depth direction may be performed by using dry etching. Then, wet etching, which is isotropic etching, may be performed so that etched sidewalls lie in a plane perpendicular to the surface.

The first etching operation for forming the first etch holes Hole1 by etching the etch mask layer 1600 and the electrode material layer 3700 along the areas between the first through third mask patterns 1710, 1720, and 1730 of the first pattern layer 1700 is performed. The first etch holes Hole1 may be formed by removing the first pattern layer 1700, the etch mask layer 1600, and the electrode material layer 3700 and may partially expose the second semiconductor 3200. Next, the second etching operation for forming the second etch holes Hole2 by etching from the second semiconductor 3200 to the first semiconductor 3100 along (e.g., within) the first etch holes Hole1 is performed. Although the first etching operation and the second etching operation are illustrated in the drawings as being performed in separate processes, the present disclosure is not limited thereto. The first etching operation and the second etching operation may also be performed successively in one process. Each of the semiconductor crystals 3000' formed by the etching of the semiconductor structure 3000 may include the first semiconductor layer 310, the active layer 330, the second semiconductor layer 320, and the electrode layer 370, such as in each light-emitting element 300 according to an embodiment described above.

Next, the semiconductor crystals 3000' are formed by removing the etch mask layer 1600 and the first pattern layer 1700. The removing of the etch mask layer 1600 or the first pattern layer 1700 may be performed by a conventional process. For example, the process may be, but is not limited to, RIE, or ICP-RIE.

Next, an insulating film 380 is formed to partially surround an outer surface of each of the semiconductor crystals 3000'.

Figure 18:
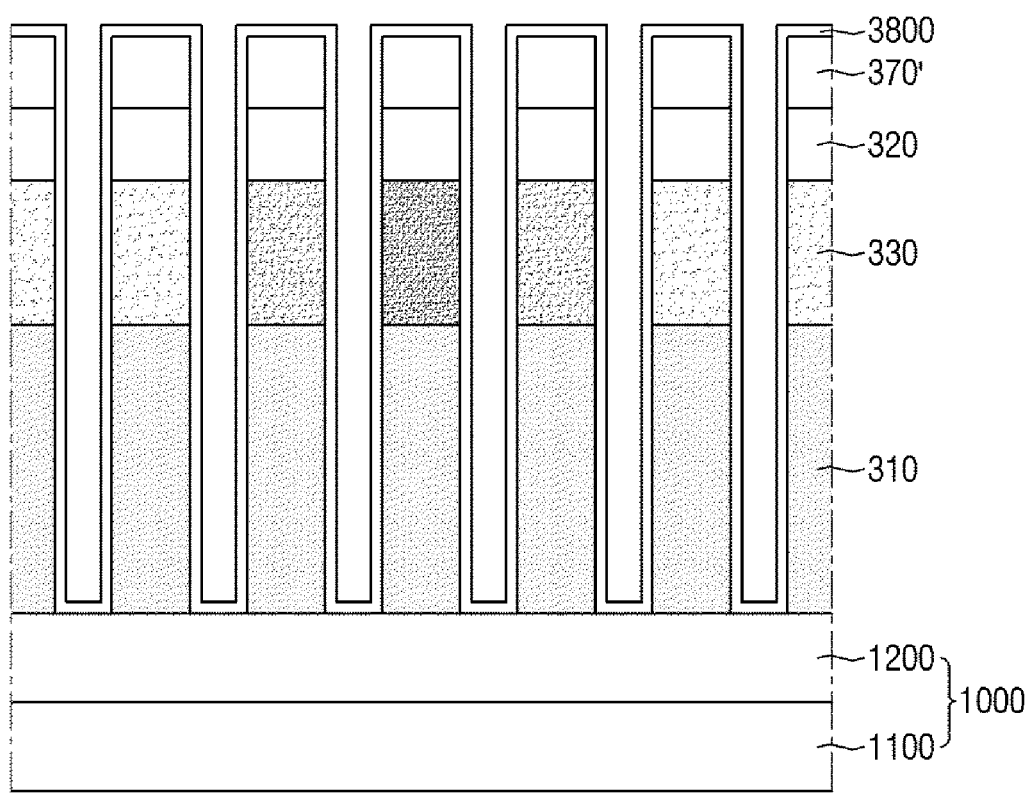
Figure 19:
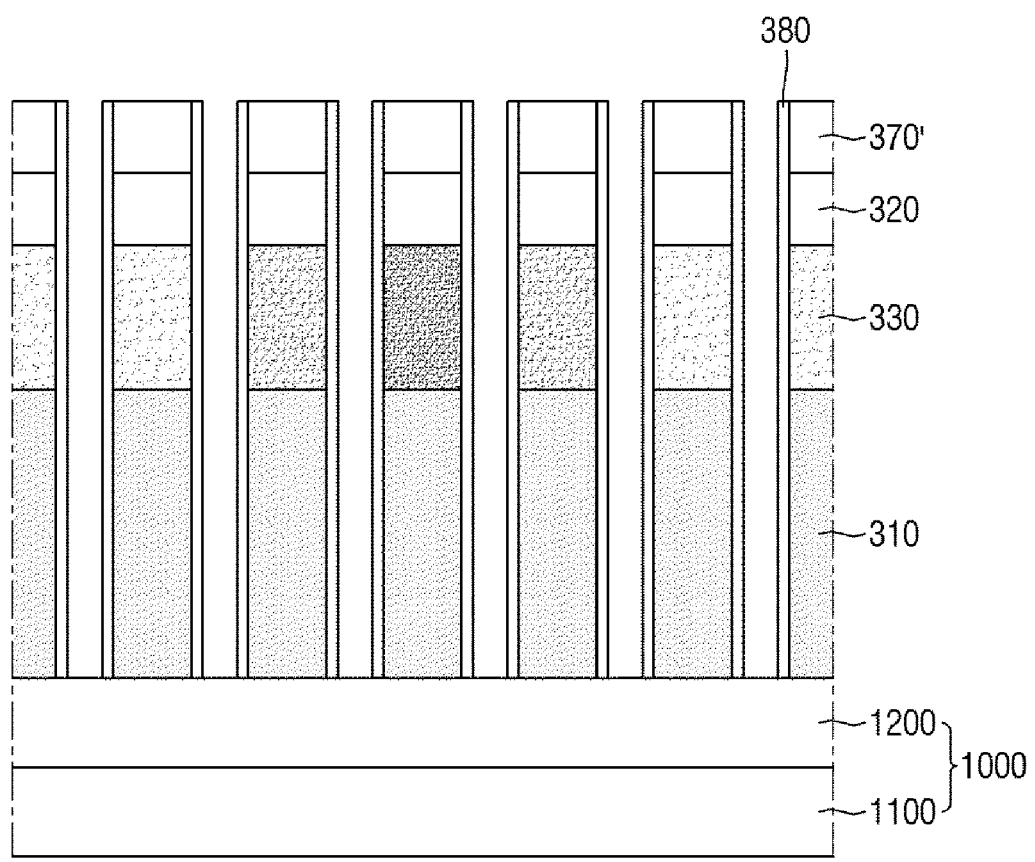

Referring to FIGS. 18 and 19, the insulating films 380 may be formed by forming an insulating film 3800 surrounding the outer surfaces of the semiconductor crystals 3000' and then partially removing the insulating film 3800 to expose upper surfaces of the electrode layers 370. Because the insulating film 3800 is formed on the outer surfaces of the semiconductor crystals 3000' including the electrode layers 370, the insulating films 380 of the light-emitting elements 300 may also be formed on outer surfaces of the electrode layers 370.

The insulating film 3800 is an insulating material formed on the outer surfaces of the semiconductor crystals 3000' and may be formed by coating or immersing an insulating material on the outer surfaces of the vertically etched semiconductor crystals 3000'. However, the present disclosure is not limited thereto. For example, the insulating film 3800 may be formed by atomic layer deposition (ALD).

The insulating film 3800 may be formed not only on side surfaces and upper surfaces of the semiconductor crystals 3000' but also on the lower substrate 1000 exposed between the semiconductor crystals 3000', which are spaced apart from each other. The insulating film 3800 may be partially removed to expose the upper surfaces of the electrode layers 370, thereby forming the insulating films 380. The process of partially removing the insulating film 3800 may be achieved by a process such as dry etching, which is anisotropic etching, or etch-back. In the drawings, an upper surface of the insulating film 3800 is removed to expose the electrode layers 370, and upper surfaces of the insulating films 380 are flat. However, the present disclosure is not limited thereto. In some embodiments, an outer surface of each insulating film 380 may be partially curved in an area around the electrode layer 370. Because not only the upper surface but also side surfaces of the insulating film 3800 are partially removed in the process of partially removing the insulating film 3800, each insulating film 380 surrounding a plurality of layers may be formed such that an end surface thereof is partially etched. For example, when the upper surface of the insulating film 3800 is removed, the outer surface of the insulating film 380 adjacent to the electrode layer 370 in each light-emitting element 300 may be partially removed.

Next, the second pattern layer 1800 is formed on the semiconductor crystals 3000' on which the insulating films 380 are formed, and the element rods ROD, each including the protrusion pattern 370P protruding from at least a part of an upper surface thereof, are formed. According to an embodiment, the forming of the element rods ROD may include forming the second pattern layer 1800 including fourth through sixth mask patterns 1810, 1820, and 1830 spaced apart from each other and forming the protrusion patterns 370P by partially etching the upper surfaces of the semiconductor crystals 3000' along an area in which the fourth through sixth mask patterns 1810, 1820, and 1830 are spaced apart from each other.

Figure 20:
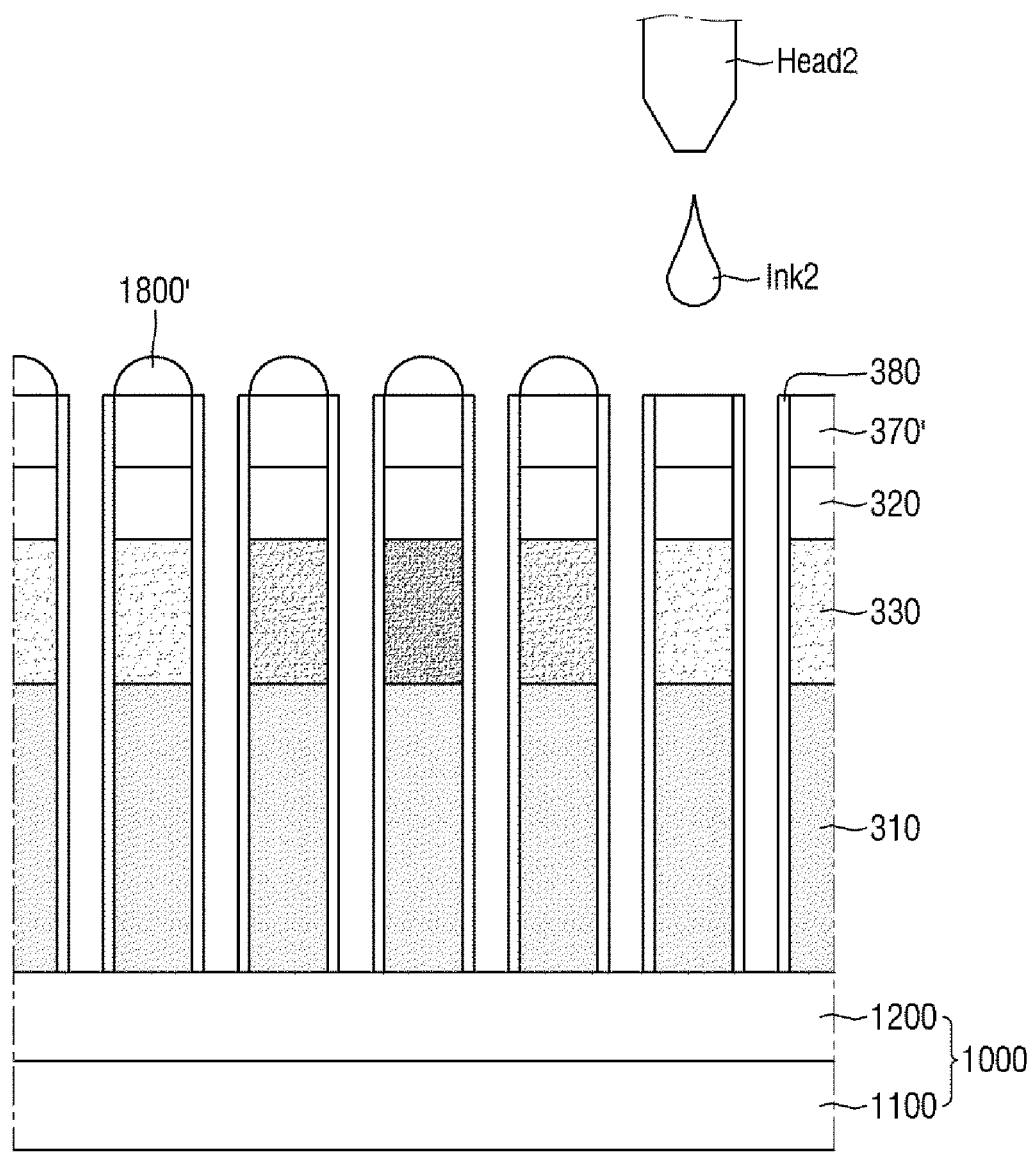
Figure 21:
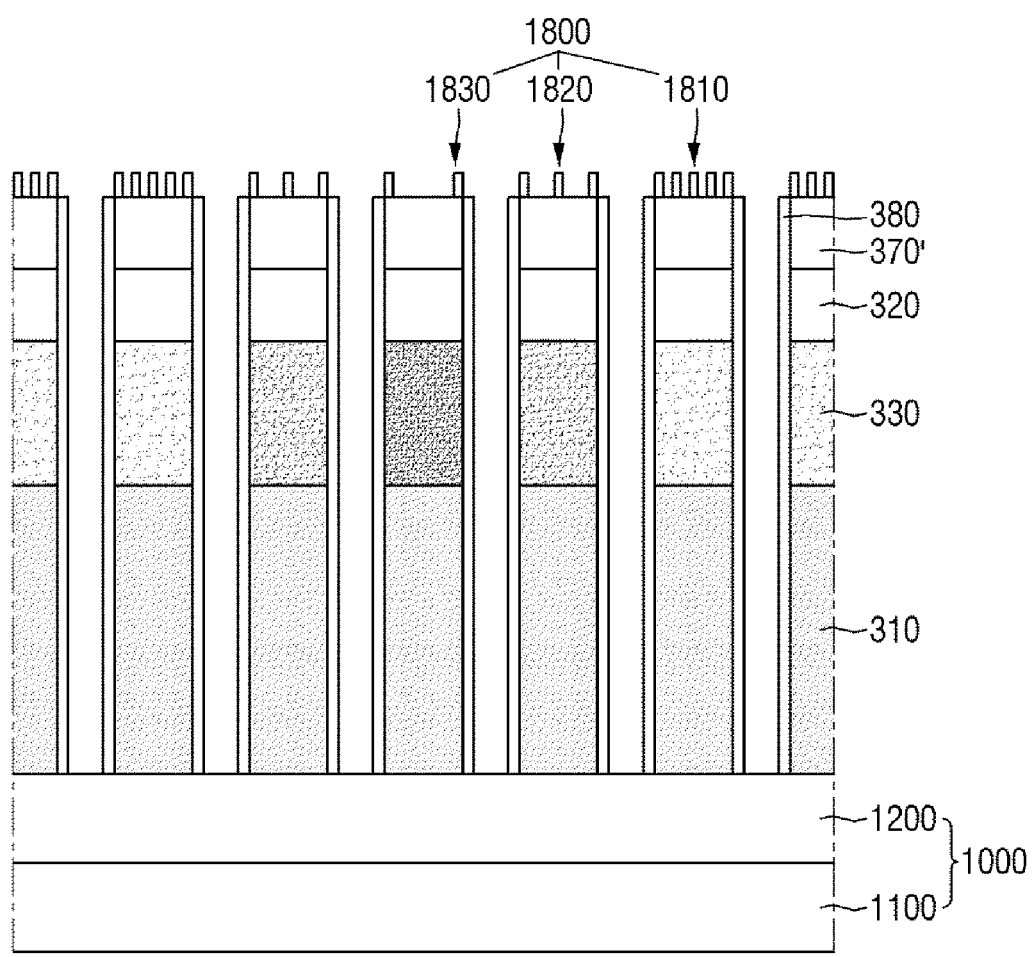

As illustrated in FIGS. 20 and 21, the second pattern layer 1800 is formed on the semiconductor crystals 3000' on which the insulating films 380 are formed. The second pattern layer 1800 may include the fourth through sixth mask patterns 1810, 1820, and 1830 spaced apart from each other, that is, the fourth mask patterns 1810, the fifth mask patterns 1820, and the sixth mask pattern 1830. The fourth through sixth mask patterns 1810, 1820, and 1830 of the second pattern layer 1800 may be formed of substantially the same material as the first through third mask patterns 1710, 1720, and 1730 of the first pattern layer 1700 through the same or substantially similar process. As illustrated in the drawings, the forming of the second pattern layer 1800 may include spraying (e.g., depositing) a second resin ink Ink2 on the semiconductor crystals 3000' by using a second head Head2 and forming the fourth through sixth mask patterns 1810, 1820, and 1830 by curing a second resin 1800'. This is the same as described above, and thus, a repeated description thereof will be omitted.

The second pattern layer 1800 may include the fourth mask patterns 1810 formed on semiconductor crystals 3000' at a position overlapping the first area WA1, the fifth mask patterns 1820 formed on semiconductor crystals 3000' at a position overlapping the second area WA2, and the sixth mask pattern 1830 formed on a semiconductor crystal 3000' at a position overlapping the third area WA3. The fourth mask patterns 1810, the fifth mask patterns 1820, and the sixth mask pattern 1830 may be spaced apart from each other.

Figure 22:
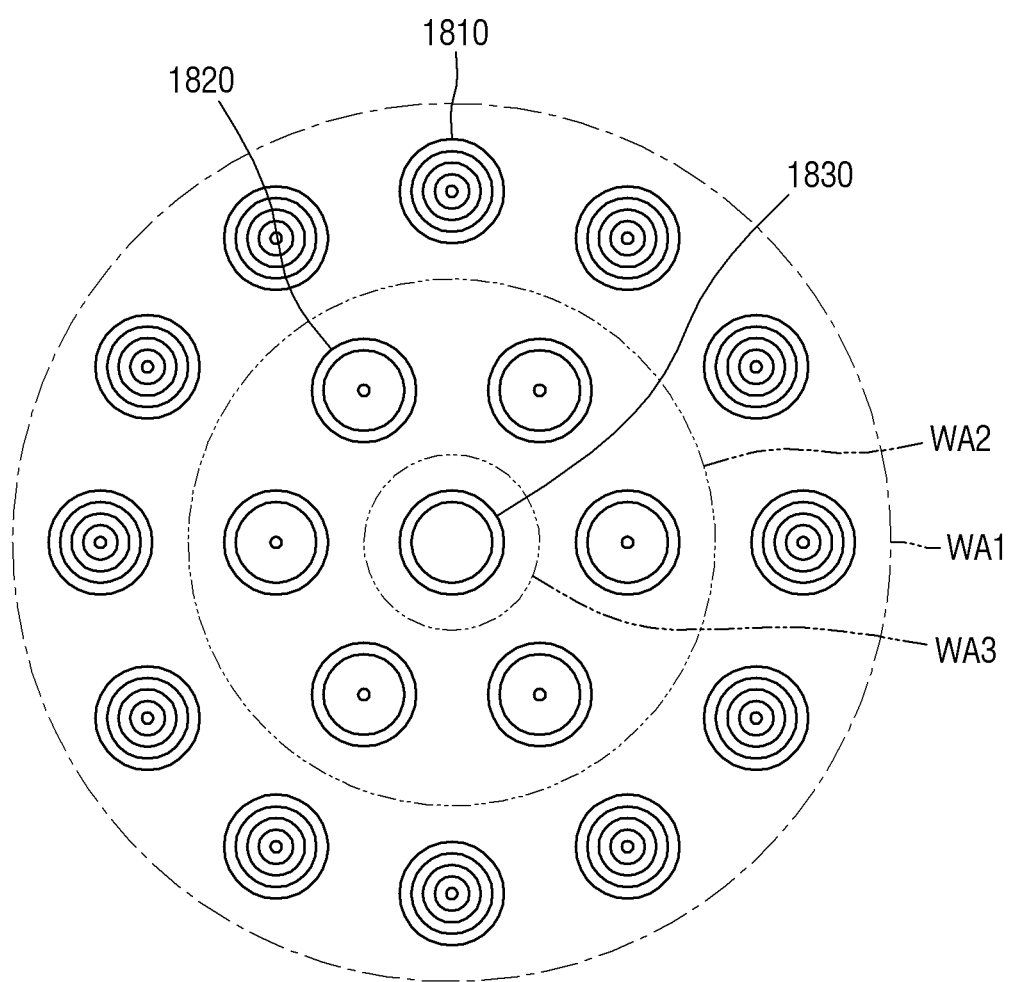

FIG. 22 is a plan view of the semiconductor crystals 3000' on which the second pattern layer 1800 is formed viewed from above. Referring to FIGS. 21 and 22, the second pattern layer 1800 according to an embodiment may include the fourth through sixth mask patterns 1810, 1820, and 1830, which are different from each other. The fourth mask patterns 1810, the fifth mask patterns 1820, and the sixth mask pattern 1830 may each include a plurality of pattern parts and may each include a different number of pattern parts. The pattern parts may be spaced apart from each other to form each of the fourth through sixth mask patterns 1810, 1820, and 1830. In the drawing, the pattern parts of each of the fourth through sixth mask patterns 1810, 1820, and 1830 are formed such that any one pattern part surrounds (e.g., extends around) another pattern part. However, the present disclosure is not limited thereto. The shapes of the fourth through sixth mask patterns 1810, 1820, and 1830 may vary according to the shapes of the protrusion patterns 370P to be formed on the light-emitting elements 300.

Each of the fourth mask patterns 1810 formed on semiconductor crystals 3000' at a position overlapping the first area WA1 may include three pattern parts. Each of the fifth mask patterns 1820 formed on semiconductor crystals 3000' at a position overlapping the second area WA2 may include two pattern parts, and the sixth mask pattern 1830 formed on a semiconductor crystal 3000' at a position overlapping the third area WA3 may include one pattern part.

Figure 23:
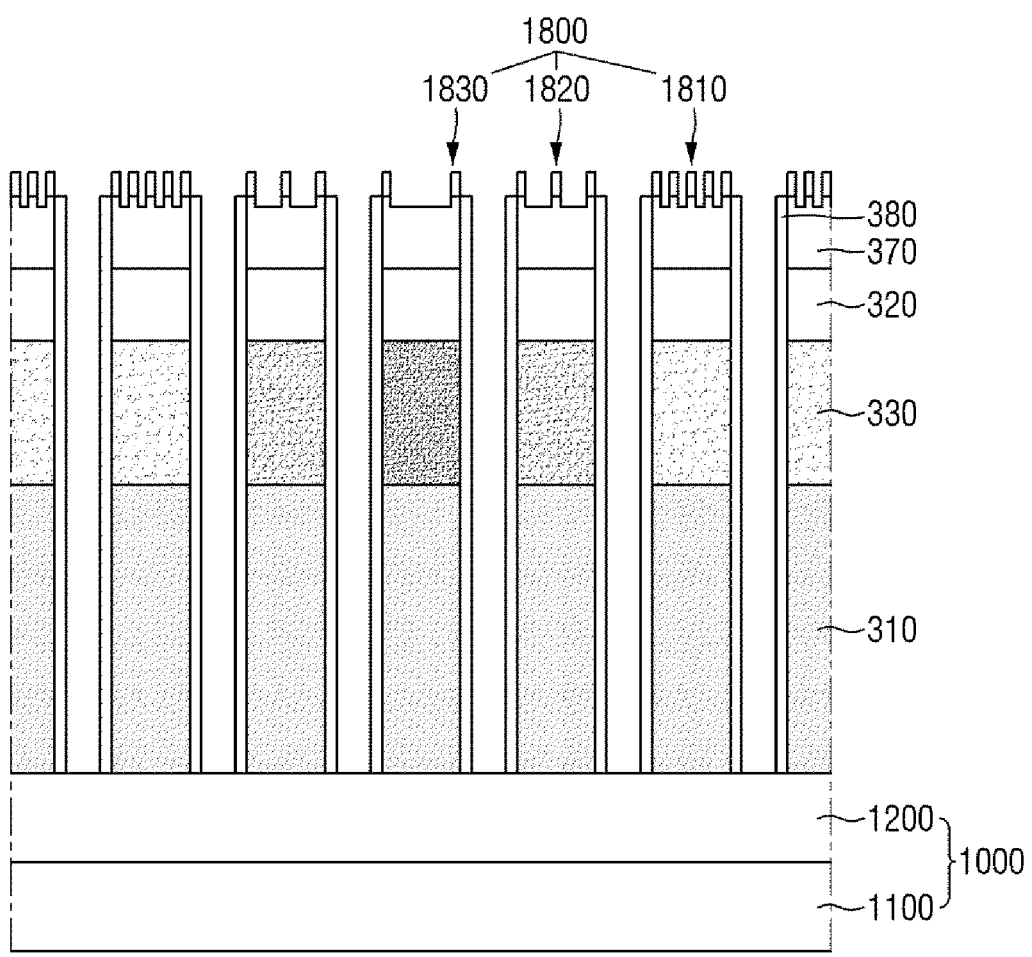
Figure 24:
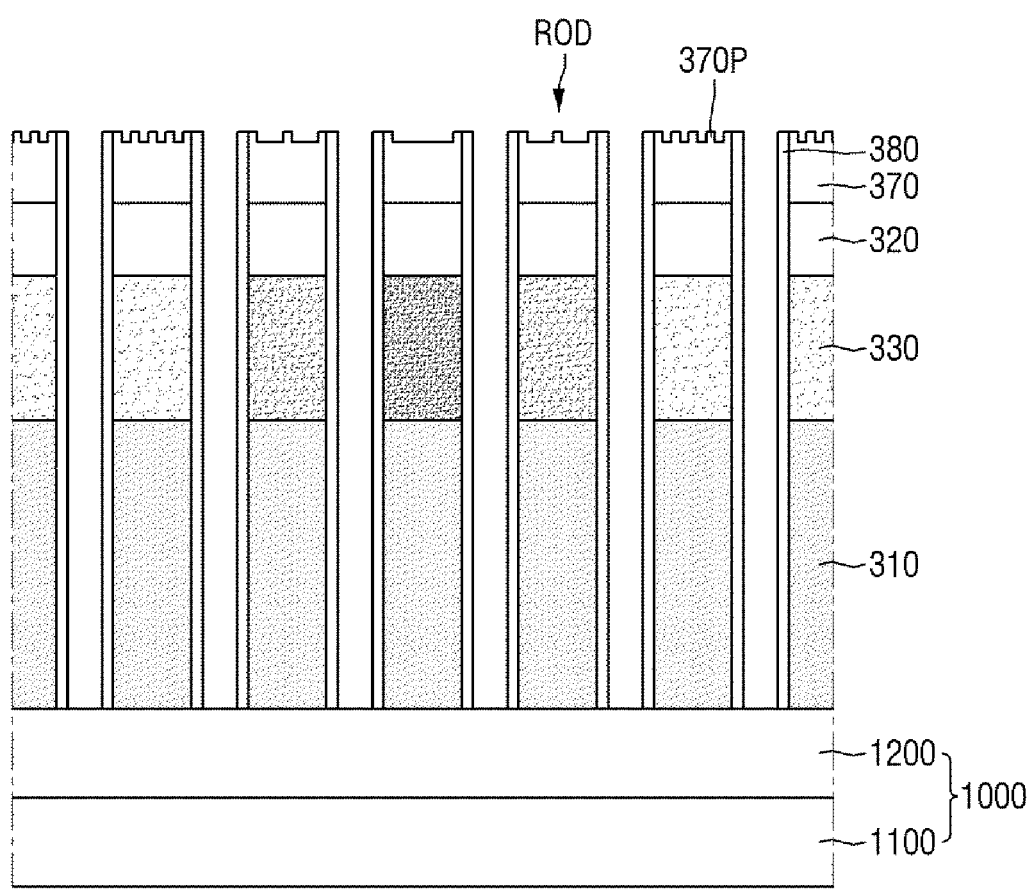

Referring to FIGS. 23 and 24, the upper surfaces of the semiconductor crystals 3000' are partially etched along the fourth through sixth mask patterns 1810, 1820, and 1830 of the second pattern layer 1800 to form the element rods ROD having the protrusion patterns 370P.

As described above, the method for manufacturing the light-emitting elements 300 according to an embodiment includes forming the protrusion patterns 370P on the semiconductor crystals 3000'. In the forming of the protrusion patterns 370P, the fourth through sixth mask patterns 1810, 1820, and 1830 of the second pattern layer 1800 may have different shapes, and the manufactured light-emitting elements 300 may include different protrusion patterns 370P in different areas WA of the semiconductor structure 3000.

For example, because the fourth mask patterns 1810 are formed in the first area WA1, light-emitting elements 300 formed in the first area WA1 may be first light-emitting elements 301 having the first protrusion pattern 371P shown in FIG. 8. Because the fifth mask patterns 1820 are formed in the second area WA2, light-emitting elements 300 formed in the second area WA2 may be second light-emitting elements 302 having the second protrusion pattern 372P shown in FIG. 8. Because the sixth mask pattern 1830 is formed in the third area WA3, a light-emitting element 300 formed in the third area WA3 may be a third light-emitting element 303 having the third protrusion pattern 373P shown in FIG. 8.

The light-emitting elements 300 manufactured through the semiconductor structure 3000 may include different protrusion patterns 370P in different areas WA defined in the semiconductor structure 3000. When there is a difference between the light-emitting characteristics of the manufactured light-emitting elements 300, an area WA in which a corresponding light-emitting element 300 is formed in the semiconductor structure 3000 may be tracked (e.g., identified) by the protrusion pattern 370P of the light-emitting element 300, and the light-emitting characteristics of the area WA in the semiconductor structure 3000 may be adjusted. Accordingly, the light-emitting elements 300 manufactured on the lower substrate 1000 can have uniform light-emitting characteristics.

Figure 25:
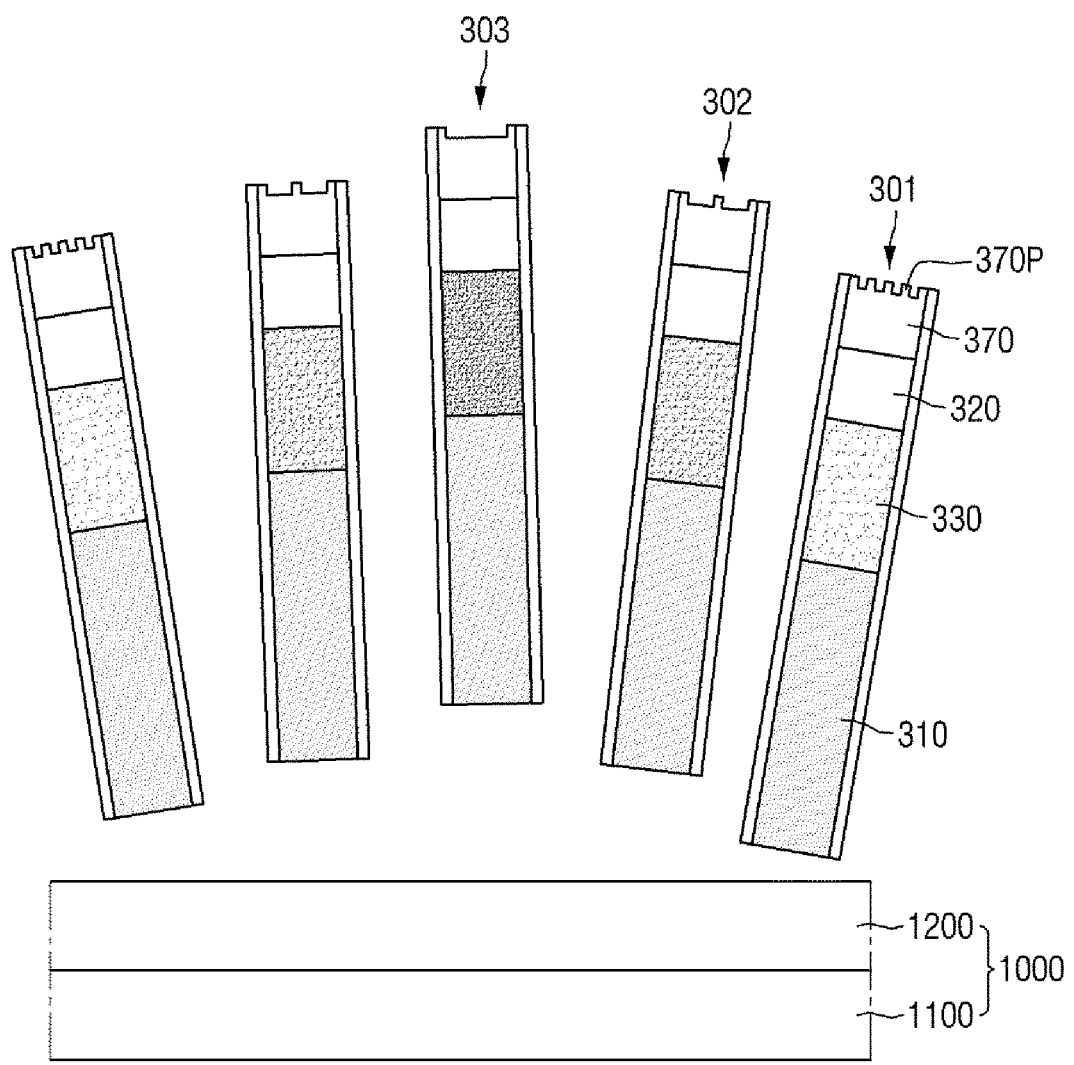

Finally, as illustrated in FIG. 25, the element rods ROD are separated from the lower substrate 1000 to manufacture the light-emitting elements 300. The manufactured light-emitting elements 300 may include different protrusion patterns 370P in different areas WA of the semiconductor structure 3000. The light-emitting elements 300 may include the first light-emitting elements 301, the second light-emitting elements 302, and the third light-emitting element 303 having the protrusion patterns 370P with different shapes.

The light-emitting elements 300 according to an embodiment may be manufactured through the process described above. The method for manufacturing the light-emitting elements 300 may include defining a plurality of areas WA in the semiconductor structure 3000, etching the semiconductor structure 3000 according to the first pattern layer 1700, and forming the protrusion patterns 370P according to the second pattern layer 1800. The first through third mask patterns 1710, 1720, and 1730 of the first pattern layer 1700 may have the same shape even though they are disposed in different areas WA of the semiconductor structure 3000, but the fourth through sixth mask patterns 1810, 1820, and 1830 of the second pattern layer 1800 may have different shapes in different areas WA. Accordingly, the manufactured light-emitting elements 300 may have the same shape or diameter in different areas WA of the semiconductor structure 3000, but the shapes of the protrusion patterns 370P may be different. The position at which each light-emitting element 300 is formed in the semiconductor structure 3000 can be identified by the shape of the protrusion pattern 370P of the light-emitting element 300. Because the light-emitting elements 300 are manufactured to have different protrusion patterns 370P in different areas defined in the semiconductor structure 3000, in which area of the semiconductor structure 3000 a light-emitting element 300 is manufactured can be identified through the protrusion pattern 370P of the light-emitting element 300, and light-emitting characteristics of light emitted from the area WA of the semiconductor structure 3000 can be adjusted. Accordingly, the light-emitting elements 300 having uniform light-emitting characteristics can be manufactured by repeating the manufacturing process several times, and a display device 10 including the light-emitting elements 300 having different protrusion patterns 370P can have uniform light-emitting characteristics in each subpixel PXn.

Methods of manufacturing light-emitting elements 300 and light-emitting elements 300 according to various embodiments will now be described.

Figure 26:
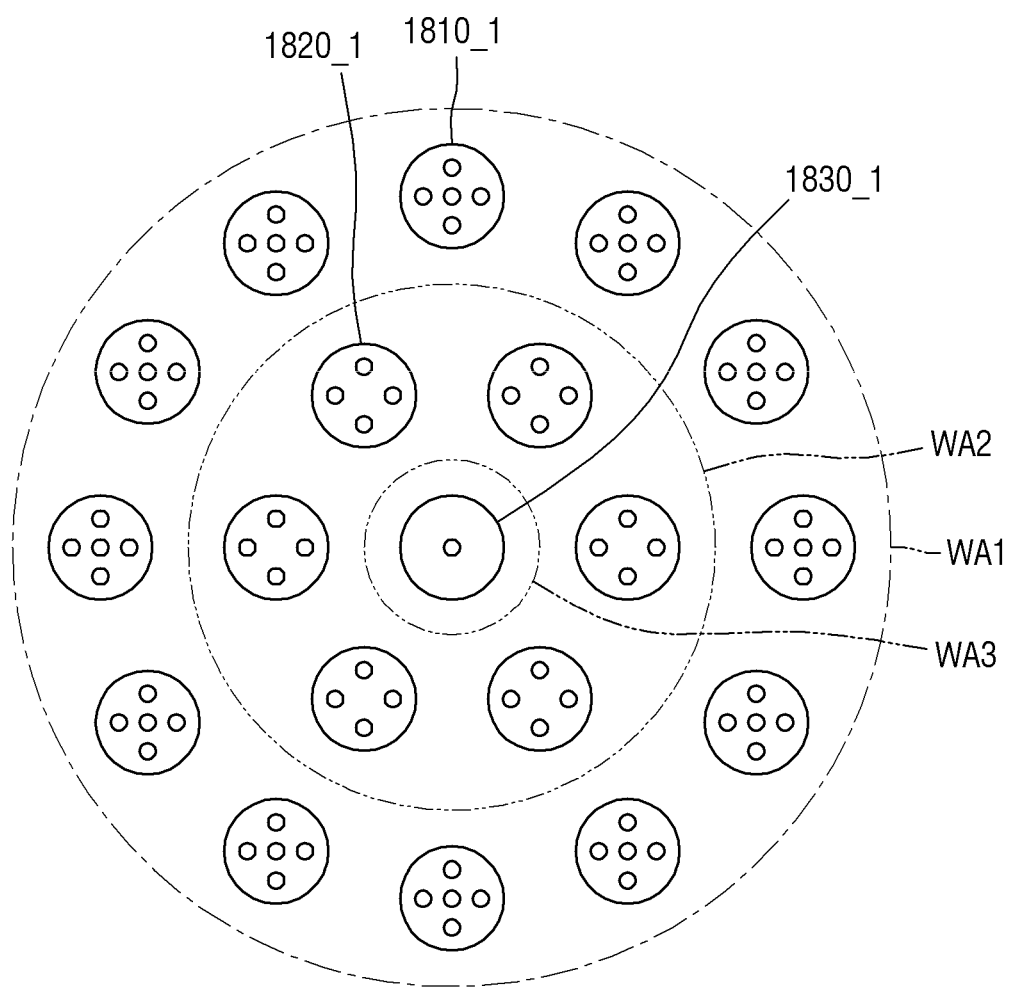
FIGS. 26 through 28 are plan views illustrating shapes of a second pattern layer according to embodiments.
Figure 27:
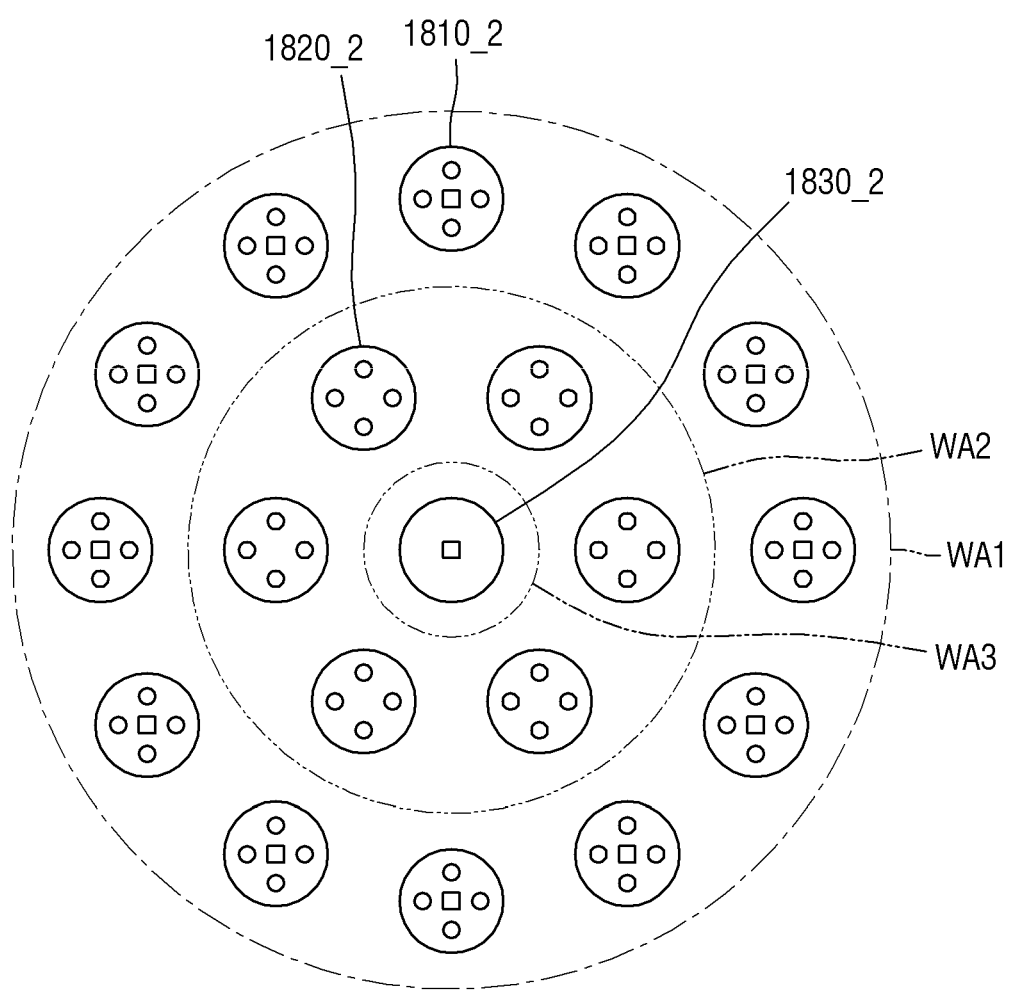
Figure 28:
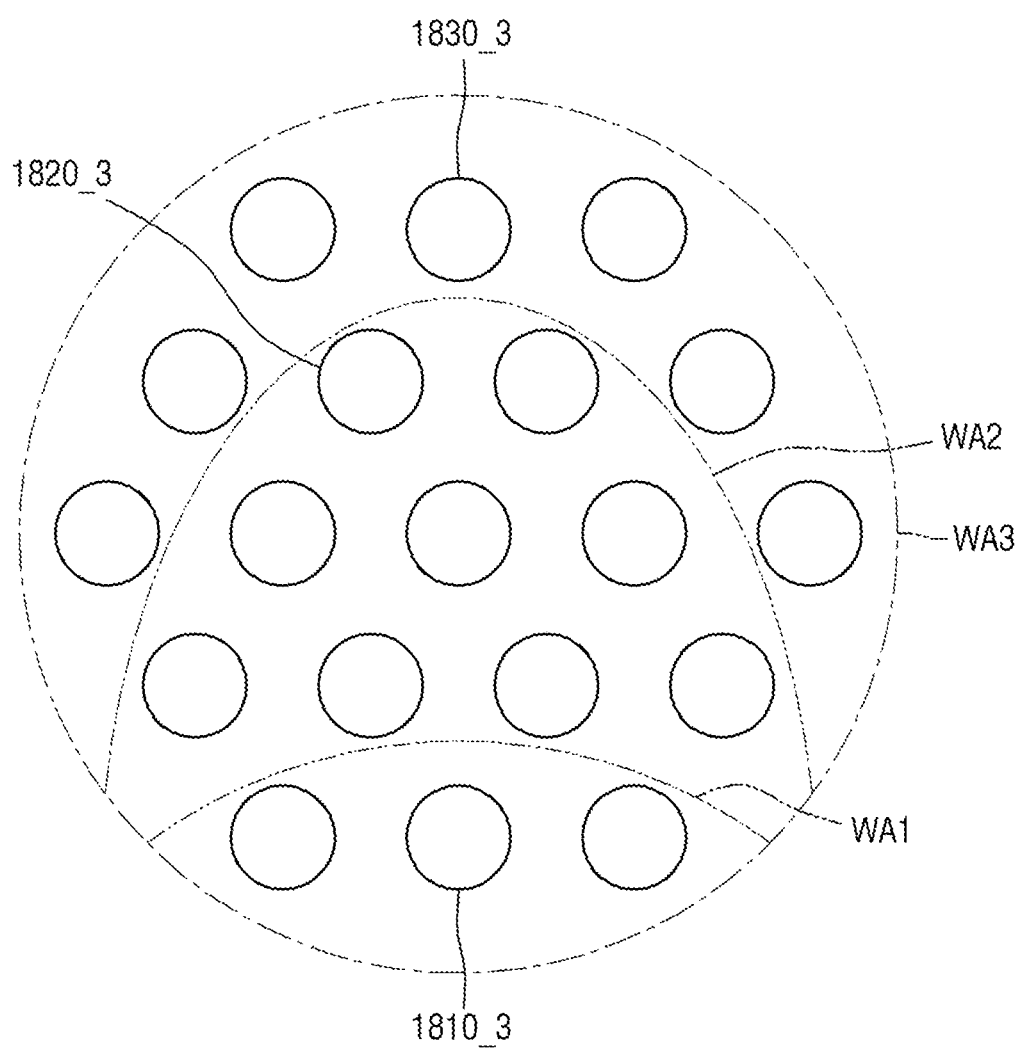

FIGS. 26 through 28 are plan views illustrating shapes of a second pattern layer according to an embodiment.

During a process of manufacturing light-emitting elements 300, shapes of the fourth through sixth mask patterns 1810, 1820, and 1830 of a second pattern layer 1800 are not limited to those illustrated in FIG. 22.

First, referring to FIG. 26, fourth through sixth mask patterns 1810_1, 1820_1, and 1830_1 of a second pattern layer 1800_1 according to an embodiment may each include a plurality of pattern parts spaced apart from each other. The embodiment illustrated in FIG. 26 is different from the embodiment illustrated in FIG. 22 in shapes of the fourth through sixth mask patterns 1810_1, 1820_1, and 1830_1. Therefore, any redundant description will be omitted, and differences therebetween will be primarily described below.

In the second pattern layer 1800_1 shown in FIG. 26, pattern parts of the fourth through sixth mask patterns 1810_1, 1820_1, and 1830_1 may have a shape not in which any one pattern part surrounds another pattern part but in which a plurality of pattern parts are spaced apart from each other. However, the fourth through sixth mask patterns 1810_1, 1820_1, and 1830_1 may include different numbers of pattern parts in different areas WA in which the second pattern layer 1800_1 is formed.

Each of the fourth mask patterns 1810_1 formed in a first area WA1 may include four different pattern parts spaced apart from one pattern part in vertical and horizontal directions (as shown in the drawings). Each of the fifth mask patterns 1820_1 formed in a second area WA2 may include fourth patterns without the pattern part located in the center of each fourth mask pattern 1810_1. The sixth mask pattern 1830_1 formed in a third area WA3 may include only one pattern part located in the center of each fourth mask pattern 1810_1.

Shapes of protrusion patterns 370P of light-emitting elements 300 manufactured may vary according to shapes of the fourth through sixth mask patterns 1810_1, 1820_1, and 1830_1. First light-emitting element 301 having first protrusion patterns 371P according to the fourth mask patterns 1810_1 may each include five protrusions, second light-emitting elements 302 having second protrusion patterns 372P according to the fifth mask patterns 1820_1 may each include four protrusions, and a third light-emitting element 303 having a third protrusion pattern 373P according to the sixth mask pattern 1830_1 may include one protrusion. According to an embodiment, the fourth through sixth mask patterns 1810_1, 1820_1, and 1830_1 of the second pattern layer 1800_1 are not particularly limited in shape and number and can be variously modified as long as they are provided in different shapes and numbers in different areas WA defined in a semiconductor structure 3000. The first light-emitting elements 301, the second light-emitting elements 302, and the third light-emitting element 303 may include different protrusions 370P according to the shapes of the fourth through sixth mask patterns 1810_1, 1820_1, and 1830_1 of the second pattern layer 1800_1. Accordingly, the areas WA in which they are formed in the semiconductor structure 3000 can be tracked (e.g., identified).

Next, referring to FIG. 27, fourth through sixth mask patterns 1810_2, 1820_2, and 1830_2 of a second pattern layer 1800_2 according to an embodiment may include pattern parts having different shapes. The embodiment illustrated in FIG. 27 is different from the embodiment illustrated in FIG. 26 in shapes of the fourth through sixth mask patterns 1810_2, 1820_2, and 1830_2. Therefore, any redundant description will be omitted, and differences therebetween will be primarily described below. In the second pattern layer 1800_2 shown in FIG. 27, any one of the pattern parts of each of the fourth through sixth mask patterns 1810_2, 1820_2, and 1830_2 may have a shape other than a circular shape. Although any one of the pattern parts of each of the fourth through sixth mask patterns 1810_2, 1820_2, and 1830_2 has a different shape in the drawing, the present disclosure is not limited thereto. The fourth through sixth mask patterns 1810_2, 1820_2, and 1830_2 may include pattern parts having different shapes in different areas WA in which the second pattern layer 1800_2 is formed. The second pattern layer 1800_2 according to the embodiment illustrated in FIG. 27 is different from the embodiment illustrated in FIG. 26 in that the fourth through sixth mask patterns 1810_2, 1820_2, and 1830_2 are distinguished not by the number of pattern parts but by the shape of the pattern parts. Other details are substantially the same, and thus, a detailed description thereof will be omitted.

In the above embodiments, the areas WA defined in the semiconductor structure 3000 change from the center toward the periphery of the semiconductor structure 3000. In such an embodiment, the fourth through sixth mask patterns 1810, 1820, and 1830 of the second pattern layer 1800 may include different pattern parts from the center toward the periphery of the semiconductor structure 3000. However, the shapes of the areas WA defined in the semiconductor structure 3000 are not necessarily limited thereto.

Referring to FIG. 28, areas WA defined in a semiconductor structure 3000 may change from a side toward the other side of the semiconductor structure 3000. The embodiment illustrated in FIG. 28 is different from the embodiment illustrated in FIG. 22 in positions of fourth through sixth mask patterns 1810_3, 1820_3, and 1830_3 of a second pattern layer 1800_3 due to changed positions of the areas WA defined in the semiconductor structure 3000. In FIG. 28, shapes of pattern parts of the fourth through sixth mask patterns 1810_3, 1820_3, and 1830_3 are not illustrated. However, it is understood that the shapes of the pattern parts such as described in connection with the embodiments shown in FIGS. 22, 26, and 27 can be used. Therefore, any redundant description will be omitted, and differences therebetween will be primarily described below.

As described above, when the semiconductor structure 3000 is formed by depositing a precursor material on a lower substrate 1000, the distribution of the precursor material provided on the lower substrate 1000 may not be uniform. The arrangement of the areas WA defined in the semiconductor structure 3000 may vary according to the uniformity of the precursor material distribution.

In the embodiment illustrated in FIG. 28, a first area WA may be formed on a side of the semiconductor structure 3000, and a second area WA2 and a third area WA3 may be sequentially formed toward the other side opposite the above side. Accordingly, the arrangement of the fourth through sixth mask patterns 1810_3, 1820_3, and 1830_3 of the second pattern layer 1800_3 may also be changed.

The fourth mask patterns 1810_3, the fifth mask patterns 1820_3, and the sixth mask patterns 1830_3 may be formed in the first area WA1, the second area WA2, and the third area WA3, respectively, and the shape of the second pattern layer 1800_3 may change from one side toward the other side along an axial direction crossing the center of the semiconductor structure 3000. However, the present disclosure is not limited thereto, and the opposite may also be true. The fourth through sixth mask patterns 1810_3, 1820_3, and 1830_3 of the second pattern layer 1800_2 may have various shapes, arrangement structures, diameters, etc., in different areas WA defined in the semiconductor structure 3000.

Figure 29:
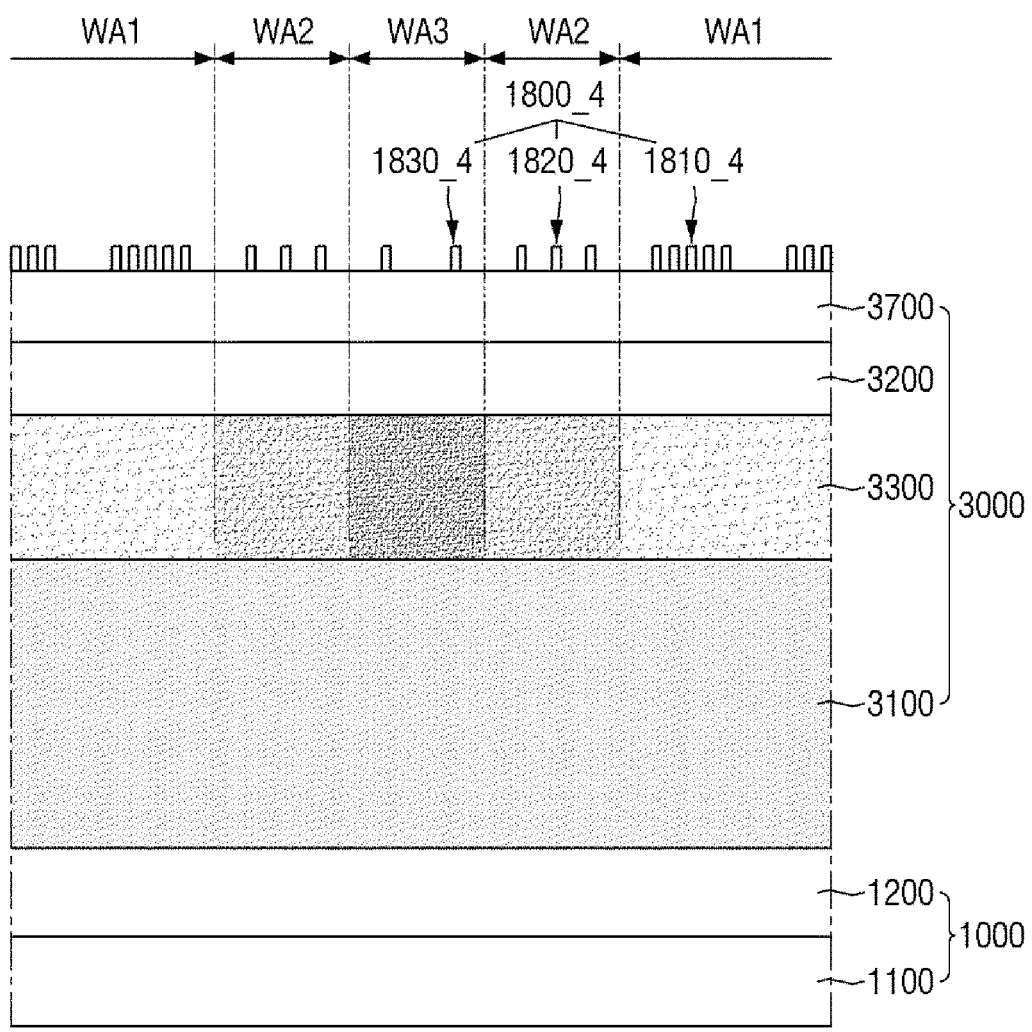
FIGS. 29 and 30 are cross-sectional views illustrating steps of a process of manufacturing light-emitting elements according to an embodiment.
Figure 30:
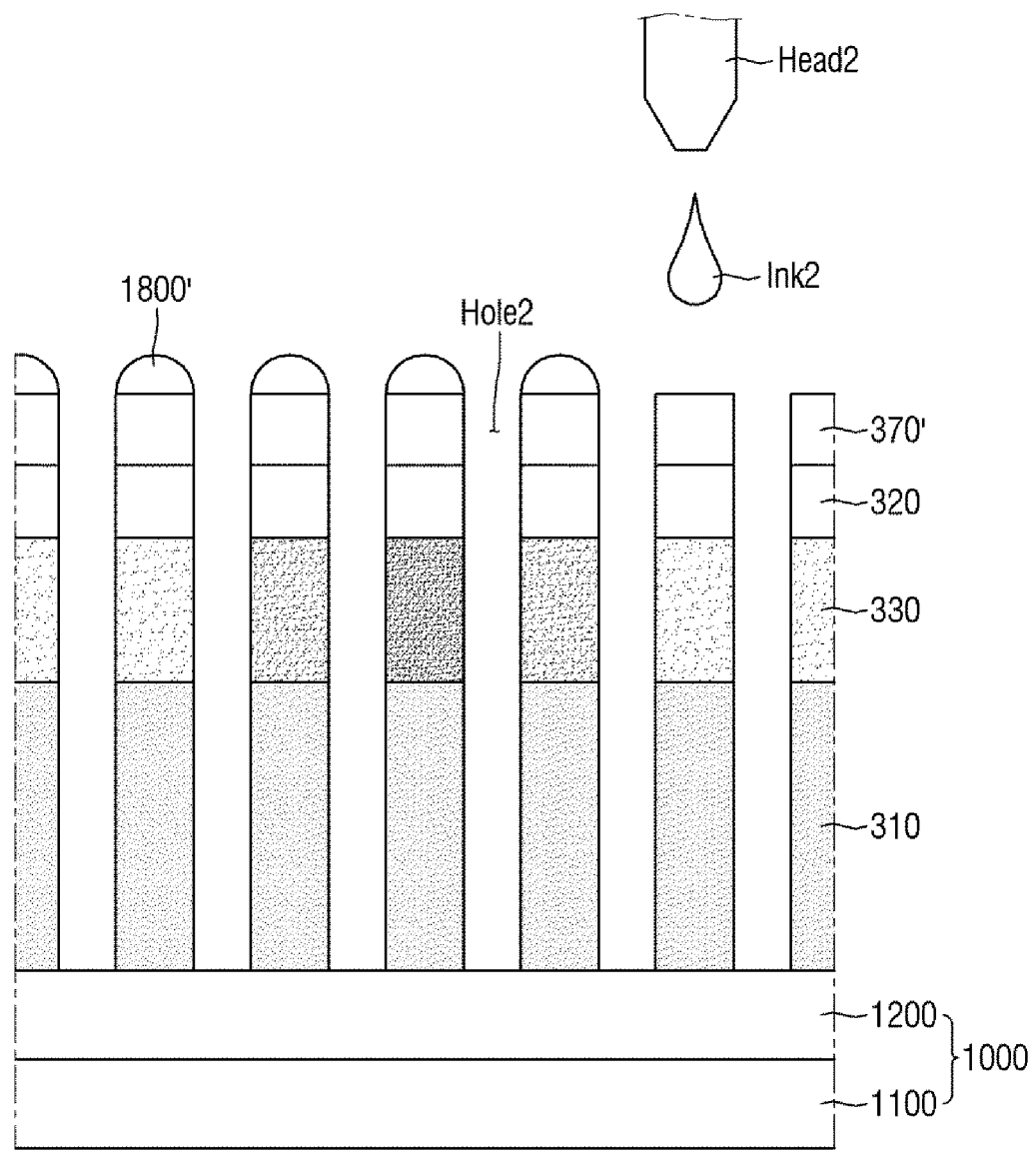

FIGS. 29 and 30 are cross-sectional views illustrating a part of a process of manufacturing light-emitting elements according to an embodiment.

According to an embodiment, a second pattern layer 1800 for forming protrusion patterns 370P may not necessarily be formed on semiconductor crystals 3000' on which insulating films 380 are formed. In some embodiments, the second pattern layer 1800 may be formed on a semiconductor structure 3000 or may be formed on the semiconductor crystals 3000' before the insulating films 380 are formed.

Referring to FIG. 29, a second pattern layer 1800_4 according to an embodiment may be formed on a semiconductor structure 3000 before a first pattern layer 1700 is formed. The embodiment illustrated in FIG. 29 is different in that the order of forming the first pattern layer 1700 and the second pattern layer 1800_4 is reversed. In an embodiment, a method for manufacturing light-emitting elements 300 may include forming the second pattern layer 1800_4 on the semiconductor structure 3000, forming protrusion patterns 370P along the second pattern layer 1800_4, forming the first pattern layer 1700 on the semiconductor structure 3000, and forming element rods ROD by etching the semiconductor structure 3000 along the first pattern layer 1700. For example, the second pattern layer 1800_4 may be formed before the semiconductor structure 3000 is etched in a direction perpendicular to a lower substrate 1000, and the semiconductor structure 3000 may be etched in a state where the protrusion patterns 370P are formed, thereby forming semiconductor crystals 3000'. The current embodiment is the same as described above except for the order of the process of forming the second pattern layer 1800_4, and thus, a detailed description thereof will be omitted.

Next, referring to FIG. 30, according to an embodiment, a second pattern layer 1800 may be formed before insulating films 380 surrounding outer circumferential surfaces of semiconductor crystals 3000' are formed. The embodiment illustrated in FIG. 30 is different from the embodiment illustrated in FIG. 20 in that a second resin ink Ink2 for forming the second pattern layer 1800 is sprayed (e.g., deposited) on the semiconductor crystals 3000' on which the insulating films 380 are not formed. Other details are the same, and thus, a detailed description thereof will be omitted.

According to an embodiment, the second pattern layer 1800 for forming protrusion patterns 370P may be formed before an electrode material layer 3700 of a semiconductor structure 3000 is formed. For example, the protrusion patterns 370P of light-emitting elements 300 may be formed on surfaces of electrode layers 370 which contact second semiconductor layers 320.

Figure 31A:
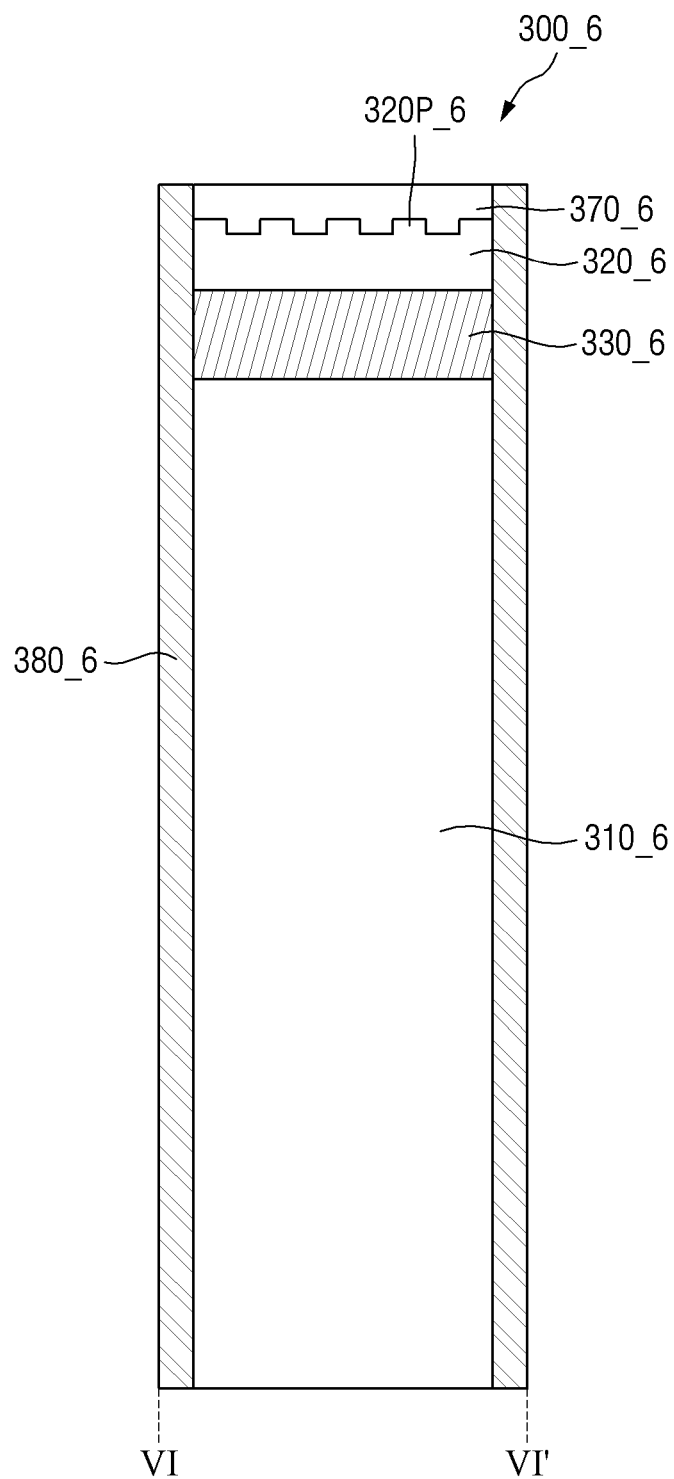
FIGS. 31a and 31b are cross-sectional views of a light-emitting element according to an embodiment.
Figure 31B:
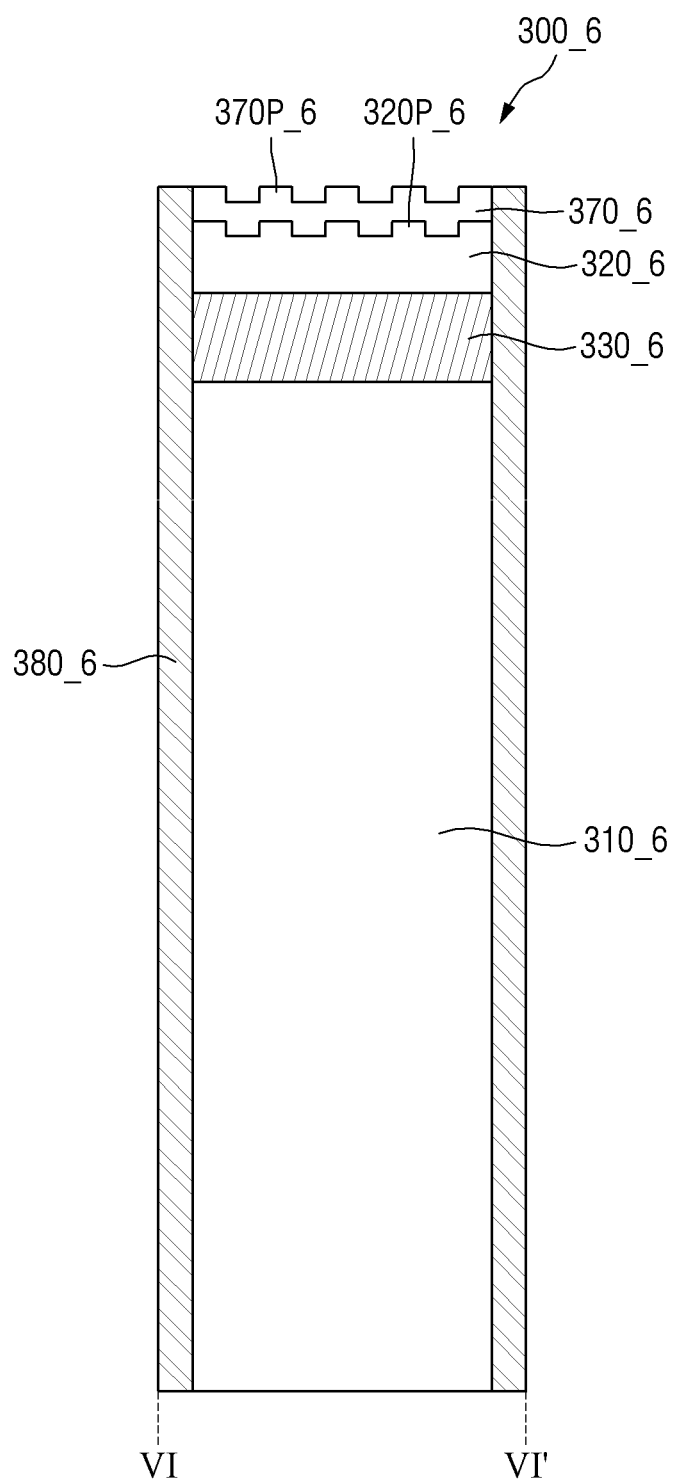

FIGS. 31a and 31b are cross-sectional views of a light-emitting element according to an embodiment.

Referring to FIGS. 31a and 31b, a light-emitting element 300_6 according to an embodiment may include a second protrusion pattern 320P_6 formed on a contact surface between an electrode layer 370_6 and a second semiconductor layer 320_6, and the second protrusion pattern 320P_6 may contact the second semiconductor layer 320_6. In the light-emitting element 300_6 shown in FIG. 31a, the second protrusion pattern 320P_6 is formed only between the electrode layer 370_6 and the second semiconductor layer 320_6. In the light-emitting element 300_6 shown in FIG. 31b, a first protrusion pattern 370P_6 is formed in addition to the second protrusion pattern 320P_6. The current embodiment is different from the embodiment illustrated in FIG. 7 in the position of the protrusion pattern 320P_6 and the shapes of the second semiconductor layer 320_6 and the electrode layer 370_6. Therefore, any redundant description will be omitted, and differences therebetween will be primarily described below.

In the light-emitting element 300_6 shown in FIGS. 31a and 31b, the second protrusion pattern 320P_6 may be further formed between the second semiconductor layer 320_6 and the electrode layer 370_6 by performing a process of forming a second pattern layer 1800 on a second semiconductor 3200 of a semiconductor structure 3000 during a process of manufacturing the light-emitting element 300_6. The second protrusion pattern 320P_6 may include protrusions protruding from at least a part of an upper surface of the second semiconductor layer 320_6, and a surface of the electrode layer 370_6 may be at least partially depressed to contact the protrusions of the second protrusion pattern 320P_6. Accordingly, both end surfaces of the light-emitting element 300_6 may form substantially flat surfaces.

As illustrated in FIG. 31a, even if a protrusion pattern 370P is not formed on an end surface of a light-emitting element 300, the shape of the protrusion pattern 370P can be identified through a cross section of the light-emitting element 300 having different light-emitting characteristics. Therefore, an area WA of the semiconductor structure 3000 in which the light-emitting element 300 is formed can be identified, and light-emitting characteristics of the area WA can be adjusted. However, the present disclosure is not limited thereto, and the light-emitting element 300_6 may also include a plurality of protrusion patterns, for example, the first protrusion pattern 370P_6 and the second protrusion pattern 320P_6.

The structure of the light-emitting element 300 is not limited to that illustrated in FIG. 6, and the light-emitting element 300 may also have other structures.

Figure 32:
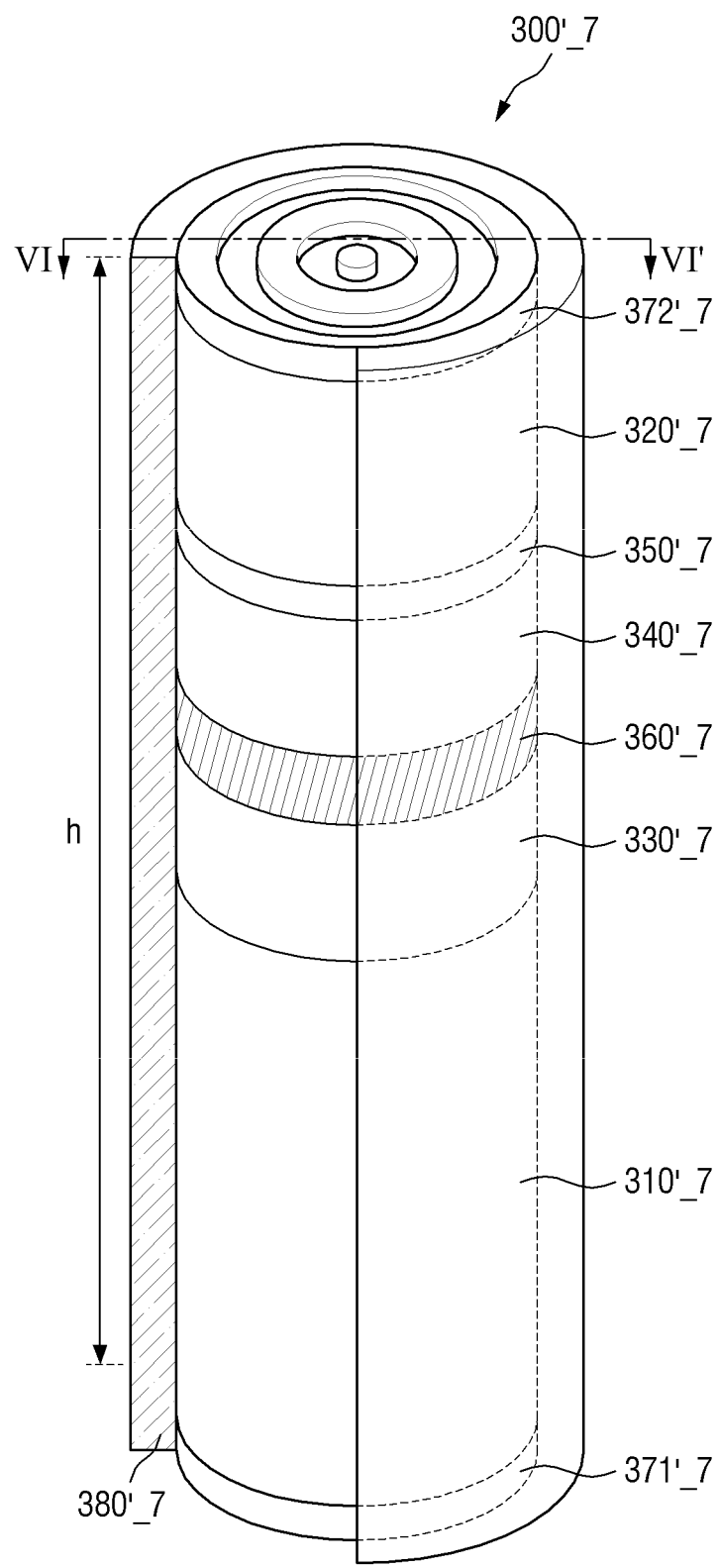
FIG. 32 is a schematic view of a light-emitting element according to an embodiment.
Figure 33:
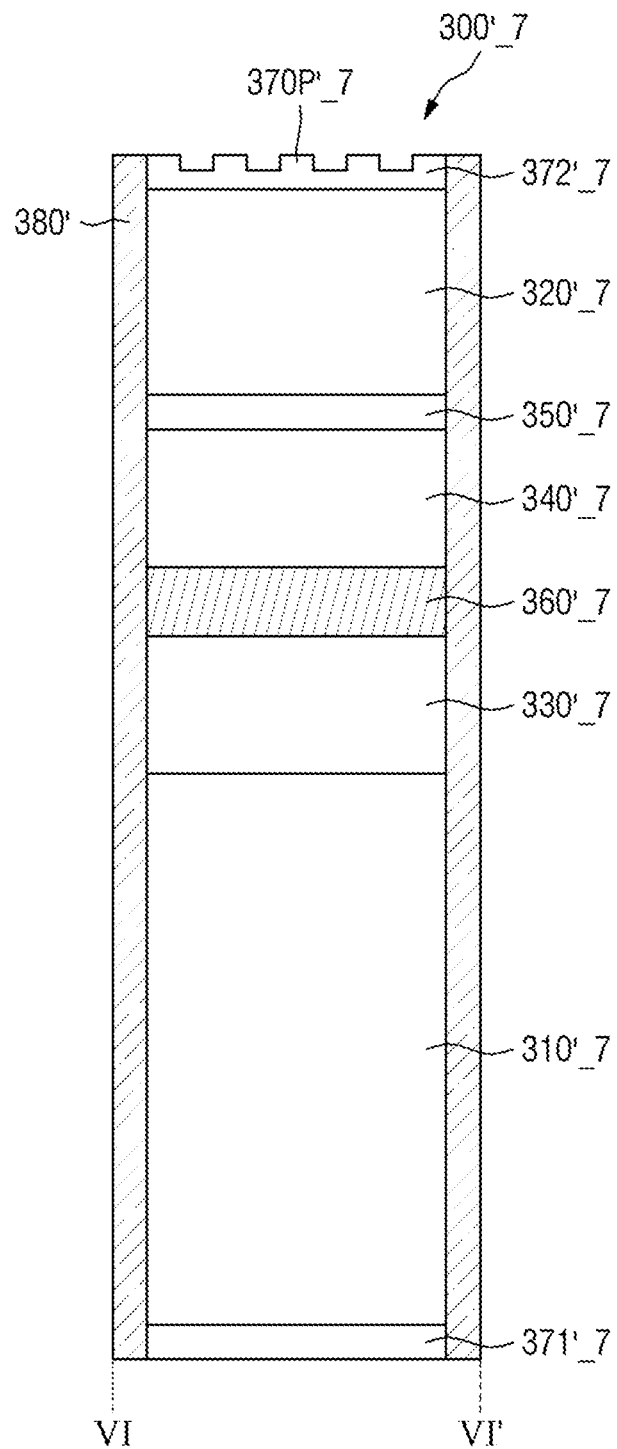
FIG. 33 is a cross-sectional view taken along the line VI-VI' of FIG. 32.

FIG. 32 is a schematic view of a light-emitting element according to an embodiment, and FIG. 33 is a cross-sectional view taken along the line VI-VI' in FIG. 32.

Referring to FIGS. 32 and 33, a light-emitting element 300'_7 according to an embodiment may further include a third semiconductor layer 330'_7, which is disposed between a first semiconductor layer 310'_7 and an active layer 360'_7, and a fourth semiconductor layer 340'_7 and a fifth semiconductor layer 350'_7, which are disposed between the active layer 360'_7 and a second semiconductor layer 320'_7. The light-emitting element 300'_7 shown in FIGS. 32 and 33 is different from the embodiment illustrated in FIG. 6 in that a plurality of semiconductor layers 330'_7, 340'_7, and 350'_7 and an electrode layer 372'_7 are further disposed and that the active layer 360'_7 includes (or contains) a different element. The arrangement and structure of an insulating film 380'_7 are substantially the same as those shown in FIG. 6. In FIG. 32, some members are given new reference numerals for ease of description even though they are the same as those shown in FIG. 6. Any redundant description will be omitted, and differences therebetween will be primarily described below.

As described above, the light-emitting element 300 shown in FIG. 6 may emit blue or green light when the active layer 330 includes nitrogen (N). On the other hand, in the light-emitting element 300'_7 shown in FIGS. 32 and 33, each of the active layer 360'_7 and other semiconductor layers may be a semiconductor including at least phosphorous (P). For example, the light-emitting element 300'_7 according to an embodiment may emit red light having a central wavelength band in a range of about 620 to about 750 nm. However, the central wavelength band of the red light is not limited to the above range and should be understood to include all wavelength ranges that can be recognized as red in the art to which the present disclosure pertains.

In some embodiments, the first semiconductor layer 310'_7 may be an n-type semiconductor layer. When the light-emitting element 300'_7 emits red light, the first semiconductor layer 310'_7 may include a semiconductor material having a chemical formula of $In_xAl_yGa_{1-x-y}P$ ($0 \le x \le 1$, $0 \le y \le 1$, $0 \le x+y \le 1$). For example, the first semiconductor layer 310'_7 may be any one or more of n-type doped InAlGaP, GaP, AlGaP, InGaP, AlP, and InP. The first semiconductor layer 310'_7 may be doped with an n-type dopant, and the n-type dopant may be, for example, Si, Ge, or Sn. In an embodiment, the first semiconductor layer 310'_7 may be n-AlGaInP doped with n-type Si. A length of the first semiconductor layer 310'_7 may be in a range of, but is not limited to, about 1.5 to about 5 µm.

The second semiconductor layer 320'_7 may be a p-type semiconductor layer. When the light-emitting element 300'_7 emits red light, the second semiconductor layer 320'_7 may include a semiconductor material having a chemical formula of $In_xAl_yGa_{1-x-y}P$ ($0 \le x \le 1$, $0 \le y \le 1$, $0 x+y \le 1$). For example, the second semiconductor layer 320'_7 may be any one or more of p-type doped InAlGaP, GaP, AlGaNP, InGaP, AlP, and InP. The second semiconductor layer 320'_7 may be doped with a p-type dopant, and the p-type dopant may be, for example, Mg, Zn, Ca, Se, or Ba. In an embodiment, the second semiconductor layer 320'_7 may be p-GaP doped with p-type Mg. A length of the second semiconductor layer 320'_7 may be in a range of, but is not limited to, about 0.08 to about 0.25 µm.

The active layer 360'_7 may be disposed between the first semiconductor layer 310'_7 and the second semiconductor layer 320'_7. Similar to the active layer 330 shown in FIG. 6, the active layer 360'_7 shown in FIGS. 32 and 33 may include a material having a single or multiple quantum well structure to emit light in a specific wavelength band. For example, when the active layer 360'_7 emits light in a red wavelength band, the active layer 360'_7 may include a material such as AlGaP or AlInGaP. For example, when the active layer 360'_7 has a multiple quantum well structure in which a quantum layer and a well layer are alternately stacked, the quantum layer may include a material such as AlGaP or AlInGaP, and the well layer may include a material such as GaP or AlInP. In an embodiment, the active layer 360'_7 may include AlGaInP as a quantum layer and AlInP as a well layer to emit red light having a central wavelength band in a range of about 620 to about 750 nm.

The light-emitting element 300'_7 shown in FIGS. 32 and 33 may include a clad layer disposed adjacent to the active layer 360'_7. As illustrated in the drawings, the third semiconductor layer 330'_7 and the fourth semiconductor layer 340'_7 disposed between the first semiconductor layer 310'_7 and the second semiconductor layer 320'_7 above and below the active layer 360'_7 may be clad layers.

The third semiconductor layer 330'_7 may be disposed between the first semiconductor layer 310'_7 and the active layer 360'_7. Similar to the first semiconductor layer 310'_7, the third semiconductor layer 330'_7 may be an n-type semiconductor. For example, the third semiconductor layer 330'_7 may include a semiconductor material having a chemical formula of $In_xAl_yGa_{1-x-y}P$ ($0 \le x \le 1$, $0 \le y \le 1$, $0 \le x+y \le 1$). In an embodiment, the first semiconductor layer 310'_7 may be n-AlGaInP, and the third semiconductor layer 330'_7 may be n-AlInP. However, the present disclosure is not limited thereto.

The fourth semiconductor layer 340'_7 may be disposed between the active layer 360'_7 and the second semiconductor layer 320'_7. Similar to the second semiconductor layer 320'_7, the fourth semiconductor layer 340'_7 may be an n-type semiconductor. For example, the fourth semiconductor layer 340'_7 may include a semiconductor material having a chemical formula of $In_xAl_yGa_{1-x-y}P$ ($0 \leq x \leq 1$, $0 \leq y \leq 1$, $0 \leq x+y \leq 1$). In an embodiment, the second semiconductor layer 320'_7 may be p-GaP, and the fourth semiconductor layer 340'_7 may be p-AlInP.

The fifth semiconductor layer 350'_7 may be disposed between the fourth semiconductor layer 340'_7 and the second semiconductor layer 320'_7. Similar to the second semiconductor layer 320'_7 and the fourth semiconductor layer 340'_7, the fifth semiconductor layer 350'_7 may be a p-type doped semiconductor. In some embodiments, the fifth semiconductor layer 350'_7 may reduce a difference in lattice constant between the fourth semiconductor layer 340'_7 and the second semiconductor layer 320'_7. For example, the fifth semiconductor layer 350'_7 may be a tensile strain barrier reducing layer. For example, the fifth semiconductor layer 350'_7 may include, but is not limited to, p-GaInP, p-AlInP, or p-AlGaInP.

A first electrode layer 371'_7 and a second electrode layer 372'_7 may be disposed on the first semiconductor layer 310'_7 and the second semiconductor layer 320'_7, respectively, different from the light-emitting element 300 shown in FIG. 6. The first electrode layer 371'_7 may be disposed on a lower surface of the first semiconductor layer 310'_7, and the second electrode layer 372'_7 may be disposed on an upper surface of the second semiconductor layer 320'_7. However, the present disclosure is not limited thereto, and at least any one of the first electrode layer 371'_7 and the second electrode layer 372'_7 may be omitted. For example, in the light-emitting element 300'_7, the first electrode layer 371'_7 may not be disposed on the lower surface of the first semiconductor layer 310'_7 as in the light-emitting element 300 shown in FIG. 6, and only one second electrode layer 372'_7 may be disposed on the upper surface of the second semiconductor layer 320'_7.

The light-emitting element 300'_7 shown in FIGS. 32 and 33 may also be manufactured in substantially the same manner as the light-emitting element 300 shown in FIG. 6. For example, the light-emitting element 300'_7 shown in FIGS. 32 and 33 may be formed by forming a semiconductor structure 3000 including a plurality of semiconductor layers and the active layer 360'_7 and forming a protrusion pattern 370P'_7 through a second pattern layer 1800. However, the light-emitting element 300'_7 according to the current embodiment is different in that the semiconductor structure 3000 includes a greater number of electrode material layers and semiconductors. This is substantially the same as described above, and thus, a detailed description thereof will be omitted.

According to some embodiments, the electrode stem parts 210S and 220S extending in the first direction DR1 may be omitted from the first electrode 210 and the second electrode 220.

Figure 34:
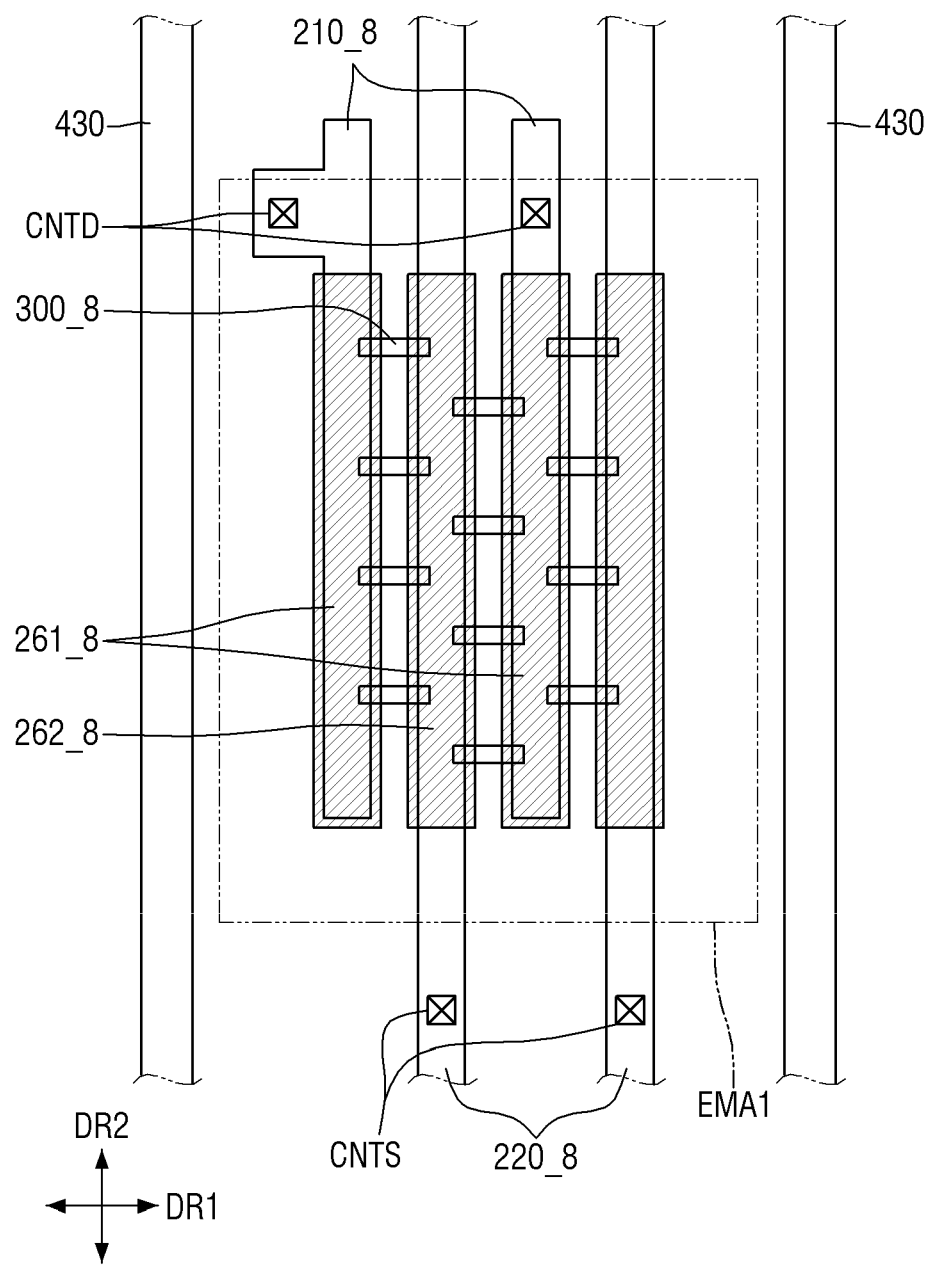
FIG. 34 is a plan view of a subpixel of a display device according to an embodiment.

FIG. 34 is a plan view of a subpixel of a display device according to an embodiment.

Referring to FIG. 34, in a display device 10_8, first electrodes 210_8 and second electrodes 220_8 may extend in a direction, for example, in the second direction DR2. The first electrodes 210_8 and the second electrodes 220_8 may not include electrode stem parts 210S and 220S extending in the first direction DR1. The display device 10_8 shown in FIG. 34 is different from the display device 10 shown in FIG. 3 in that it does not include the electrode stem parts 210S and 220S and includes one more second electrode 220_8. A cross section taken along the lines Xa-Xa', Xb-Xb', and Xc-Xc' in FIG. 34 may be substantially the same as FIG. 4. Any redundant description will be omitted, and differences therebetween will be primarily described below.

As illustrated in FIG. 34, a plurality of first electrodes 210_8 and a plurality of second electrodes 220_8 may extend in the second direction DR2 in each subpixel PXn. An outer bank 430 may also extend in the second direction DR2. The second electrodes 220_8 and the outer bank 430 may also extend to other neighboring subpixels PXn in the second direction DR2. Accordingly, the subpixels PXn neighboring in the second direction DR2 may receive the same electrical signal from the second electrodes 220_8.

Different from the display device 10 shown in FIG. 3, in the display device 10_8 shown in FIG. 34, a second electrode contact opening (e.g., a second electrode contact hole) CNTS may be disposed in (or under) each of the second electrodes 220_8. Each of the second electrodes 220 may be electrically connected to a power electrode 162 of a circuit element layer PAL through the second electrode contact opening CNTS located in each subpixel PXn. Although the second electrode contact opening CNTS is formed in (or under) each of the two second electrodes 220_8 in the drawing, the present disclosure is not limited thereto.

The first electrodes 210_8 may extend in the second direction DR2 but may end at the boundary of each subpixel PXn. The subpixels PXn neighboring in the second direction DR2 may each include the first electrodes 210_8 spaced apart from each other and may receive different electrical signals through first electrode contact openings (e.g., first electrode contact holes) CNTD. This shape of the first electrodes 210_8 may be formed by forming the first electrodes 210_8 extending in the second direction DR2 and then cutting the first electrodes 210_8 at the boundary between neighboring subpixels PXn during a process of manufacturing the display device 10. In the embodiment shown in FIG. 34, light-emitting elements 300 between one first electrode 210_8 and one second electrode 220_8 may be connected in parallel to light-emitting elements 300 between another first electrode 210_8 and another second electrode 220_8.

In the display device 10_8 shown in FIG. 34, some of the electrodes 210_8 and 220_8 may be floating electrodes not electrically connected to the circuit element layer PAL through the electrode contact openings CNTD and CNTS. For example, only outermost electrodes from among the electrodes 210_8 and 220_8 may receive an electrical signal through the electrode contact openings CNTD and CNTS, and electrodes 210_8 and 220_8 disposed between them may not directly receive an electrical signal. In such an embodiment, some of the second electrodes 220_8, for example, the second electrode 220_8 disposed between the different first electrodes 210_8, may extend in the second direction DR2 but, similar to the first electrodes 210_8, may end at the boundary of each subpixel PXn so as not to lie in another subpixel PXn. When some of the electrodes 210_8 and 220_8 are floating electrodes, the light-emitting elements 300 disposed between them may be partially connected in series in addition to the parallel connection. The outer bank 430 may be disposed at the boundary between the subpixels PXn neighboring each other in the first direction DR1 and may extend in the second direction DR2. The outer bank 430 may also be disposed at the boundary between the subpixels PXn neighboring each other in the second direction DR2 and may extend in the first direction DR1. The outer bank 430 is the same as that described above with reference to FIG. 3. In addition, first contact electrodes 261_8 and second contact electrodes 262_8 included in the display device 10_8 shown in FIG. 34 are substantially the same as those included in the display device 10 shown in FIG. 3.

In FIG. 34, two first electrodes 210_8 and two second electrodes 220_8 are disposed and are alternately spaced apart from each other. However, the present disclosure is not limited thereto, and some electrodes may be omitted, or more electrodes may be disposed in the display device 10_8.

In the display device 10, the first electrode 210 and the second electrode 220 may not necessarily extend in one direction. The first electrode 210 and the second electrode 220 of the display device 10 are not limited to a particular shape as long as they are spaced apart from each other to provide a space in which the light-emitting elements 300 are disposed.

Figure 35:
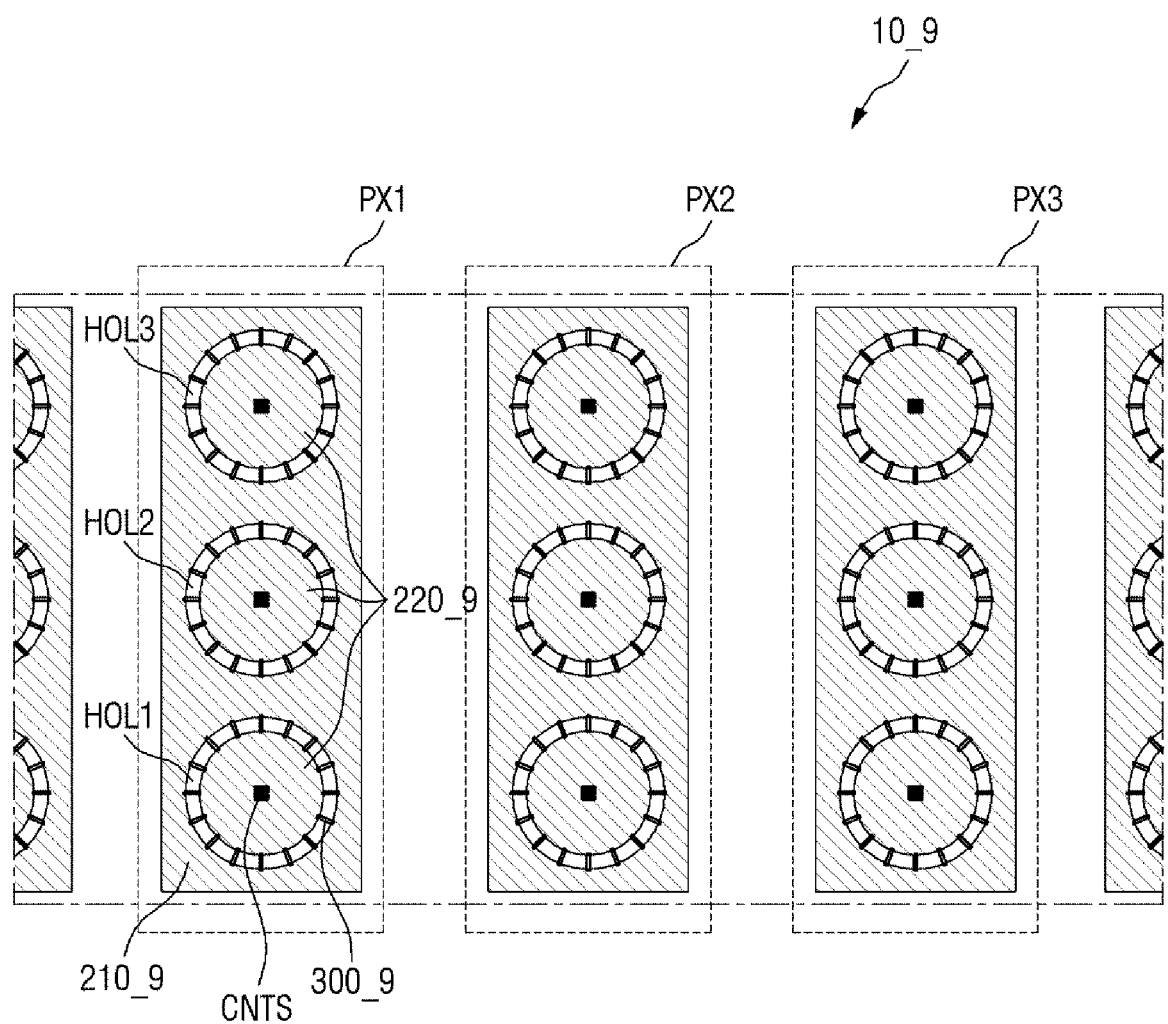
FIG. 35 is a plan view of a pixel of a display device according to an embodiment.

FIG. 35 is a plan view of a pixel of a display device according to an embodiment.

Referring to FIG. 35, a first electrode 210_9 and a second electrode 220_9 of a display device 10_9 according to an embodiment may be at least partially curved, and a curved area of the first electrode 210_9 and a curved area of the second electrode 220_9 may be spaced apart to face each other. The display device 10_9 shown in FIG. 35 is different from the display device 10 shown in FIG. 2 in the shape of each of the first electrode 210_9 and the second electrode 220_9. Therefore, any redundant description will be omitted, and differences therebetween will be primarily described below.

The first electrode 210_9 of the display device 10_9 shown in FIG. 35 may include a plurality of holes (or openings) HOL. For example, as illustrated in the drawing, the first electrode 210_9 may include a first hole HOL1, a second hole HOL2, and a third hole HOL3 arranged along the second direction DR2. However, the present disclosure is not limited thereto, and the first electrode 210_9 may include a greater or fewer number of holes HOL or may include only one hole HOL. An embodiment in which the first electrode 210_9 includes the first hole HOL1, the second hole HOL2, and the third hole HOL3 will be described below as an example.

In an embodiment, each of the first hole HOL1, the second hole HOL2, and the third hole HOL3 may have a circular planar shape. Accordingly, the first electrode 210_9 may include a curved area formed by each of the holes HOL and may face the second electrode 220_9 in the curved area. However, this is merely an example, and the present disclosure is not limited thereto. Each of the first hole HOL1, the second hole HOL2, and the third hole HOL3 is not limited to a particular shape as long as it can provide a space in which the second electrode 220_9 is disposed, as will be described later, and may have various planar shapes, such as an elliptical shape and a quadrangular or more polygonal shape.

The second electrode 220_9 may be provided in plural in each subpixel PXn. For example, three second electrodes 220_9 may be disposed in each subpixel PXn to correspond to the first through third holes HOL1 through HOL3 in the first electrode 210_9. The second electrode 220_9 may be located in each of the first through third holes HOL1 through HOL3 and may be surrounded (e.g., surrounded along a periphery) by the first electrode 210_9.

In an embodiment, the holes HOL in the first electrode 210_9 may have curved outer surfaces, and the second electrodes 220_2 disposed in the holes HOL in the first electrode 210_9 may have curved outer surfaces and may be spaced apart from the first electrode 210_9 to face the first electrode 210_9. As illustrated in FIG. 35, the first electrode 210_9 may include the holes HOL having a circular shape in a plan view, and the second electrodes 220_9 may have a circular shape in a plan view. The curved surfaces of the areas in which the holes HOL in the first electrode 210_9 are formed may be spaced apart from the curved outer surfaces of the second electrodes 220_9 to face them. For example, the first electrode 210_9 may surround the outer surfaces of the second electrodes 220_9.

As described above, light-emitting elements 300 may be disposed between the first electrode 210_9 and the second electrodes 220_9. The display device 10_9 according to the current embodiment may include the second electrodes 220_9 having a circular shape and the first electrode 210_9 surrounding the second electrodes 220_9, and the light-emitting elements 300 may be arranged along the outer surfaces of the second electrodes 220_2. Because the light-emitting elements 300 extend in one direction as described above, the light-emitting elements 300 arranged along the curved outer surfaces of the second electrodes 220_9 in each subpixel PXn may be disposed such that their extending directions face different directions. Each subpixel PXn may have various light exit directions according to directions in which the extending directions of the light-emitting elements 300 face. In the display device 10_9 according to the current embodiment, because the first electrode 210_9 and the second electrodes 220_9 are disposed to have a curved shape, the light-emitting elements 300 disposed between them may face different directions, and lateral visibility of the display device 10_9 may be improved.

In concluding the detailed description, those skilled in the art will appreciate that many variations and modifications can be made to the embodiments described herein without departing from the aspects and features of the present disclosure. Therefore, the embodiments of the present disclosure described herein are provided in a generic and descriptive sense and not for purposes of limitation.

What is claimed is:

1. A light-emitting element comprising:
   a first semiconductor layer and a second semiconductor layer;
   an active layer between the first semiconductor layer and the second semiconductor layer; and
   an electrode layer on the second semiconductor layer and having a first surface and a second surface facing the first surface, the second surface contacting the second semiconductor layer,
   wherein one of the first surface and the second surface of the electrode layer comprises a protrusion pattern protruding from at least a portion thereof and the other one of the first surface and the second surface of the electrode layer is flat, and
   wherein the protrusion pattern comprises:
   a first protrusion;
   a second protrusion spaced apart from the first protrusion;
   a third protrusion spaced apart from the first protrusion and the second protrusion and extending around a periphery of an outer surface of the second protrusion;
   a first depression between the first protrusion and the second protrusion; and
   a second depression between the second protrusion and the third protrusion.

2. The light-emitting element of claim 1, wherein the second protrusion extends around a periphery of the first protrusion.

3. The light-emitting element of claim 1, wherein the first protrusion has an area having the same width as that of the second protrusion.

4. The light-emitting element of claim 3, wherein the first protrusion has an area having a width equal to a distance between the first protrusion and the second protrusion.

5. The light-emitting element of claim 1, wherein the protrusion pattern comprises a first protrusion pattern formed on the first surface, and
wherein the light-emitting element extends in a direction and has a first end surface on which the first protrusion pattern is formed and a second end surface which is a surface of the first semiconductor layer.

6. The light-emitting element of claim 5, wherein the first end surface and the second end surface have different roughness.

7. The light-emitting element of claim 5, further comprising an insulating film which at least partially surrounds side surfaces of the first semiconductor layer, the second semiconductor layer, and the active layer.

8. A light-emitting element comprising:
a first semiconductor layer and a second semiconductor layer;
an active layer between the first semiconductor layer and the second semiconductor layer; and
an electrode layer on the second semiconductor layer and having a first surface and a second surface facing the first surface, the second surface contacting the second semiconductor layer,
wherein at least any one of the first surface and the second surface of the electrode layer comprises a protrusion pattern protruding from at least a portion thereof,
wherein the electrode layer comprises a second protrusion pattern which is formed on the second surface to contact the second semiconductor layer, and
wherein at least a portion of a surface of the second semiconductor layer that contacts the second surface of the electrode layer is depressed to contact protrusions of the second protrusion pattern.

9. A display device comprising:
a substrate;
a first electrode and a second electrode on a first surface of the substrate, the second electrode being spaced apart from the first electrode; and
a light-emitting element between the first electrode and the second electrode and comprising a pattern part formed on an end surface,
wherein the light-emitting element comprises:
a first semiconductor layer and a second semiconductor layer;
an active layer between the first semiconductor layer and the second semiconductor layer; and
an electrode layer on the second semiconductor layer and comprising a protrusion pattern protruding from at least a portion of a surface in a direction parallel to the first surface of the substrate.

10. The display device of claim 9, wherein the protrusion pattern comprises a first protrusion, a second protrusion spaced apart from the first protrusion, and a depression between the first protrusion and the second protrusion.

11. The display device of claim 10, wherein the second protrusion extends around a periphery of the first protrusion.

12. The display device of claim 10, wherein the light-emitting element comprises a first light-emitting element comprising a first protrusion pattern and a second light-emitting element comprising a second protrusion pattern different from the first protrusion pattern.

13. The display device of claim 12, wherein the first protrusion pattern has a different number of protrusions than the second protrusion pattern.

14. The display device of claim 12, wherein a width of each protrusion in the first protrusion pattern is different from a width of each protrusion in the second protrusion pattern.

15. The display device of claim 9, wherein a first end of the light-emitting element is electrically connected to the first electrode, and a second end is electrically connected to the second electrode.

16. The display device of claim 15, wherein the electrode layer of the light-emitting element is electrically connected to the first electrode, and the first semiconductor layer is electrically connected to the second electrode.

17. A display device comprising:
a first electrode and a second electrode spaced apart from the first electrode;
a light-emitting element between the first electrode and the second electrode and comprising a pattern part formed on an end surface, a first end of the light-emitting element being electrically connected to the first electrode, a second end of the light-emitting element being electrically connected to the second electrode, the light-emitting element comprising:
a first semiconductor layer and a second semiconductor layer;
an active layer between the first semiconductor layer and the second semiconductor layer; and
an electrode layer on the second semiconductor layer and comprising a protrusion pattern protruding from at least a portion of a surface;
a first contact electrode contacting the first end of the light-emitting element and the first electrode; and
a second contact electrode contacting the second end of the light-emitting element and the second electrode.

18. The display device of claim 17, wherein the first contact electrode contacts the electrode layer of the light-emitting element, and the second contact electrode contacts the first semiconductor layer.

* * * * *